United States Patent
Shealy et al.

(10) Patent No.: US 11,581,866 B2
(45) Date of Patent: Feb. 14, 2023

(54) RF ACOUSTIC WAVE RESONATORS INTEGRATED WITH HIGH ELECTRON MOBILITY TRANSISTORS INCLUDING A SHARED PIEZOELECTRIC/BUFFER LAYER AND METHODS OF FORMING THE SAME

(71) Applicant: Akoustis, Inc., Huntersville, NC (US)

(72) Inventors: Jeffrey B. Shealy, Cornelius, NC (US); Mary Winters, Webster, NY (US); Craig Moe, Penfield, NY (US)

(73) Assignee: Akoustis, Inc., Huntersville, NC (US)

( * ) Notice: Subject to any disclaimer, the term of this patent is extended or adjusted under 35 U.S.C. 154(b) by 130 days.

(21) Appl. No.: 16/990,638

(22) Filed: Aug. 11, 2020

(65) Prior Publication Data

US 2021/0067123 A1     Mar. 4, 2021

Related U.S. Application Data

(63) Continuation-in-part of application No. 16/822,689, filed on Mar. 18, 2020, which is a continuation of
(Continued)

(51) Int. Cl.
*H03H 3/02*     (2006.01)
*H03H 9/13*     (2006.01)
(Continued)

(52) U.S. Cl.
CPC .......... *H03H 3/02* (2013.01); *H01L 41/0475* (2013.01); *H01L 41/0477* (2013.01);
(Continued)

(58) Field of Classification Search
CPC ............. H01L 41/0475; H01L 41/0477; H01L 41/18; H01L 41/0805; H03H 9/13; H03H 9/173
See application file for complete search history.

(56) References Cited

U.S. PATENT DOCUMENTS

| 5,231,327 A | 7/1993 | Ketcham |
| 5,894,647 A | 4/1999 | Lakin |

(Continued)

FOREIGN PATENT DOCUMENTS

| JP | 2009100197 A | 5/2009 |
| JP | 2010068109 A | 3/2010 |

(Continued)

OTHER PUBLICATIONS

Hickman et al., "High Breakdown Voltage in Strained AlN/GaN/AlN Quantum Well HEMTs," IEEE Electron Device Letters, vol. X, No. Y, Jan. 2018, pp. 7-10.
(Continued)

*Primary Examiner* — Bryan P Gordon
(74) *Attorney, Agent, or Firm* — Stanek Lemon Crouse & Meeks, P.A.

(57) ABSTRACT

An RF integrated circuit device can includes a substrate and a High Electron Mobility Transistor (HEMT) device on the substrate including a ScAlN layer configured to provide a buffer layer of the HEMT device to confine formation of a 2DEG channel region of the HEMT device. An RF piezoelectric resonator device can be on the substrate including the ScAlN layer sandwiched between a top electrode and a bottom electrode of the RF piezoelectric resonator device to provide a piezoelectric resonator for the RF piezoelectric resonator device.

14 Claims, 47 Drawing Sheets

Related U.S. Application Data application No. 16/433,849, filed on Jun. 6, 2019, now Pat. No. 11,070,184, which is a continuation of application No. 15/784,919, filed on Oct. 16, 2017, now Pat. No. 10,355,659, which is a continuation-in-part of application No. 15/068,510, filed on Mar. 11, 2016, now Pat. No. 10,217,930.

(60) Provisional application No. 62/963,915, filed on Jan. 21, 2020.

(51) Int. Cl.

| | | |
|---|---|---|
| *H03H 9/17* | (2006.01) | |
| *H03H 9/10* | (2006.01) | |
| *H03H 9/05* | (2006.01) | |
| *H03H 9/02* | (2006.01) | |
| *H01L 41/337* | (2013.01) | |
| *H01L 41/317* | (2013.01) | |
| *H01L 41/29* | (2013.01) | |
| *H01L 41/23* | (2013.01) | |
| *H01L 41/18* | (2006.01) | |
| *H01L 41/08* | (2006.01) | |
| *H01L 41/053* | (2006.01) | |
| *H01L 41/047* | (2006.01) | |
| *H03H 9/54* | (2006.01) | |
| *H01L 41/312* | (2013.01) | |

(52) U.S. Cl.
CPC .......... *H01L 41/053* (2013.01); *H01L 41/081* (2013.01); *H01L 41/18* (2013.01); *H01L 41/23* (2013.01); *H01L 41/29* (2013.01); *H01L 41/317* (2013.01); *H01L 41/337* (2013.01); *H03H 9/02015* (2013.01); *H03H 9/02118* (2013.01); *H03H 9/0523* (2013.01); *H03H 9/105* (2013.01); *H03H 9/13* (2013.01); *H03H 9/173* (2013.01); *H03H 9/175* (2013.01); *H03H 9/177* (2013.01); *H03H 9/547* (2013.01); *H01L 41/0805* (2013.01); *H01L 41/312* (2013.01); *H03H 2003/021* (2013.01); *H03H 2003/025* (2013.01); *Y10T 29/42* (2015.01)

(56) References Cited

U.S. PATENT DOCUMENTS

| | | | |
|---|---|---|---|
| 6,051,907 | A | 4/2000 | Ylilammi |
| 6,114,635 | A | 9/2000 | Lakin et al. |
| 6,262,637 | B1 | 7/2001 | Bradley et al. |
| 6,377,137 | B1 | 4/2002 | Ruby |
| 6,384,697 | B1 | 5/2002 | Ruby |
| 6,472,954 | B1 | 10/2002 | Ruby et al. |
| 6,617,060 | B2 | 9/2003 | Weeks, Jr. et al. |
| 6,812,619 | B1 | 11/2004 | Kaitila et al. |
| 6,841,922 | B2 | 1/2005 | Aigner et al. |
| 6,864,619 | B2 | 3/2005 | Aigner et al. |
| 6,879,224 | B2 | 4/2005 | Frank |
| 6,909,340 | B2 | 6/2005 | Aigner et al. |
| 6,933,807 | B2 | 8/2005 | Marksteiner et al. |
| 7,112,860 | B2 | 9/2006 | Saxler |
| 7,250,360 | B2 | 7/2007 | Shealy et al. |
| 7,268,436 | B2 | 9/2007 | Aigner et al. |
| 7,365,619 | B2 | 4/2008 | Aigner et al. |
| 7,514,759 | B1 | 4/2009 | Mehta et al. |
| 7,875,910 | B2 | 1/2011 | Sheppard et al. |
| 7,982,363 | B2 | 7/2011 | Chitnis |
| 8,304,271 | B2 | 11/2012 | Huang et al. |
| 2005/0255234 | A1 | 11/2005 | Kanda et al. |
| 2006/0283255 | A1 | 12/2006 | Tilak et al. |
| 2007/0279152 | A1* | 12/2007 | Kawamura ............... H03H 3/04 333/187 |
| 2008/0258731 | A1 | 10/2008 | Smith et al. |
| 2008/0284541 | A1 | 11/2008 | Chitnis |
| 2009/0033177 | A1 | 2/2009 | Itaya et al. |
| 2009/0102319 | A1 | 4/2009 | Nakatsuka |
| 2011/0114968 | A1 | 5/2011 | Sheppard et al. |
| 2012/0068191 | A1 | 3/2012 | Marchand et al. |
| 2012/0107557 | A1 | 5/2012 | Akiyama et al. |
| 2012/0194297 | A1* | 8/2012 | Choy ................. H03H 9/02149 310/365 |
| 2012/0287575 | A1 | 11/2012 | Nelson |
| 2013/0111719 | A1 | 5/2013 | Deguet |
| 2014/0342512 | A1 | 11/2014 | Mishra et al. |
| 2015/0028346 | A1 | 1/2015 | Palacios et al. |
| 2015/0318837 | A1* | 11/2015 | Zou .................... H03H 9/02086 333/187 |
| 2016/0028367 | A1 | 1/2016 | Shealy |
| 2016/0036580 | A1* | 2/2016 | Shealy .................... H04B 1/04 455/78 |
| 2016/0064645 | A1 | 3/2016 | Teshigahara et al. |
| 2016/0163827 | A1 | 6/2016 | Cheng et al. |
| 2017/0149405 | A1 | 5/2017 | Kishimoto |
| 2017/0214385 | A1* | 7/2017 | Bhattacharjee .... H03H 9/14564 |
| 2017/0264256 | A1* | 9/2017 | Gibb ....................... H03H 3/02 |
| 2017/0294529 | A1 | 10/2017 | Beam, III et al. |
| 2018/0152168 | A1* | 5/2018 | Han ......................... H03H 9/17 |
| 2018/0278236 | A1* | 9/2018 | Hurwitz .................. H01L 24/14 |
| 2019/0259934 | A1* | 8/2019 | Gibb .................... H01L 41/319 |

FOREIGN PATENT DOCUMENTS

| | | | |
|---|---|---|---|
| WO | WO 2005034349 A1 | 4/2005 | |
| WO | WO 2016122877 | 8/2016 | |

OTHER PUBLICATIONS

International Search Report and Written Opinion, PCT/US2018/050521, dated Jan. 28, 2019.

International Search Report and Written Opinion, PCT/US2015/034560, dated Sep. 18, 2015.

International Search Report and Written Opinion for PCT/US2021/013923; dated Apr. 1, 2021, 24 pages.

\* cited by examiner

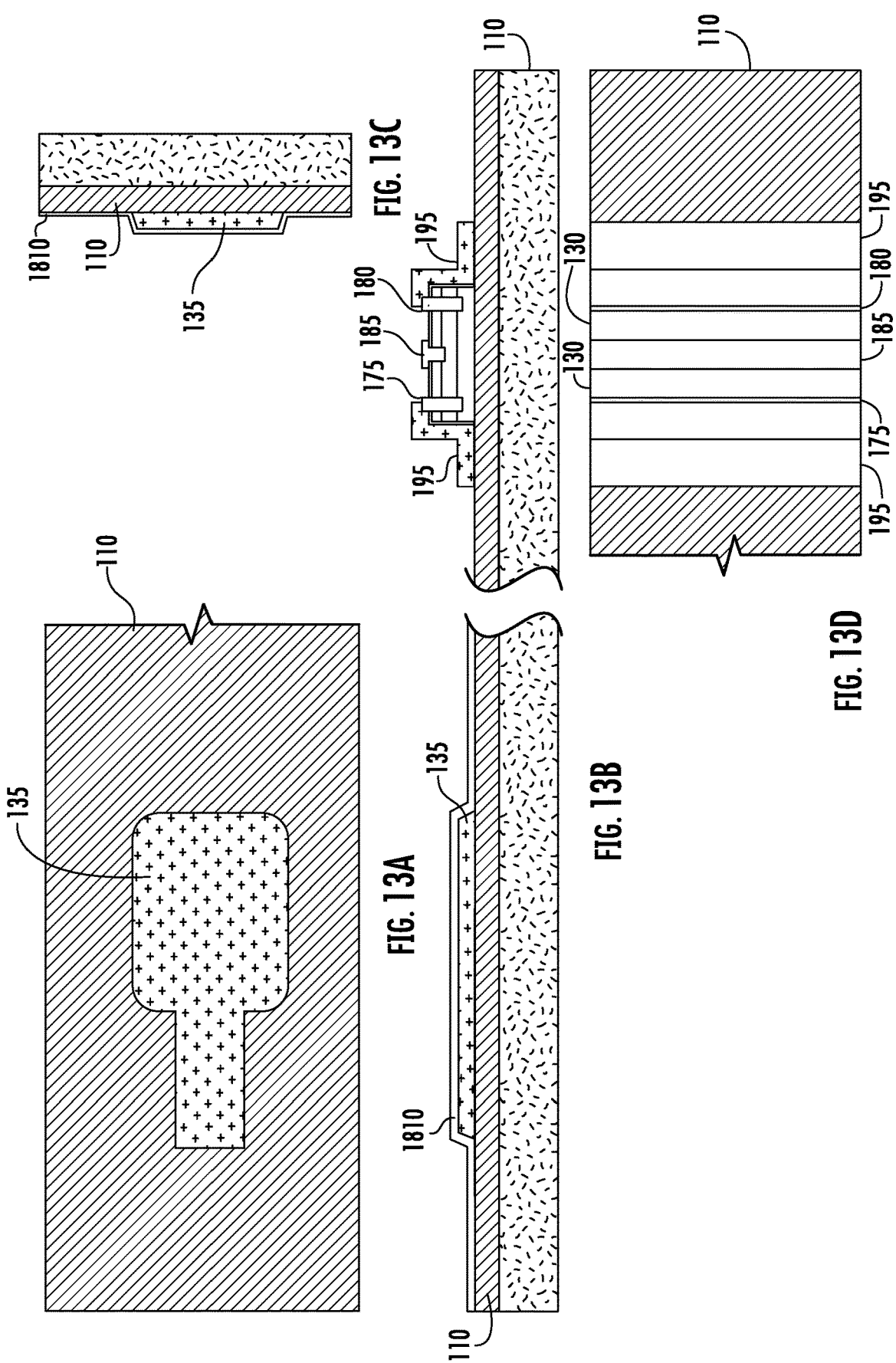

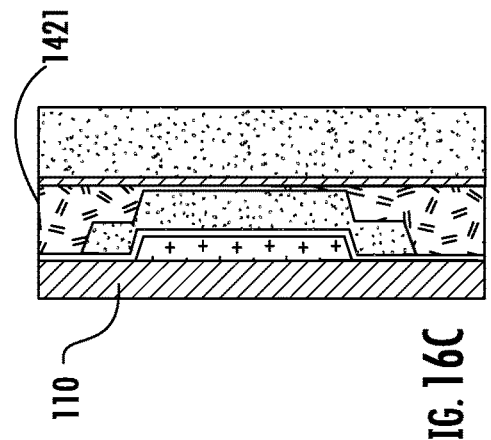
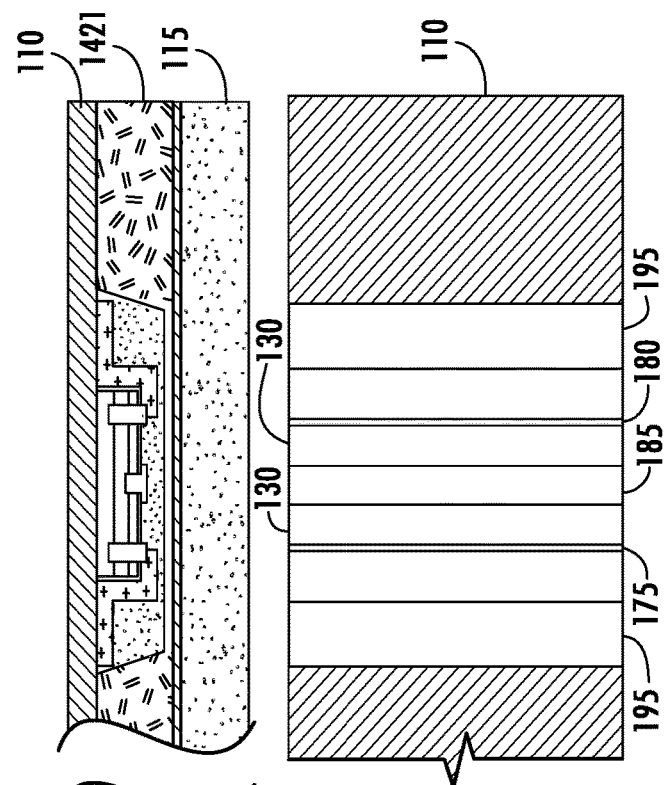
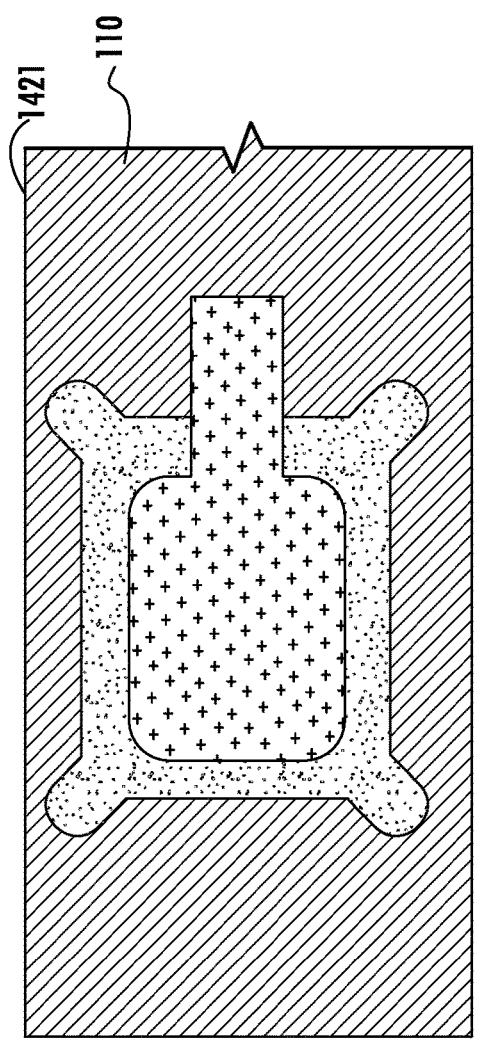
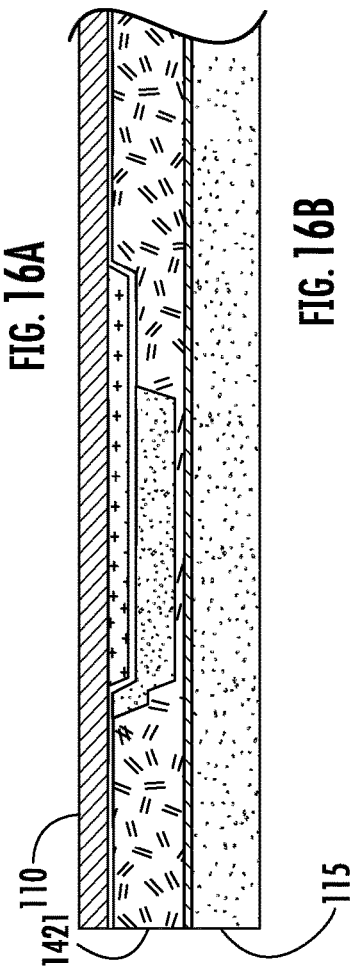
FIG. 16A
FIG. 16B
FIG. 16C
FIG. 16D

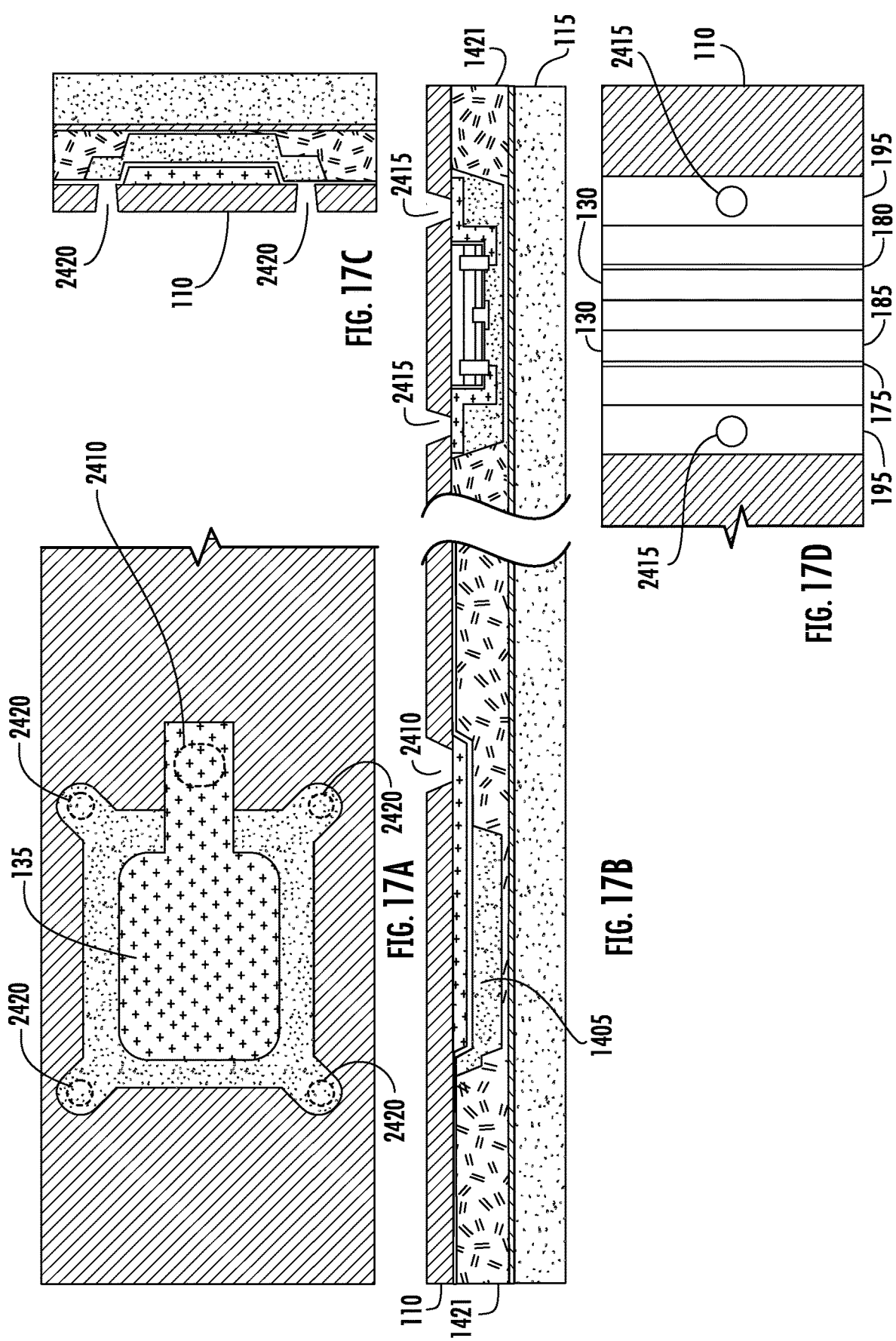

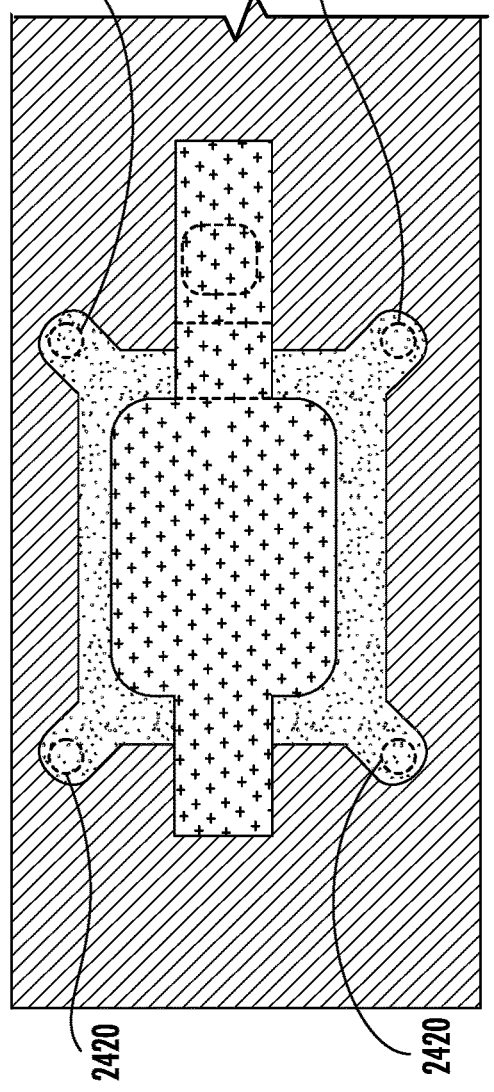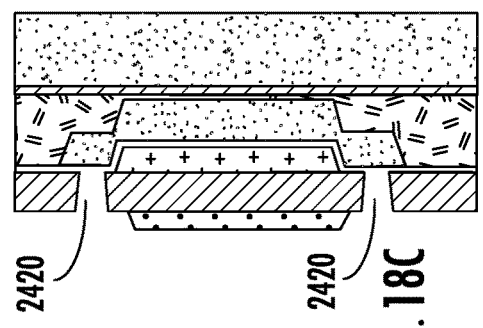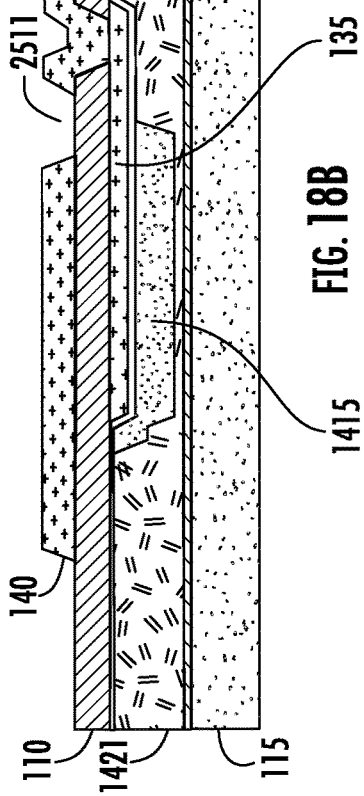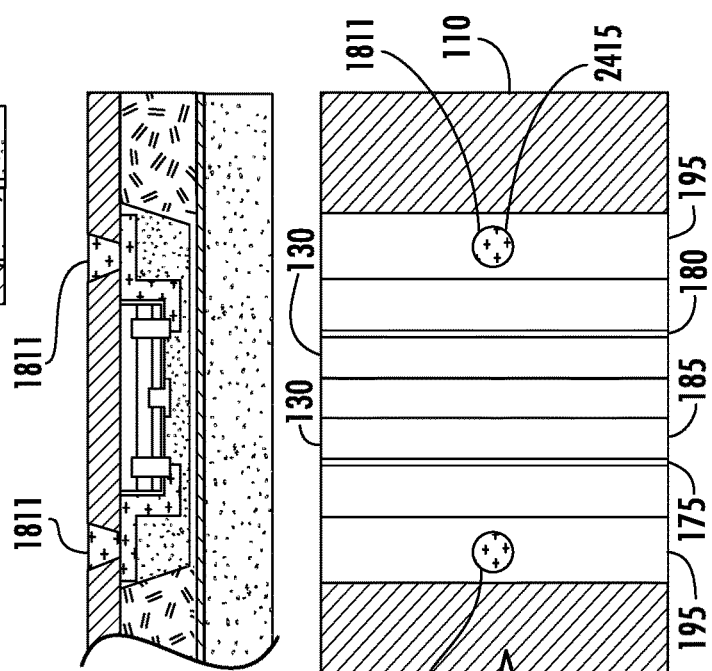

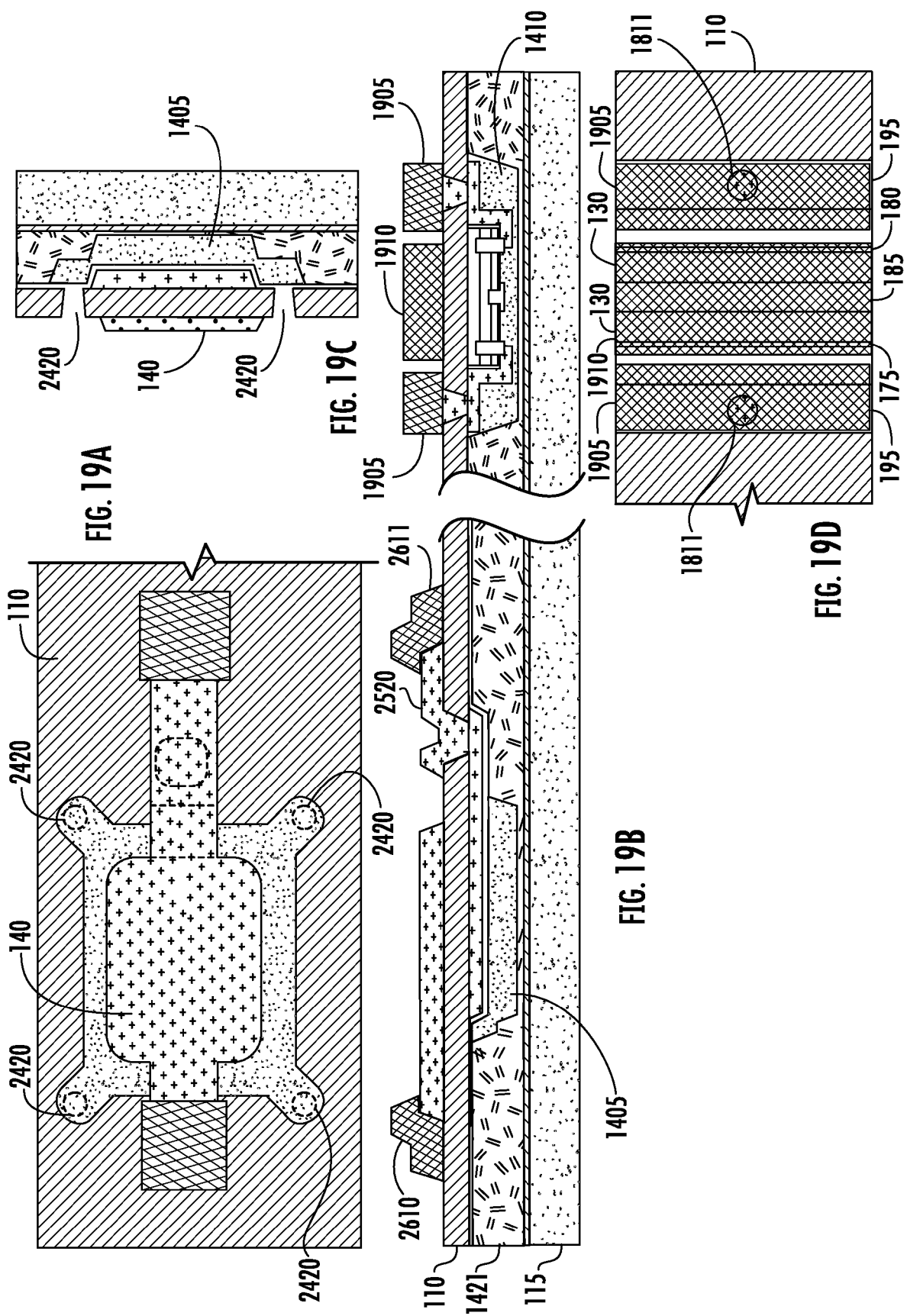

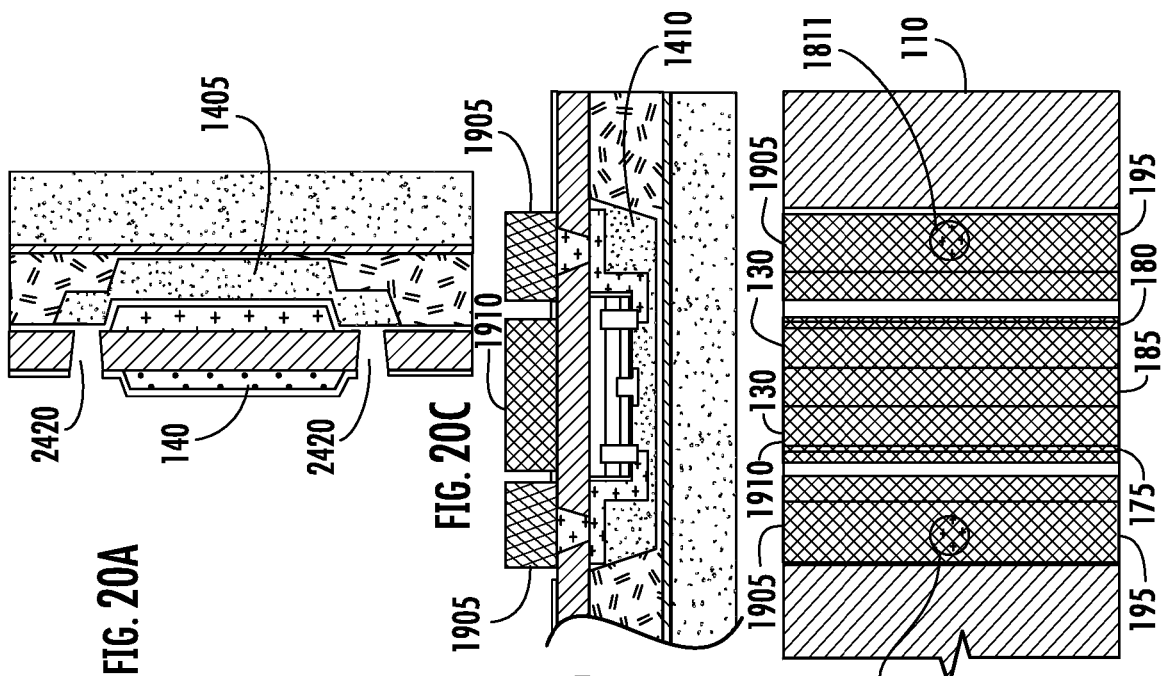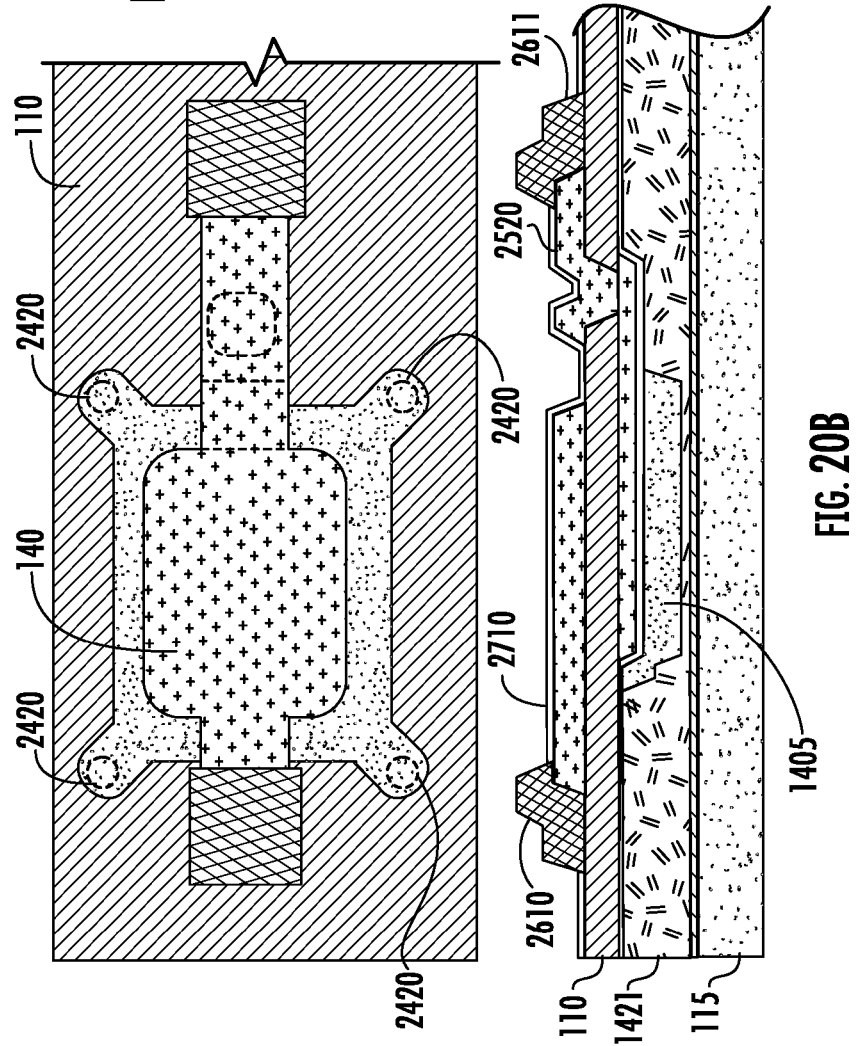

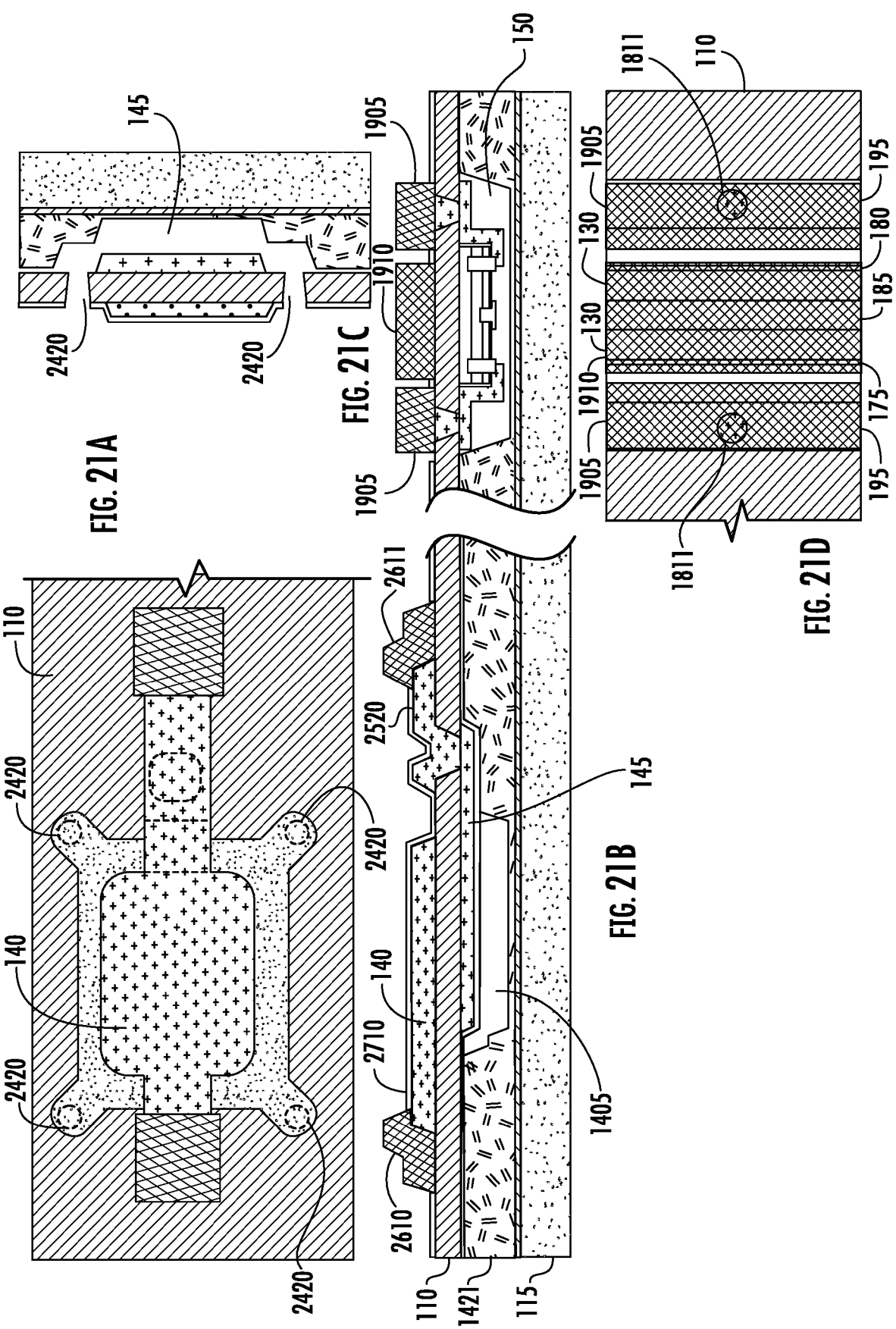

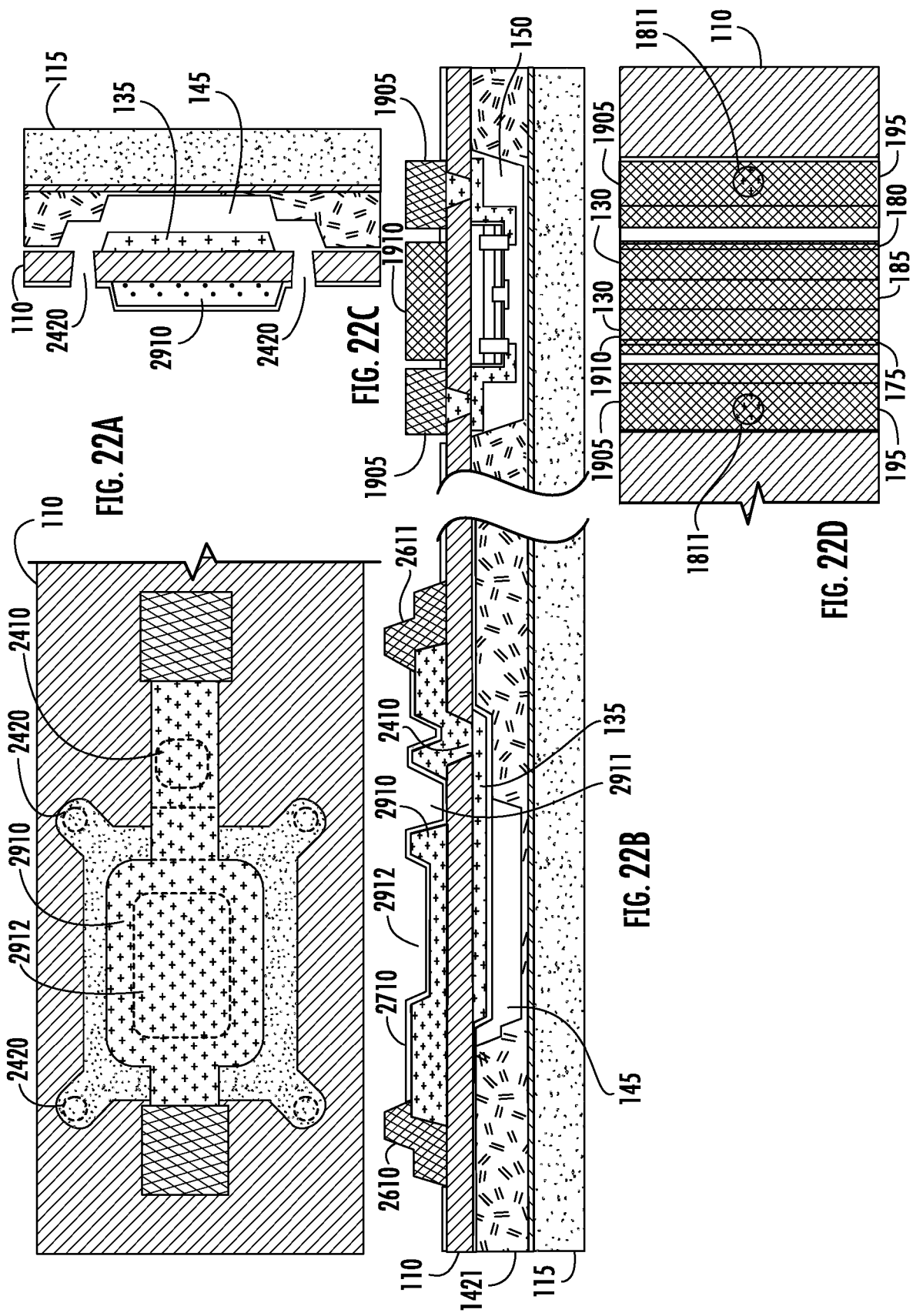

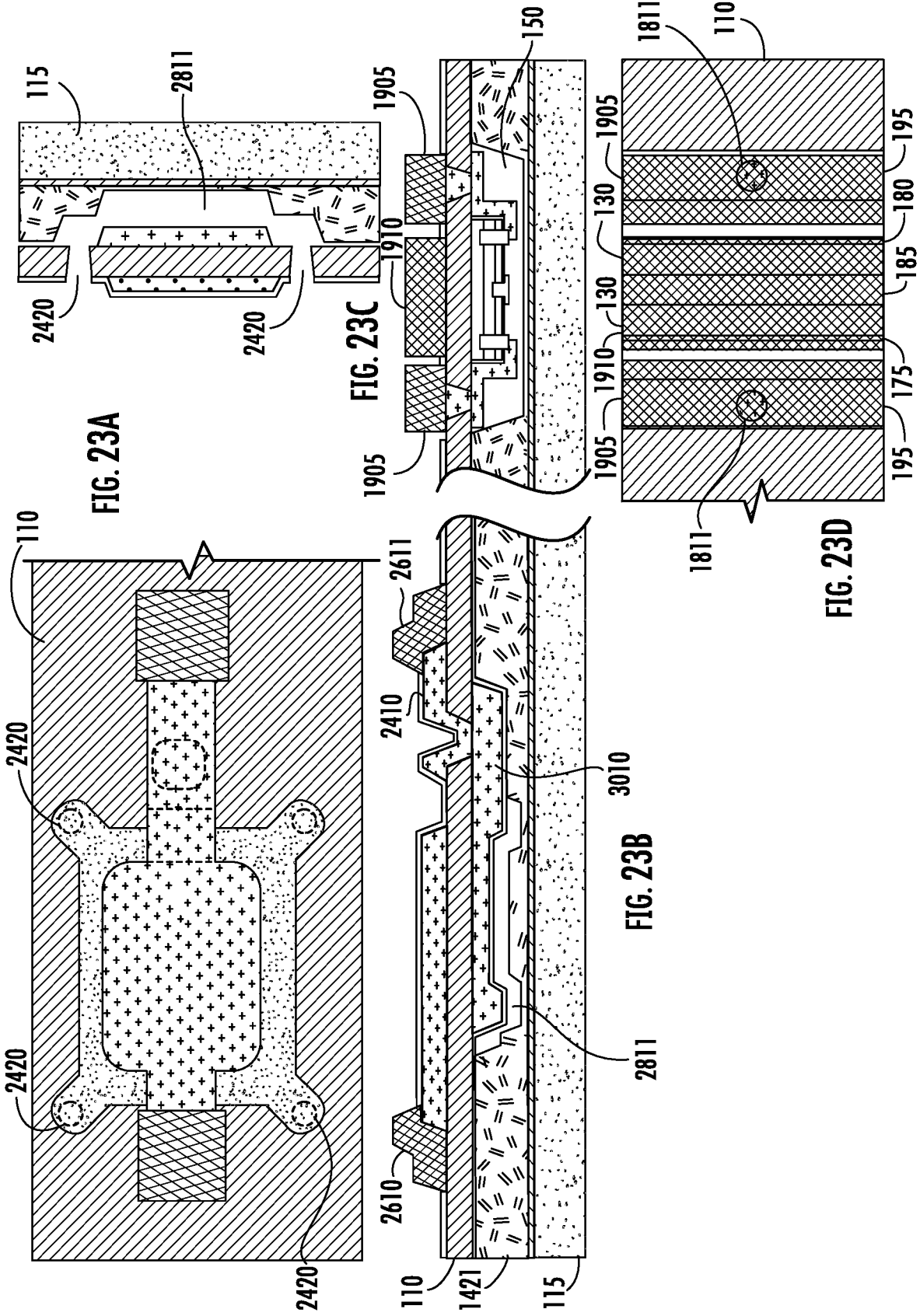

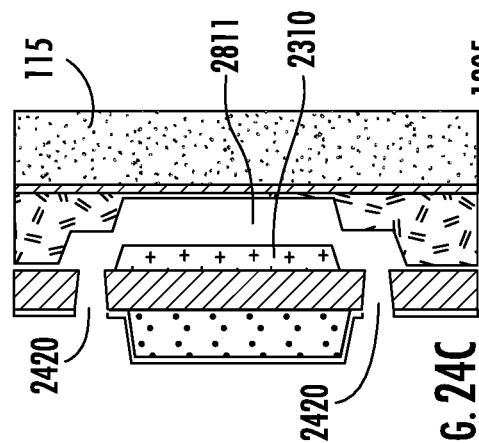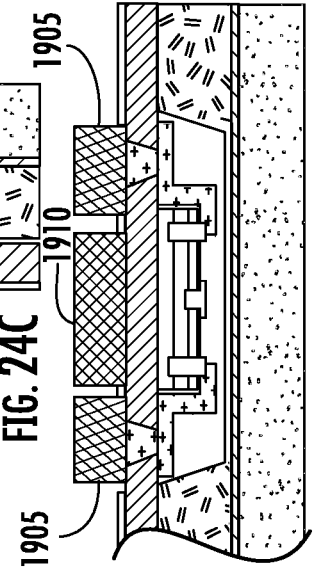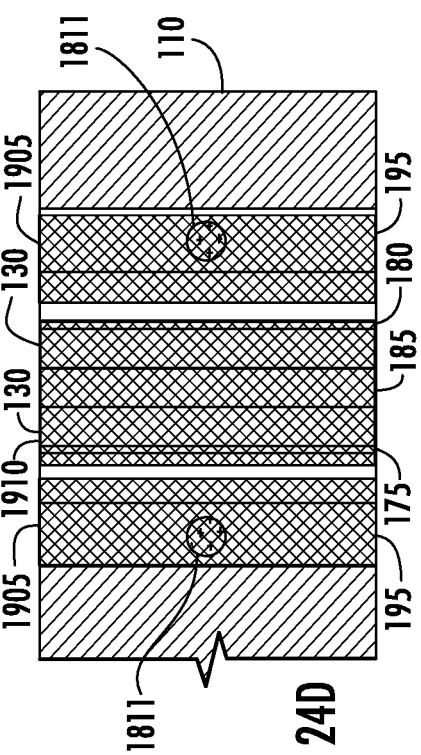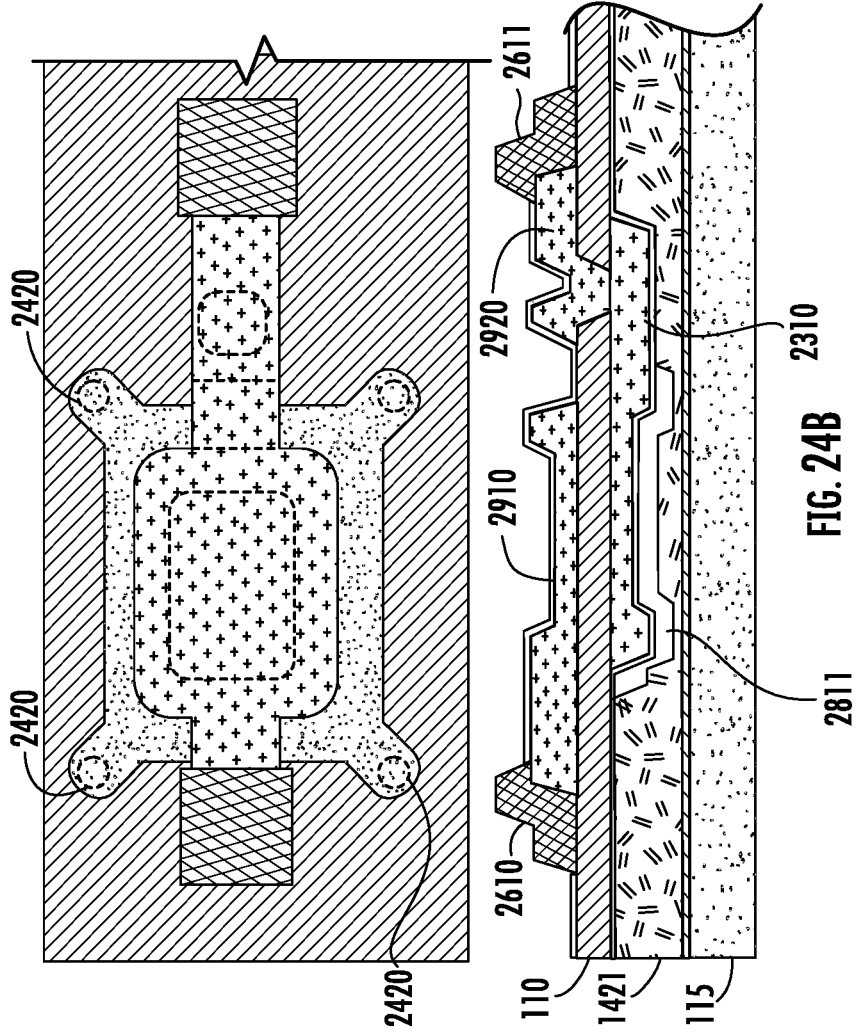

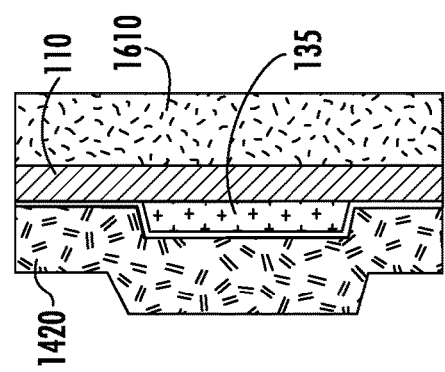
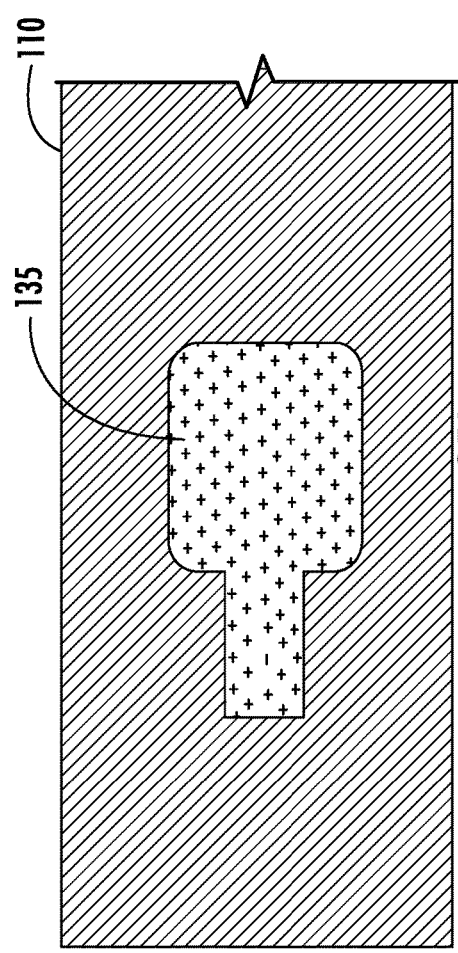
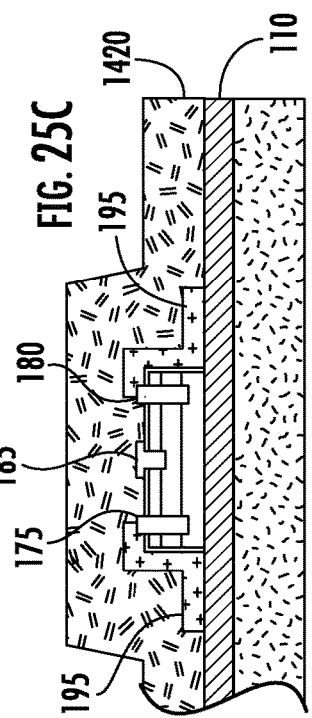
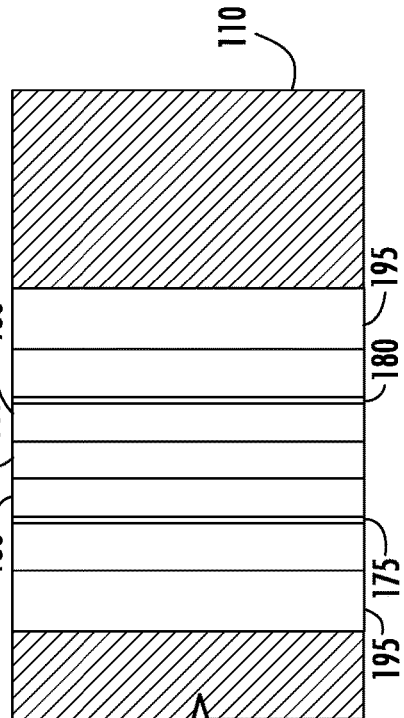
FIG. 25A
FIG. 25B
FIG. 25C
FIG. 25D

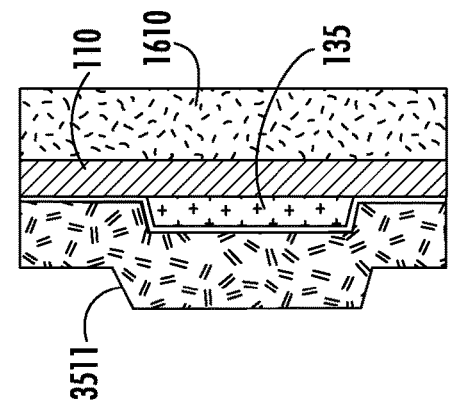
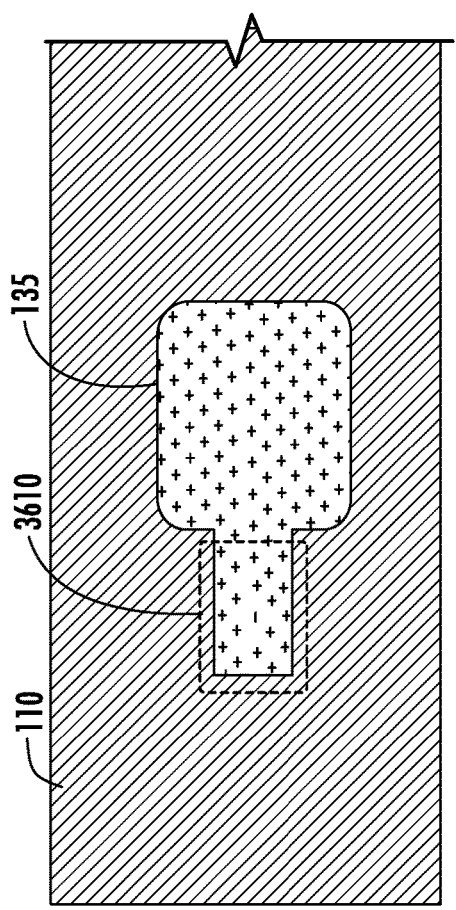
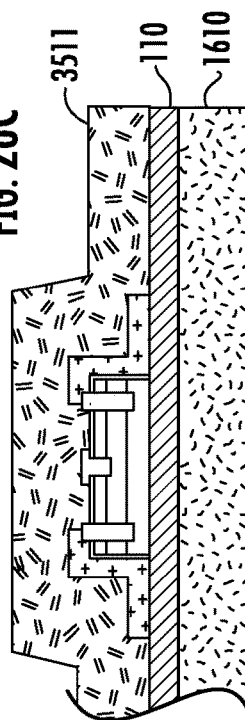
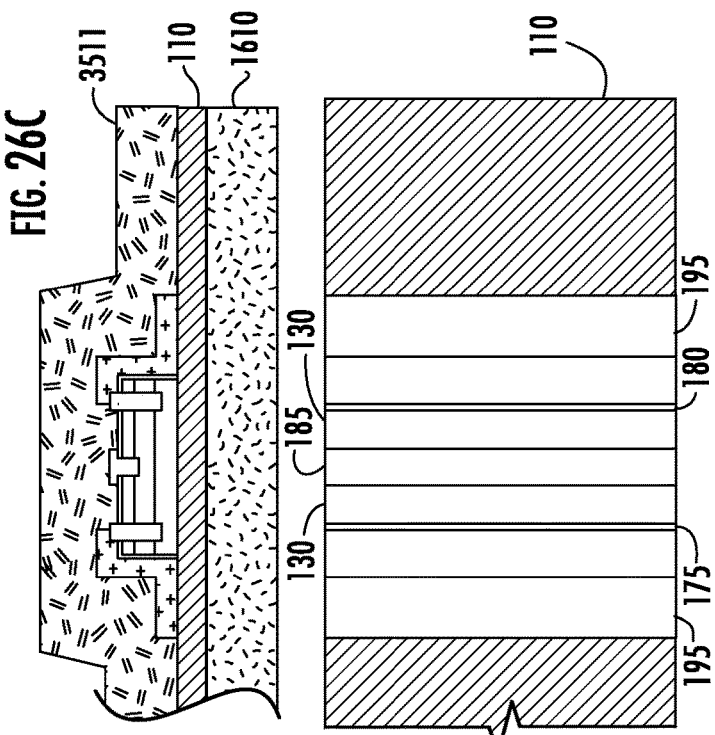

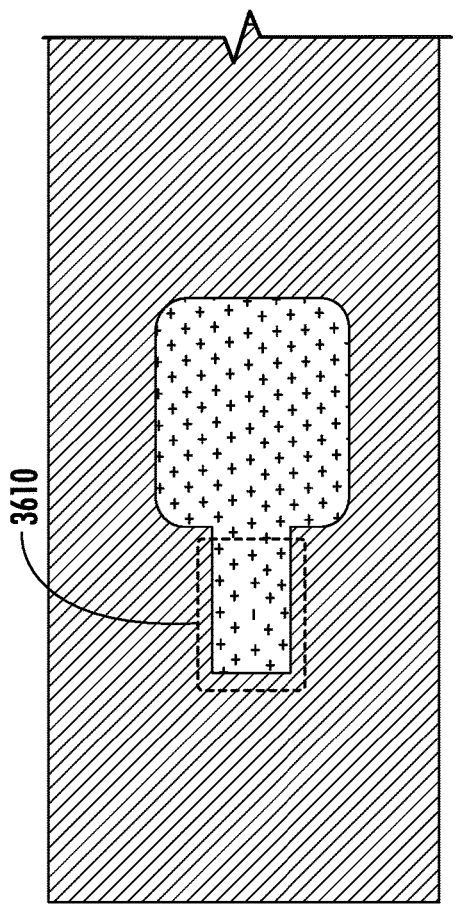
FIG. 27A
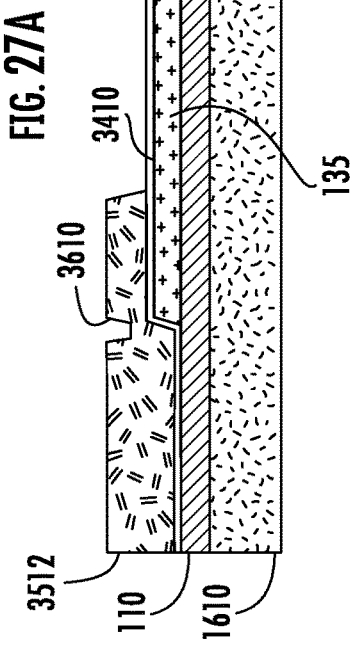
FIG. 27B
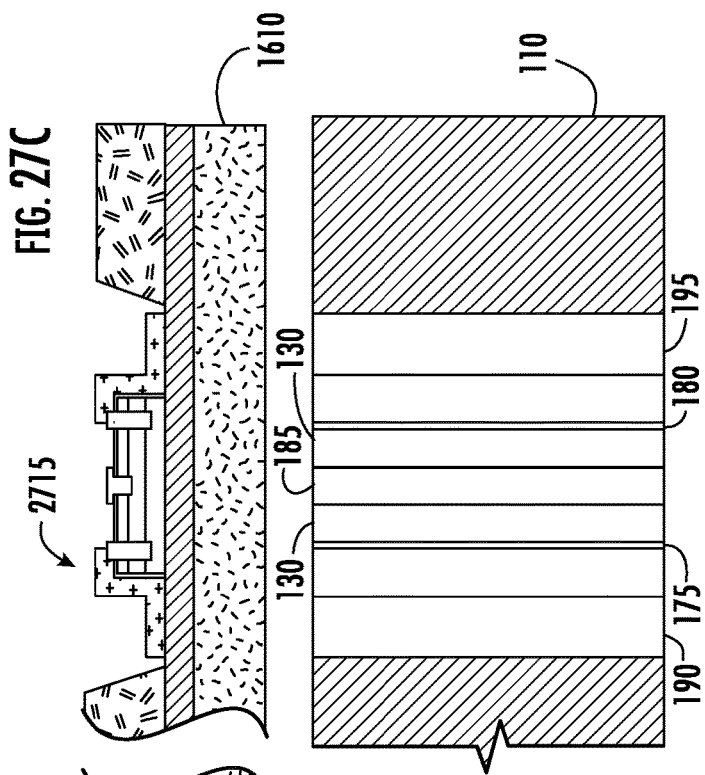
FIG. 27C
FIG. 27D

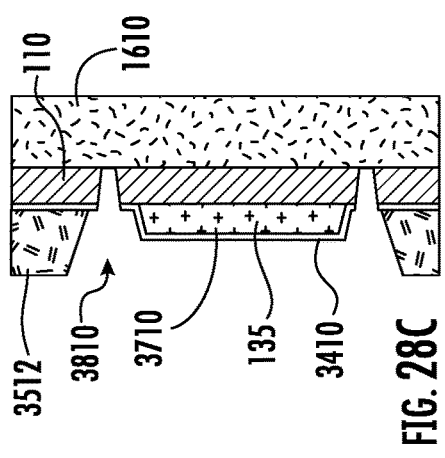
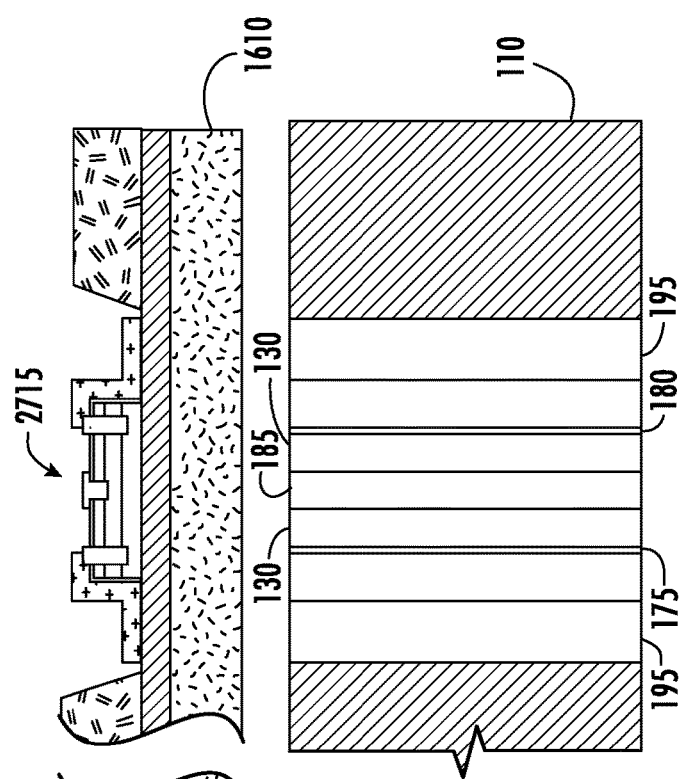
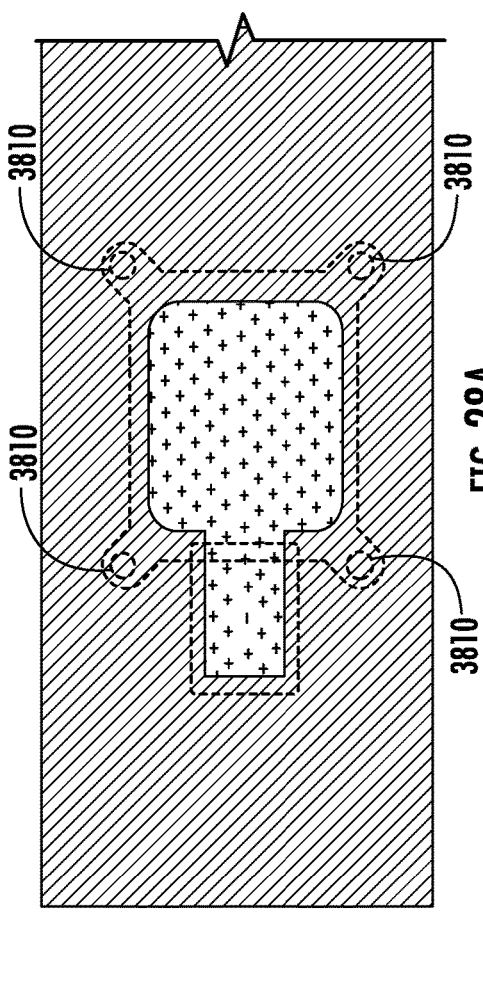
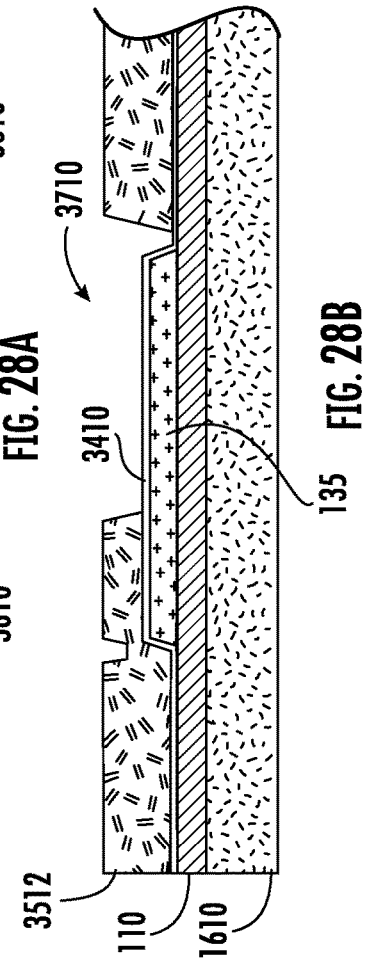

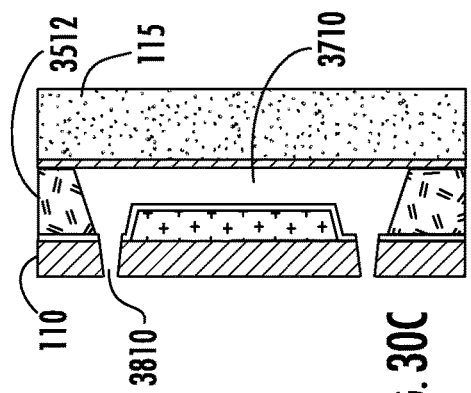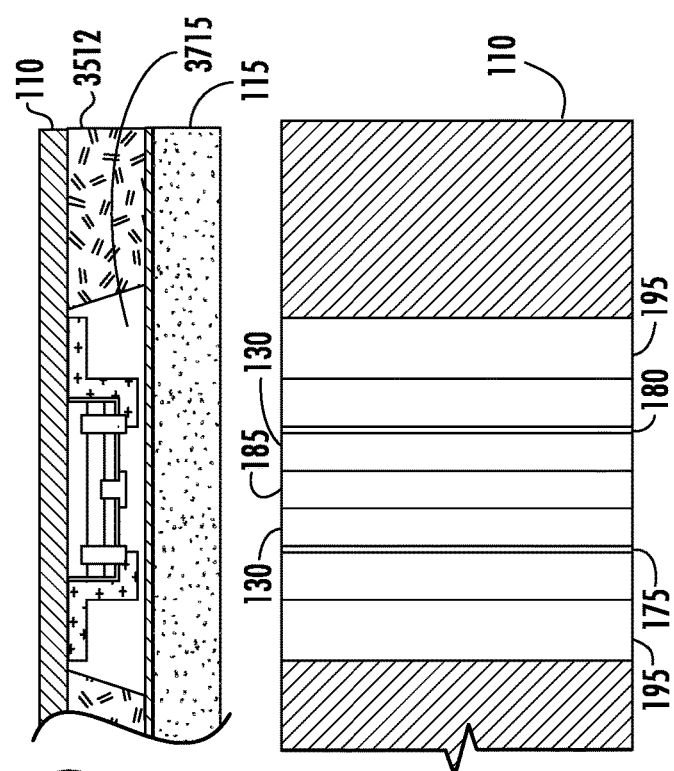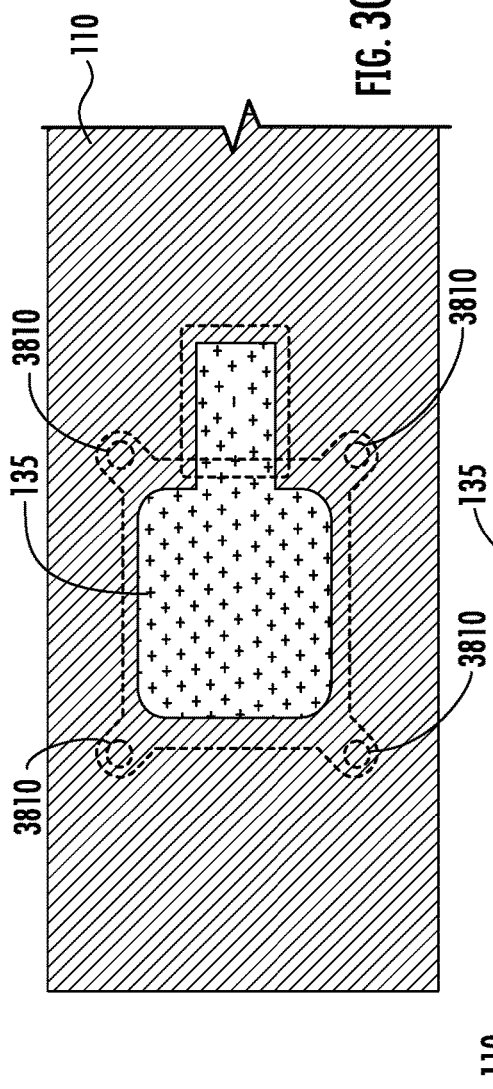
FIG. 30A
FIG. 30B
FIG. 30C
FIG. 30D

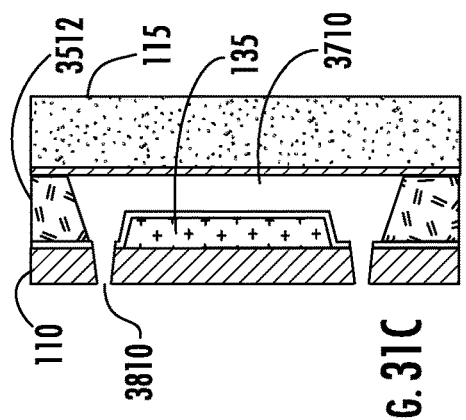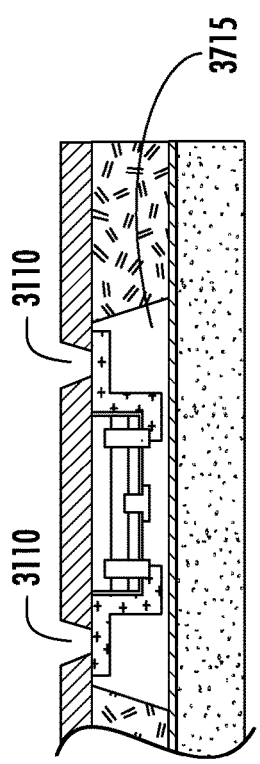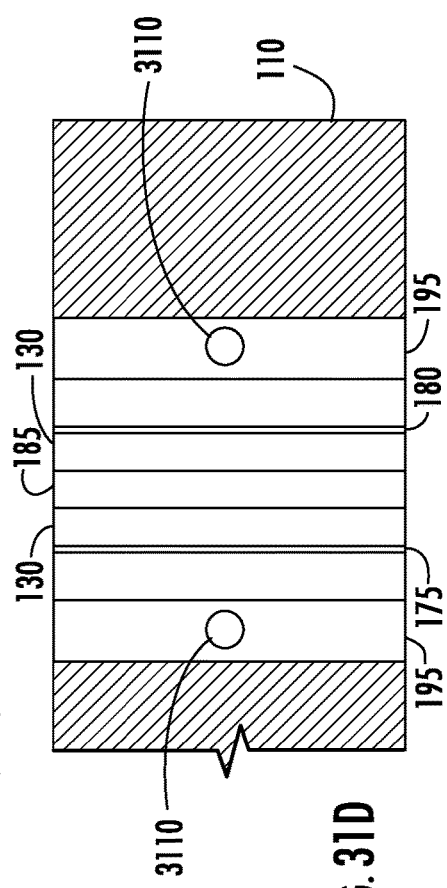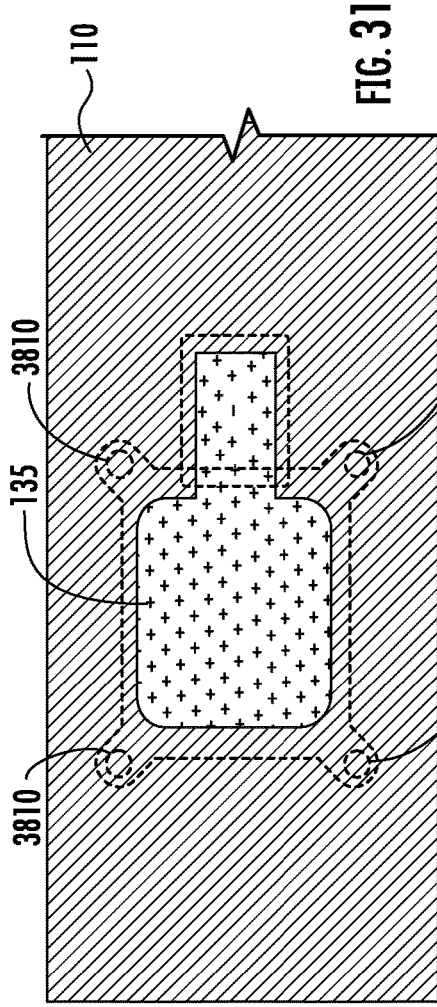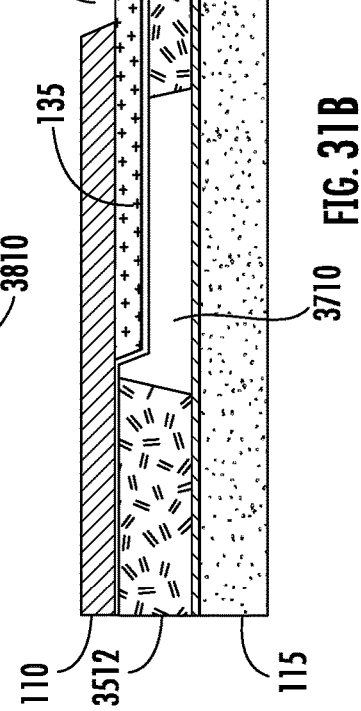
FIG. 31A
FIG. 31B
FIG. 31C
FIG. 31D

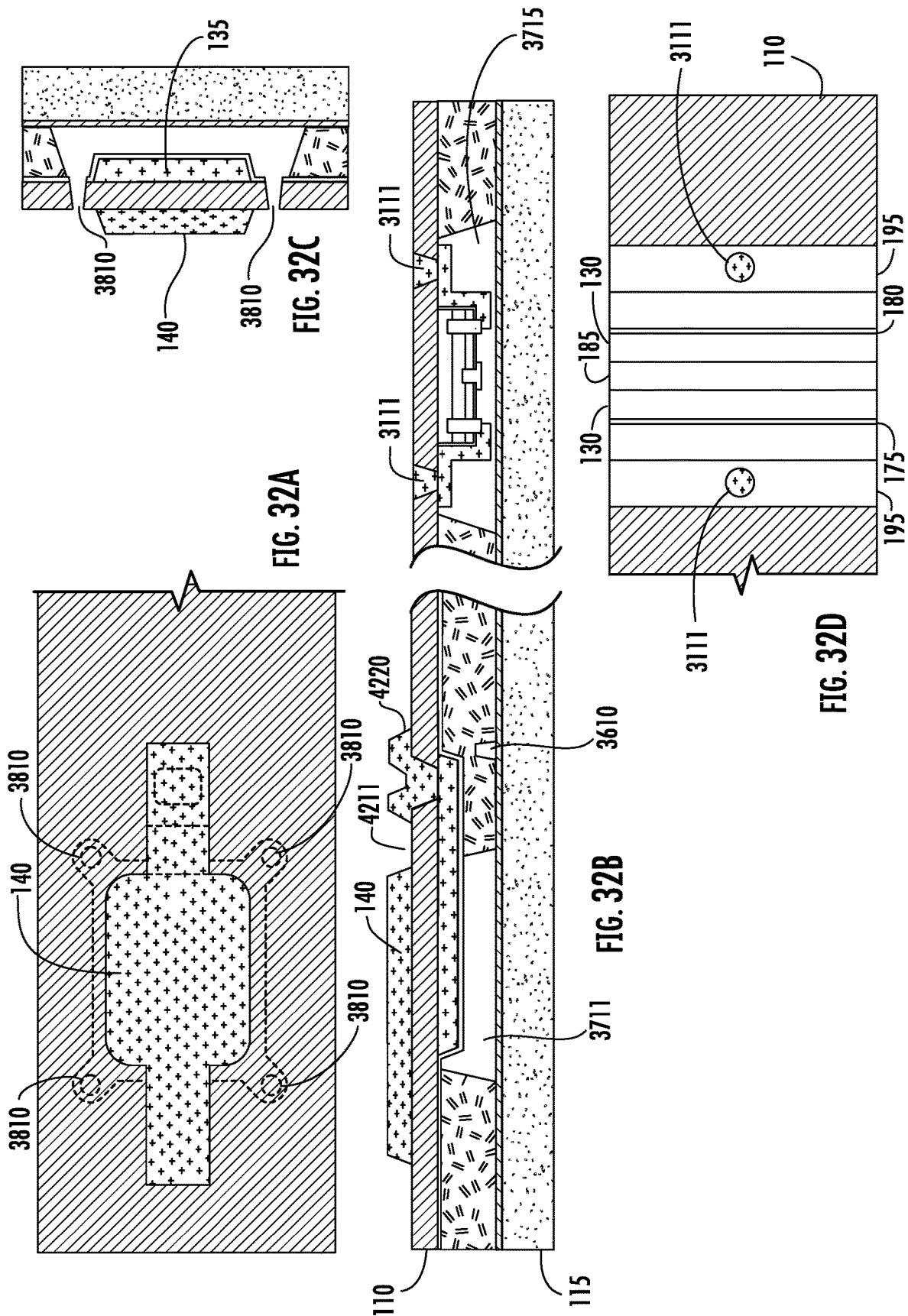

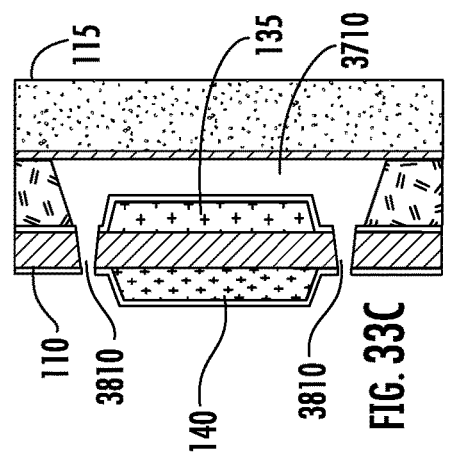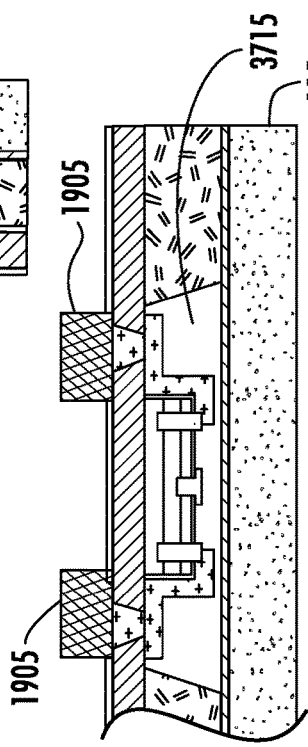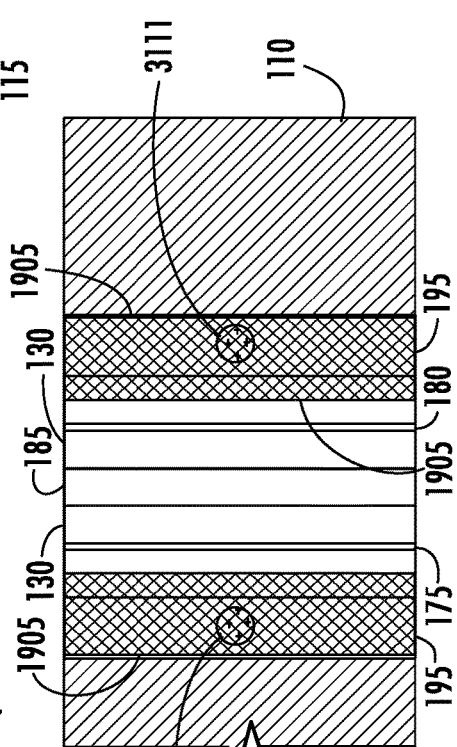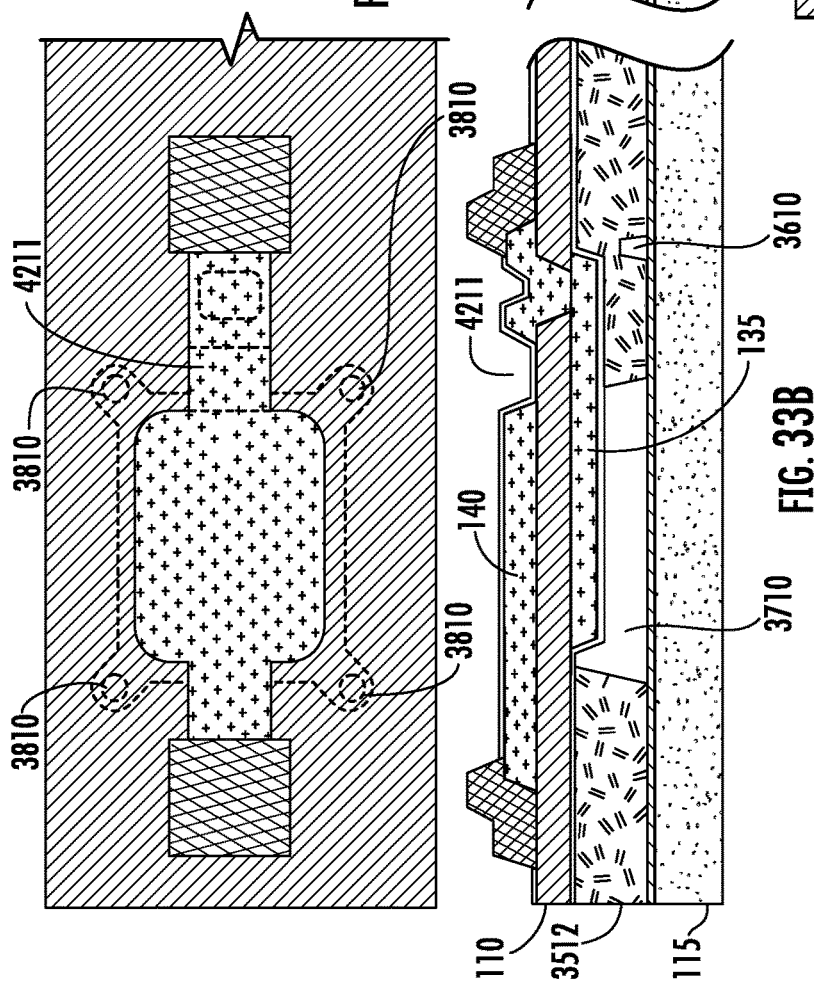

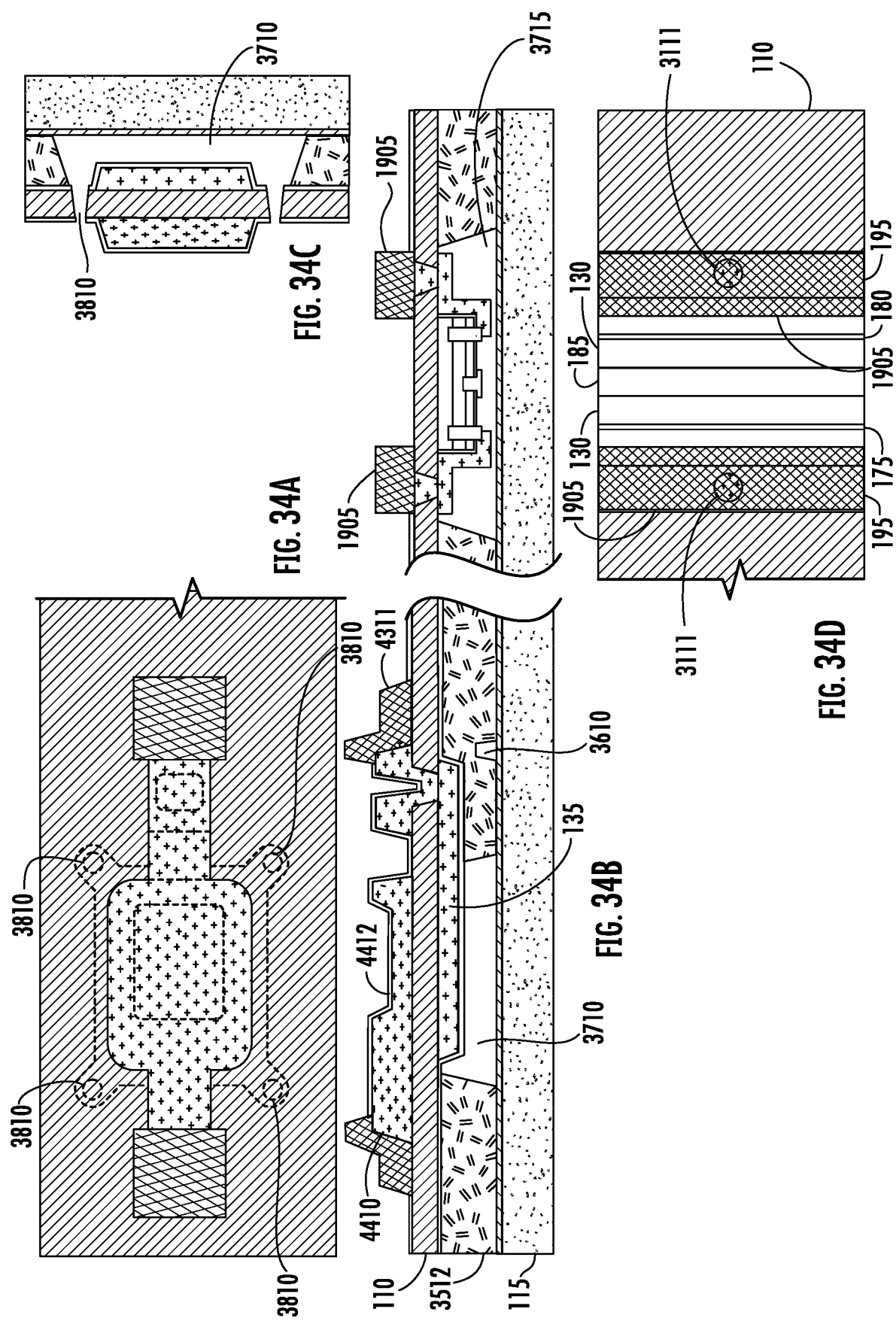

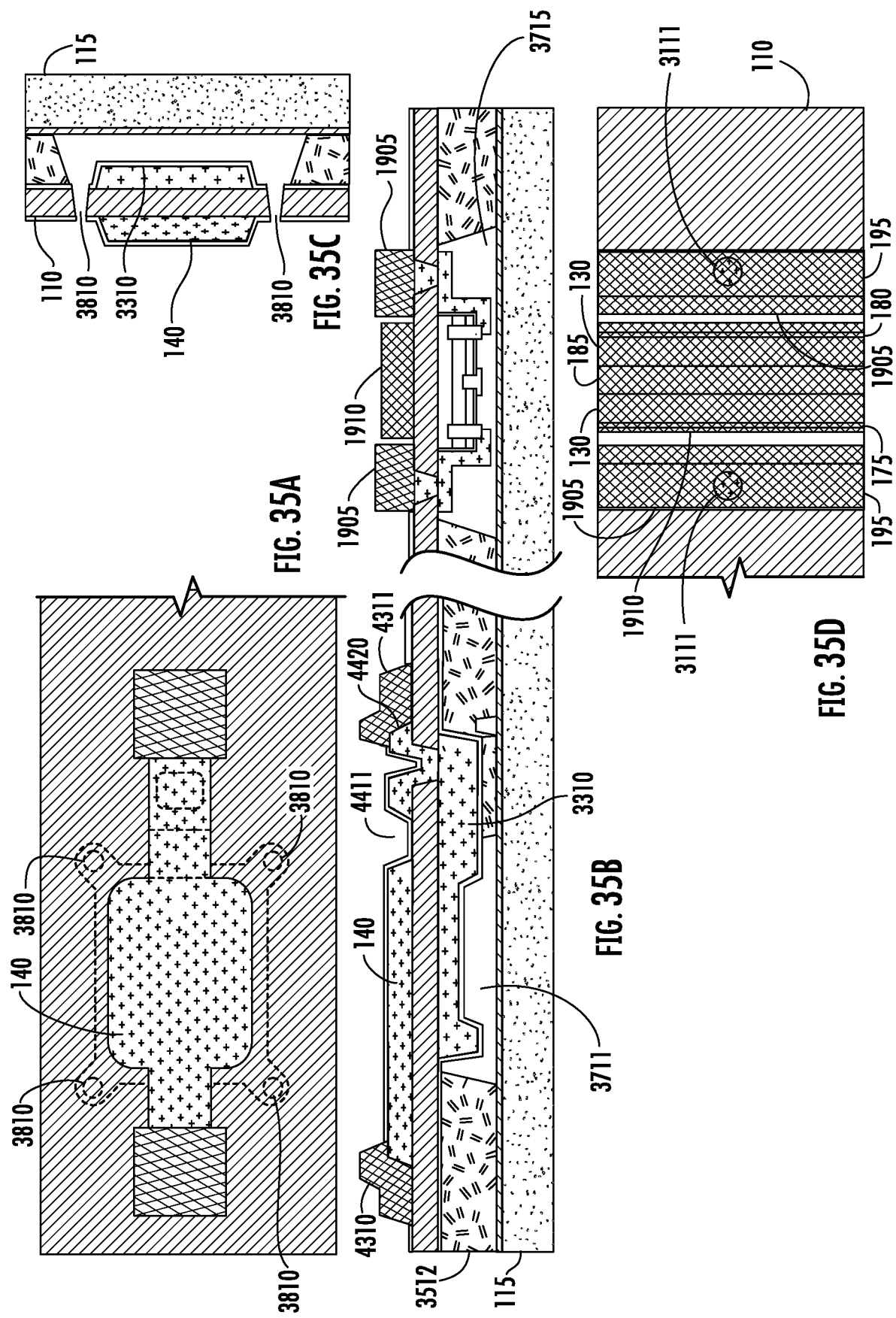

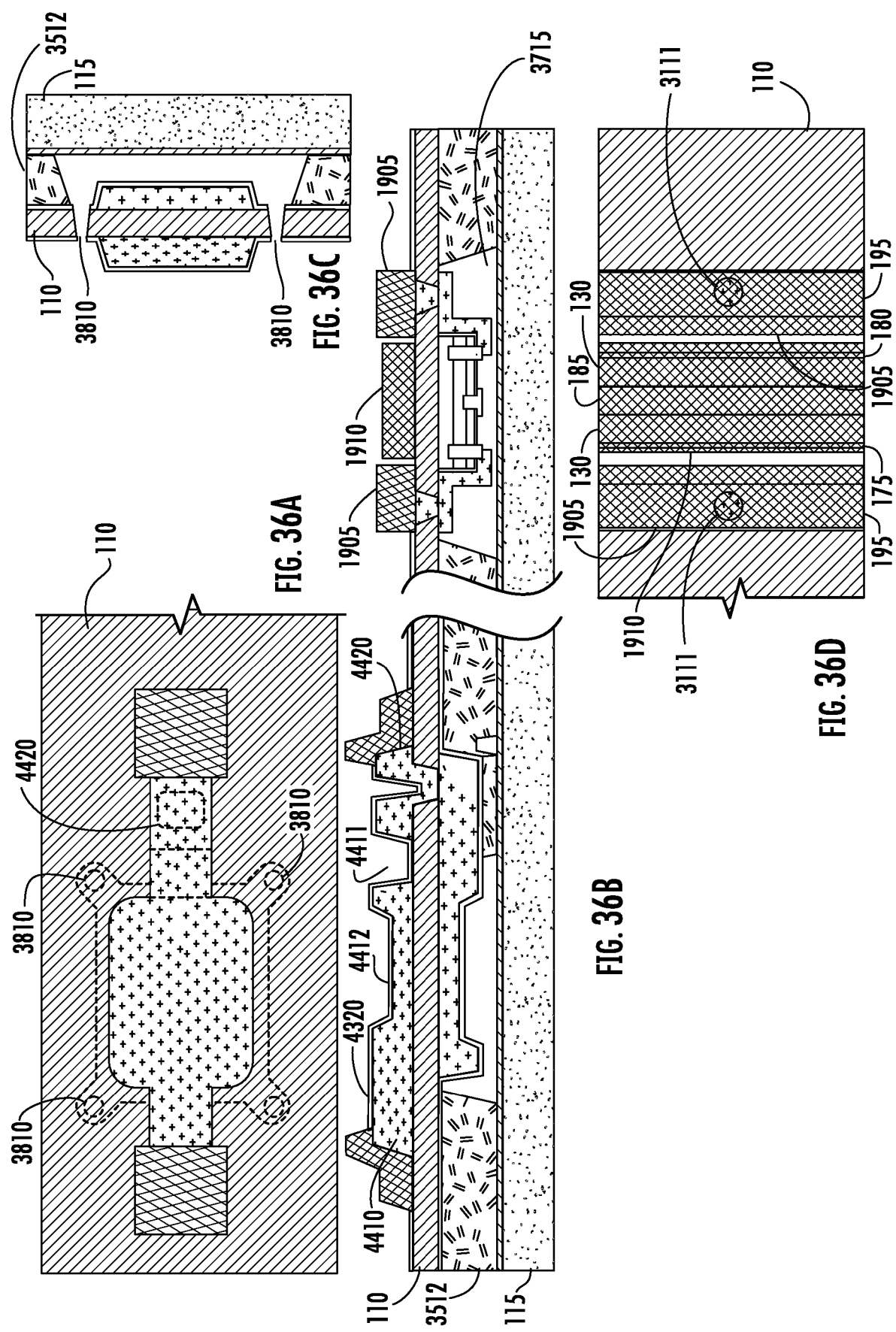

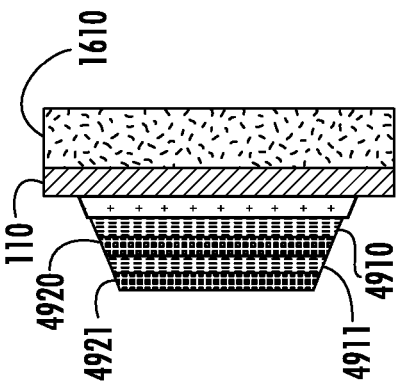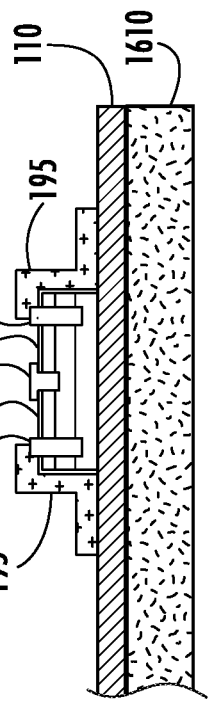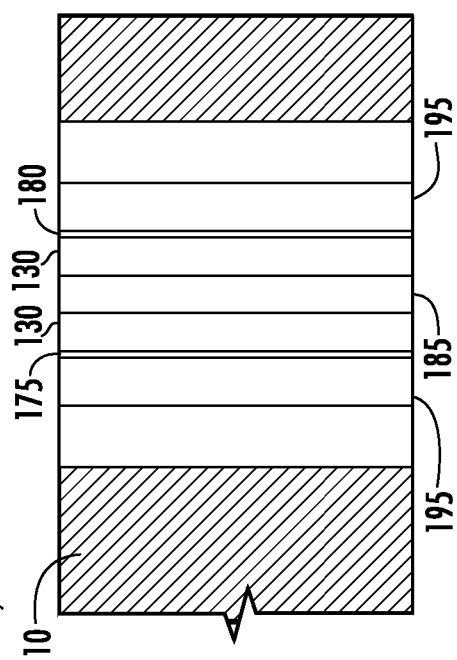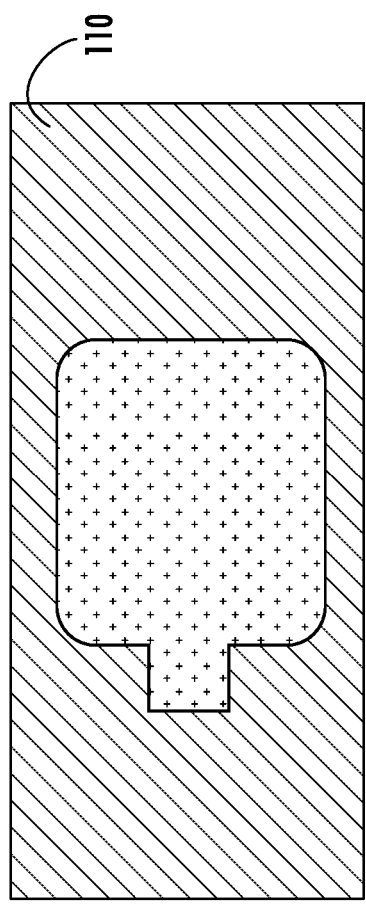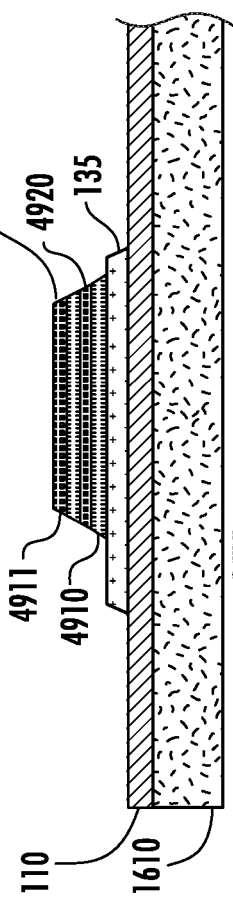

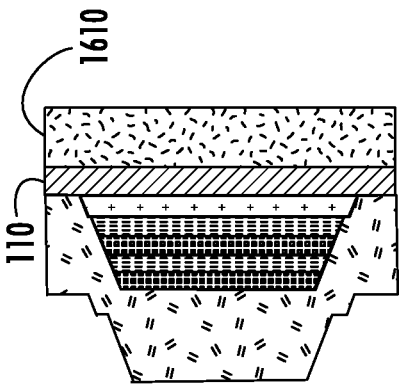
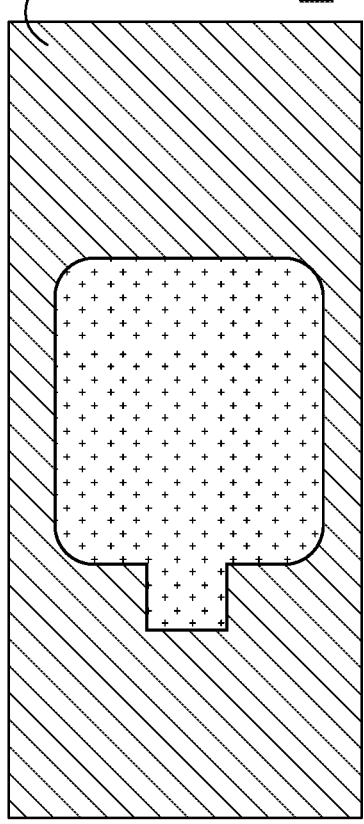
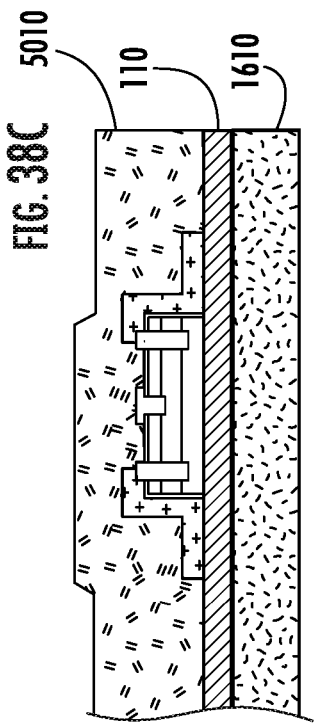
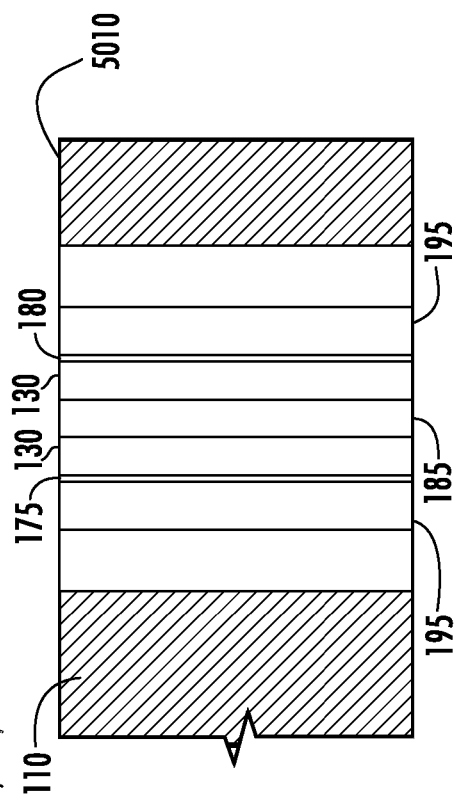

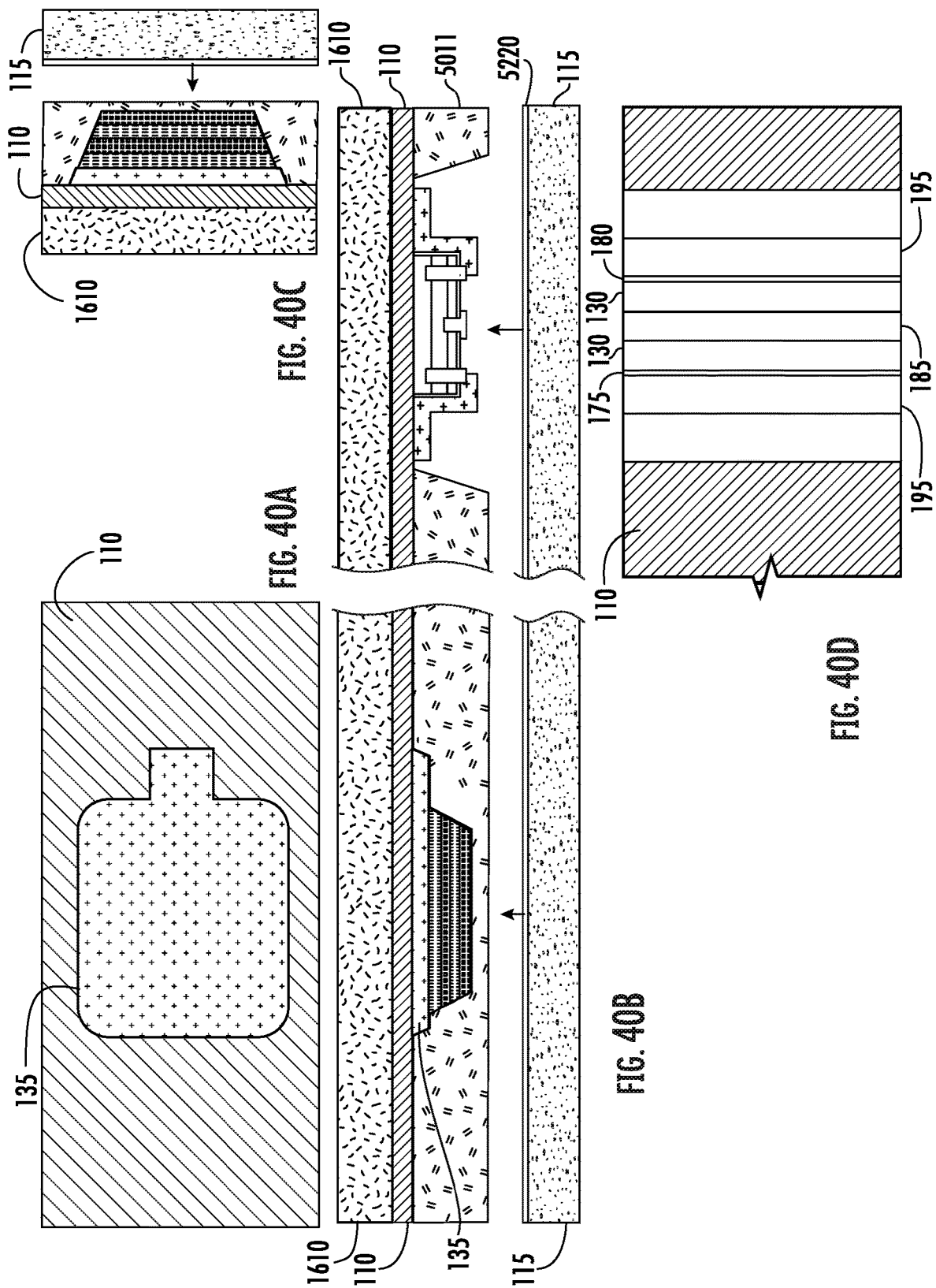

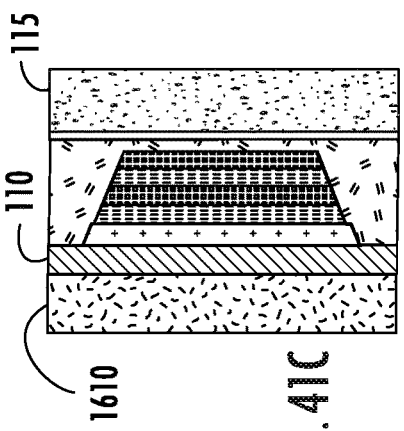
FIG. 41C
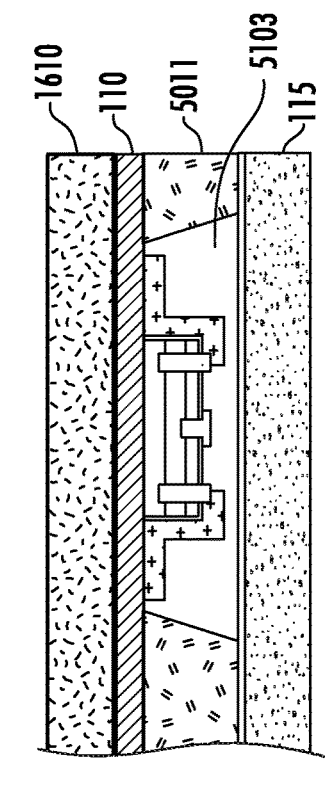
FIG. 41A
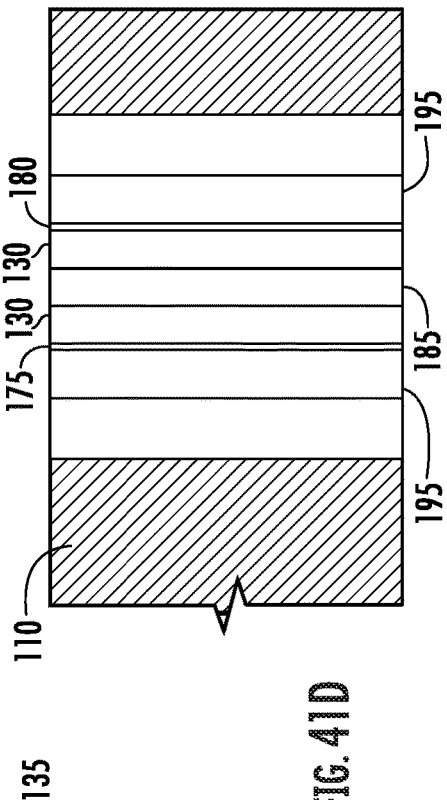
FIG. 41D
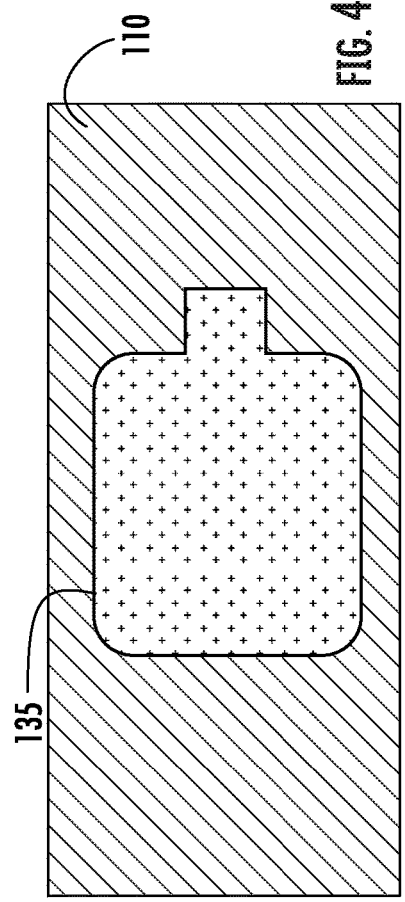
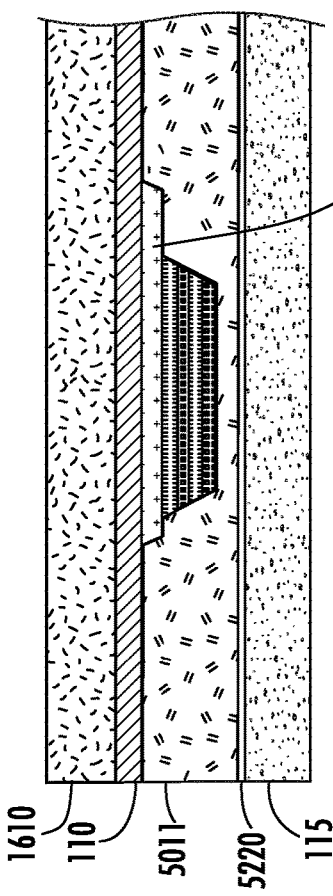
FIG. 41B

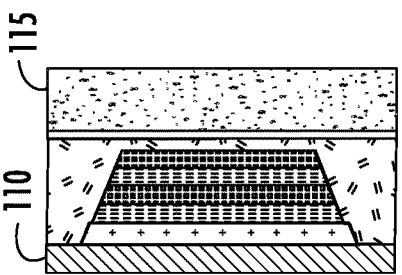
FIG. 42C
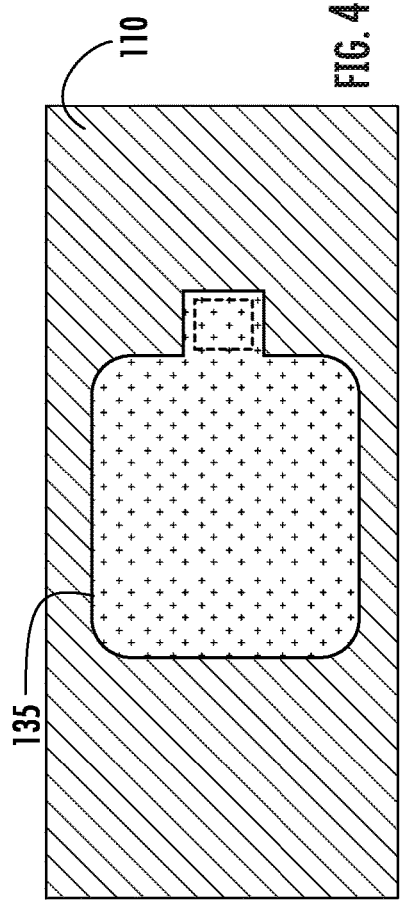
FIG. 42A
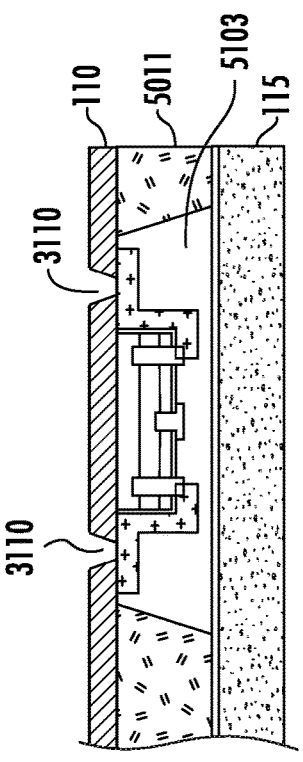
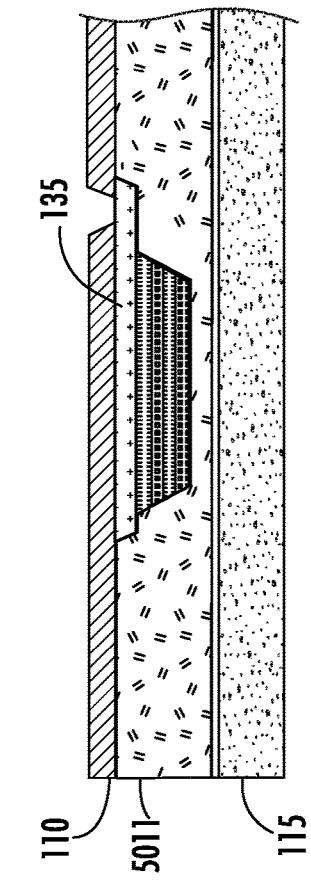
FIG. 42B
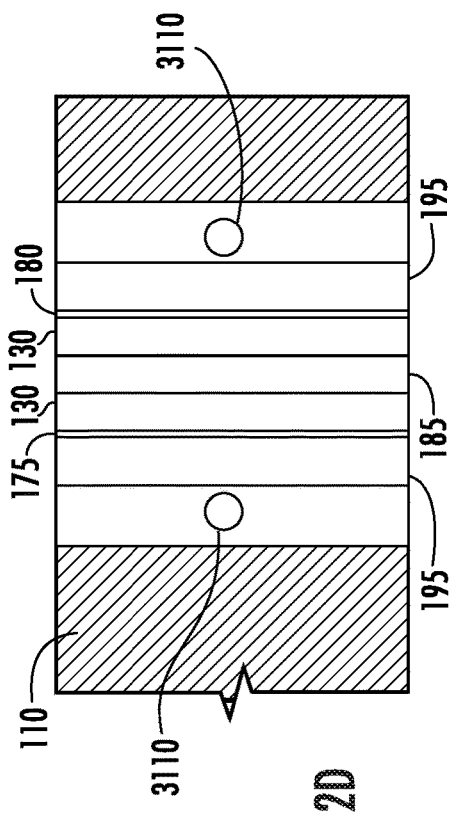
FIG. 42D

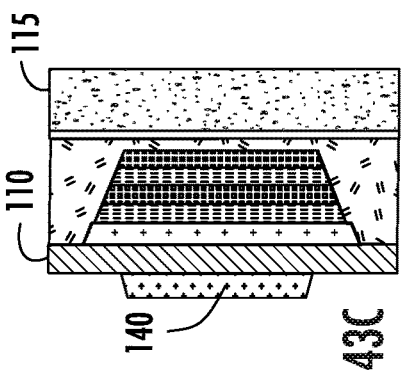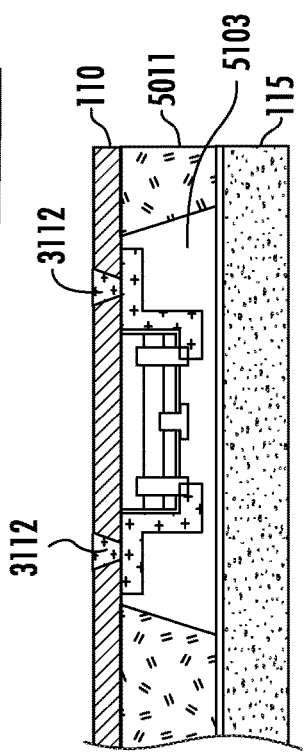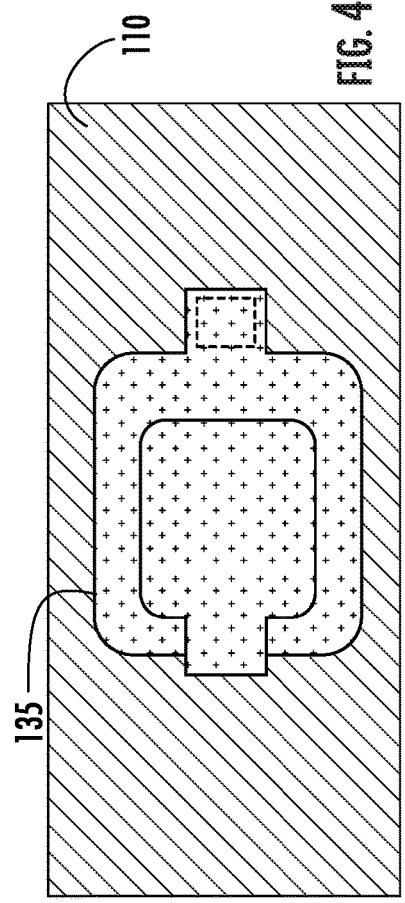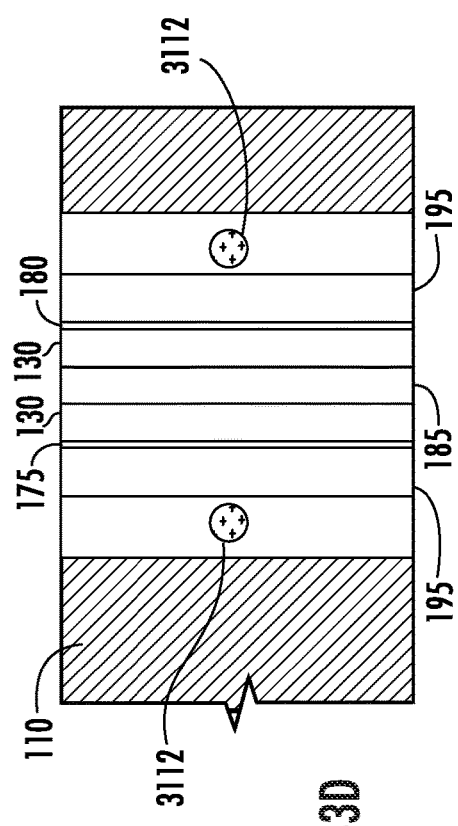
FIG. 43A
FIG. 43B
FIG. 43C
FIG. 43D

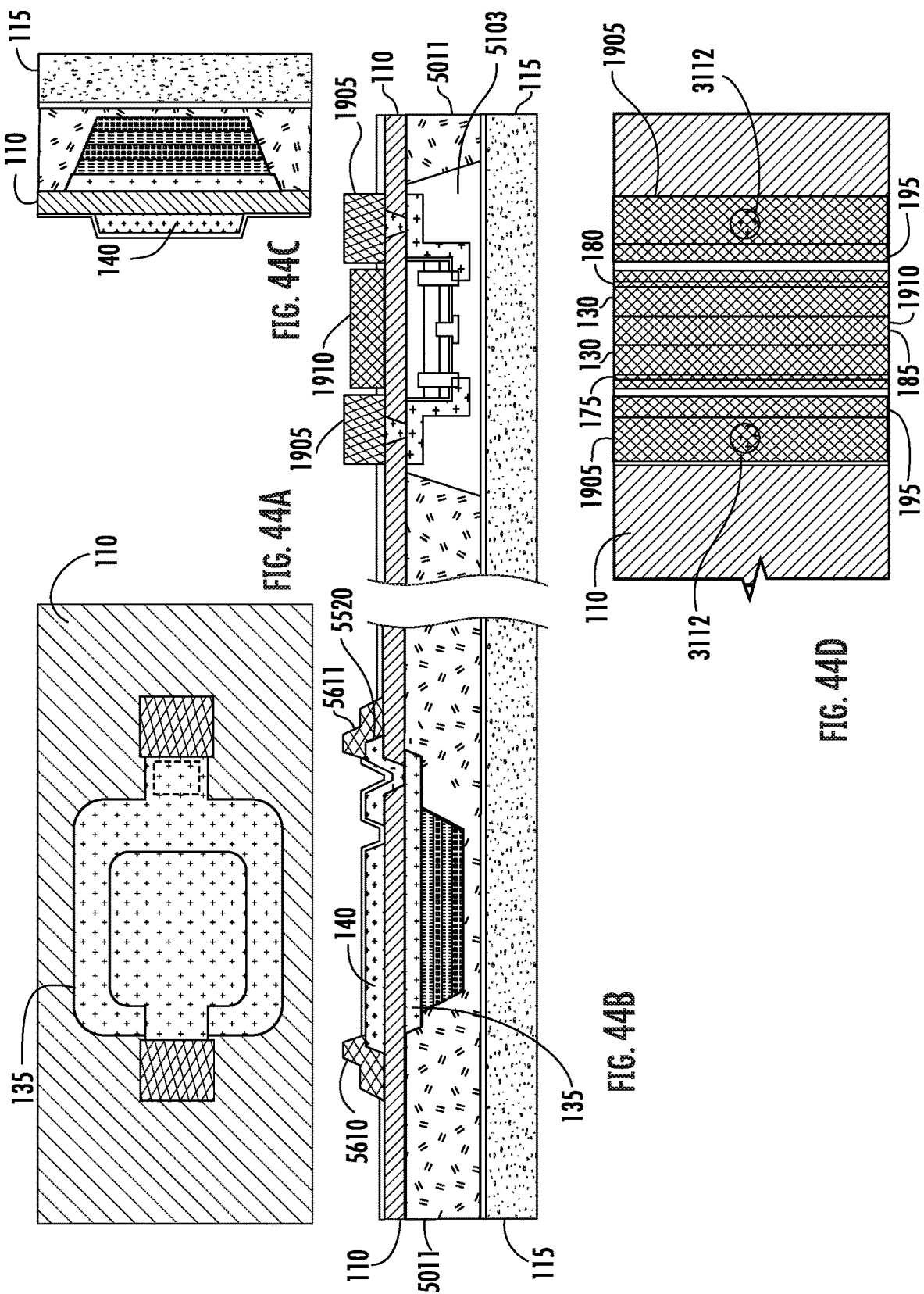

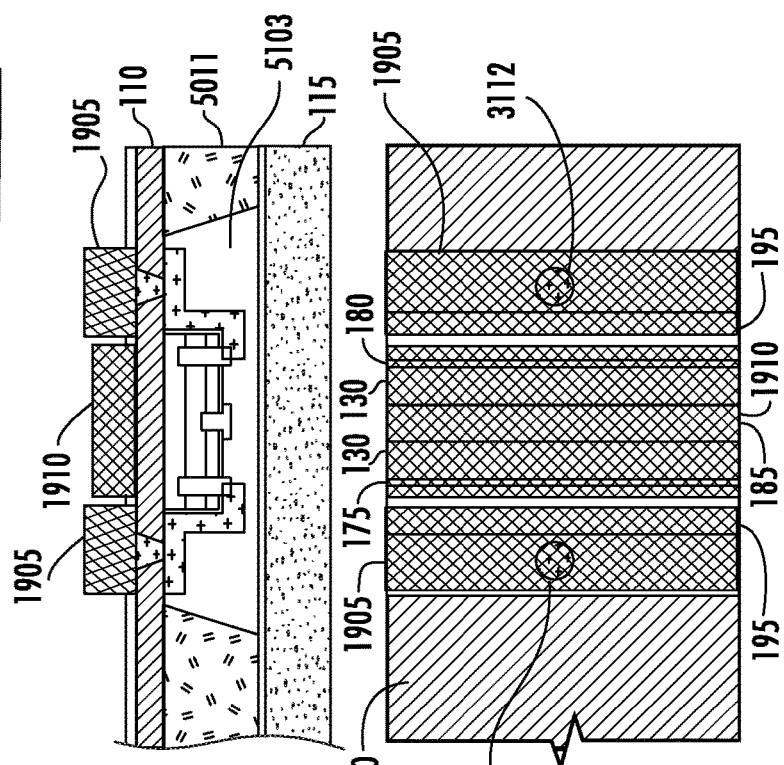

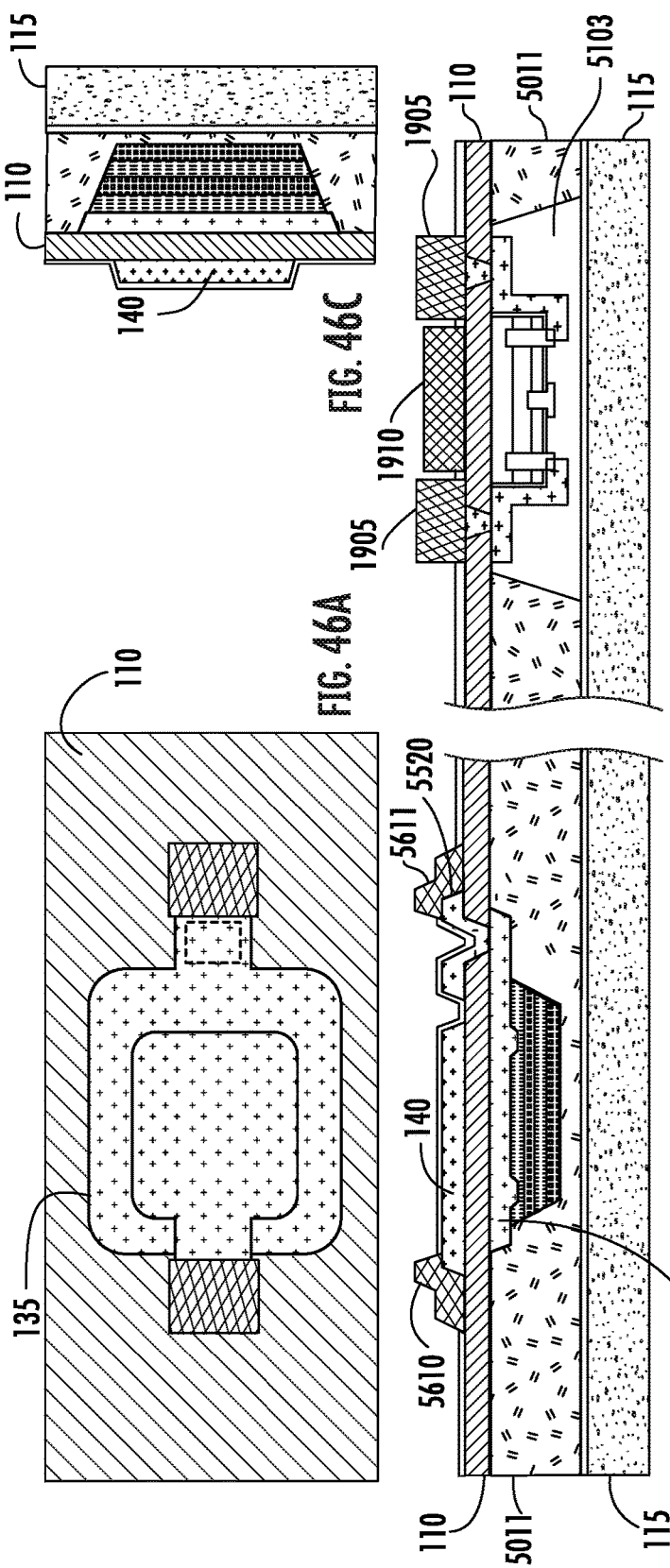
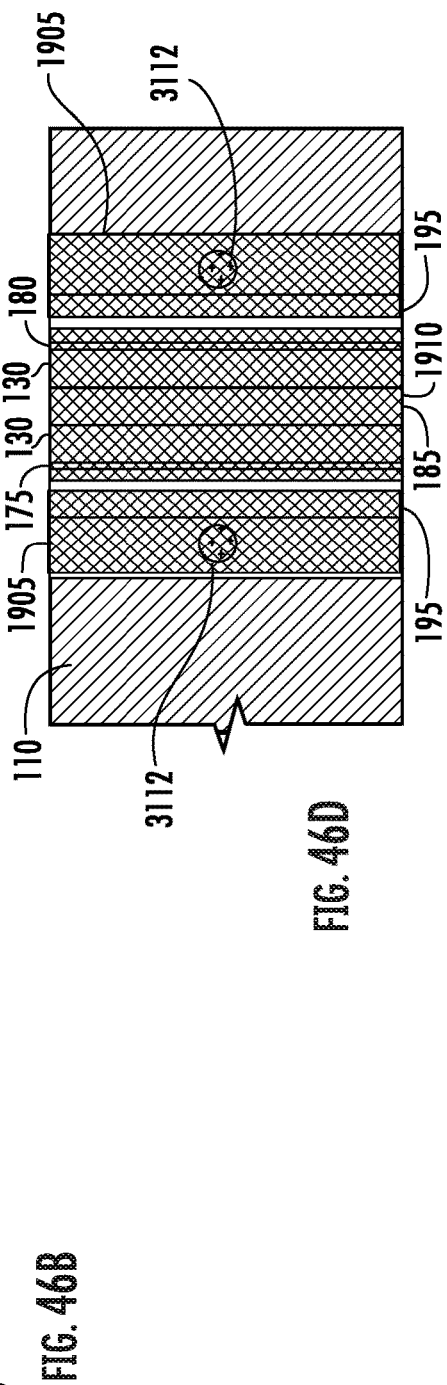

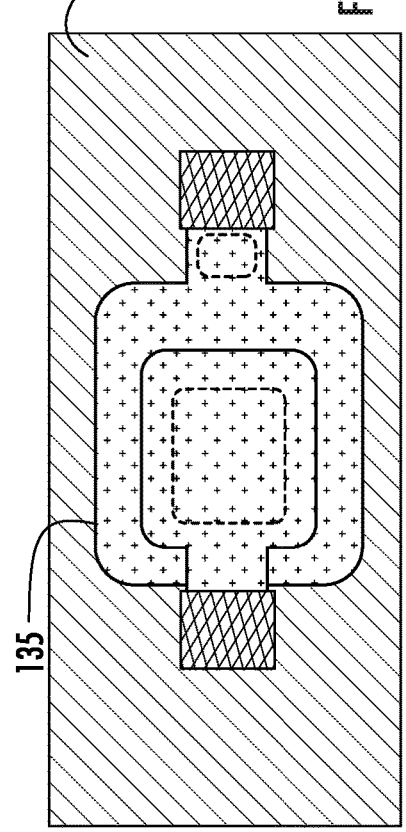
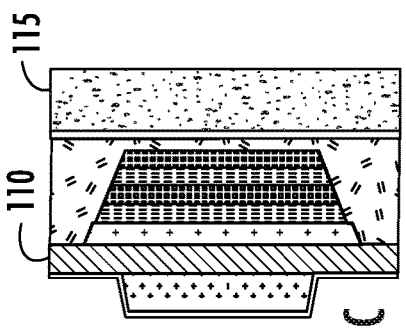
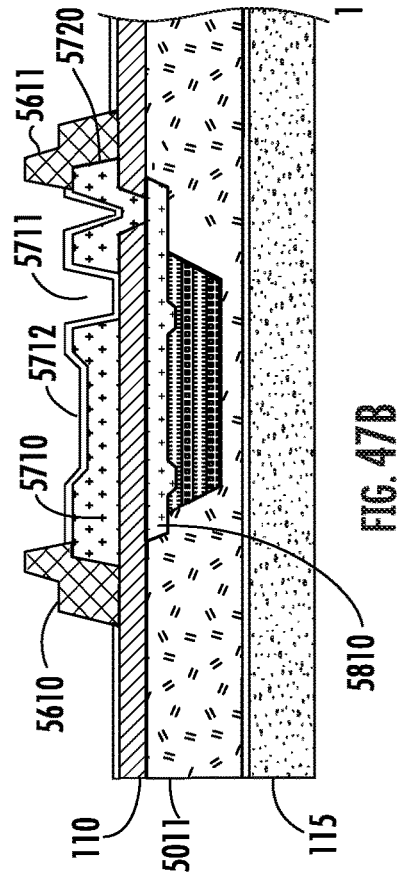
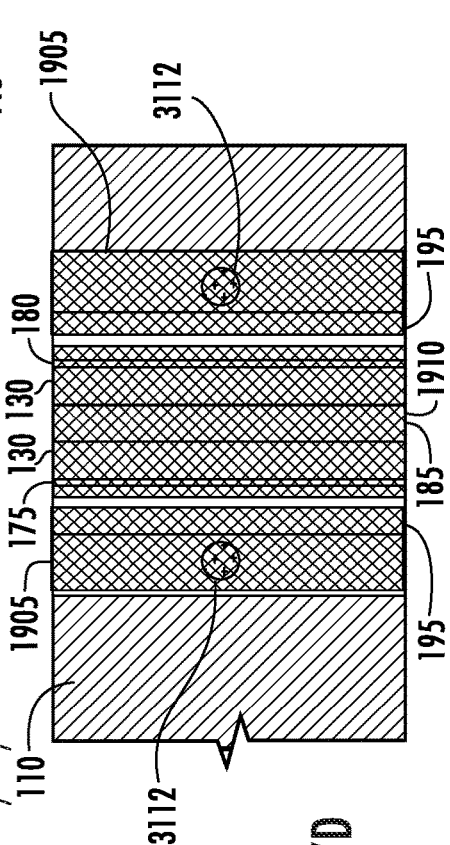
FIG. 47A
FIG. 47B
FIG. 47C
FIG. 47D

RF ACOUSTIC WAVE RESONATORS INTEGRATED WITH HIGH ELECTRON MOBILITY TRANSISTORS INCLUDING A SHARED PIEZOELECTRIC/BUFFER LAYER AND METHODS OF FORMING THE SAME

The present application claims priority to U.S. patent application Ser. No. 62/963,915, titled Transistor BAW (TBAW) Filter Monolithic Integration, filed in the USPTO on Jan. 21, 2020, and the present application is a Continuation-in-Part of U.S. patent application Ser. No. 16/822,689; filed in the USPTO on Mar. 18, 2020, which is a continuation of U.S. patent application Ser. No. 16/433,849; filed in the USPTO on Jun. 6, 2019 which is a continuation of U.S. patent application Ser. No. 15/784,919; filed Oct. 16, 2017, now U.S. Pat. No. 10,355,659, which is a Continuation-in-Part of patent application Ser. No. 15/068,510; filed in the USPTO on Mar. 11, 2016, now U.S. Pat. No. 10,217,930, the entire disclosures of which are incorporated herein by reference in their entireties.

BACKGROUND

Piezoelectric based semiconductor resonator devices have been developed to act as filters and oscillators in integrated circuit devices. For example, it is known to utilize a piezoelectric material surface acoustic wave resonator or piezoelectric material bulk acoustic wave resonator as part of a filter in a mobile communications device.

High Electronic Mobility Transistors (HEMTs) have been used as amplifiers in RF applications. For example, HEMT devices are discussed further in U.S. Patent Application Publication No. US2015/0028346, the disclosure of which is incorporated herein by reference.

SUMMARY

An RF integrated circuit device can includes a substrate and a High Electron Mobility Transistor (HEMT) device on the substrate including a ScAlN layer configured to provide a buffer layer of the HEMT device to confine formation of a 2DEG channel region of the HEMT device. An RF piezoelectric resonator device can be on the substrate including the ScAlN layer sandwiched between a top electrode and a bottom electrode of the RF piezoelectric resonator device to provide a piezoelectric resonator for the RF piezoelectric resonator device.

BRIEF DESCRIPTION OF THE DRAWINGS

FIGS. 3A-24D are cross-sectional views illustrating a transfer process of forming the monolithic RF BAW piezoelectric resonator and HEMT device including the shared $Sc_xAl_{1-x}N$ layer of FIG. 1A, using a sacrificial layer to form a resonator cavity and a HEMT parasitic capacitance cavity in some embodiments according to the present invention.

FIGS. 25A-36D are cross-sectional views illustrating a transfer process of forming the monolithic RF BAW piezoelectric resonator and HEMT device including the shared $Sc_xAl_{1-x}N$ layer of FIG. 1A, using a patterned support layer to form a resonator cavity during bonding and a HEMT parasitic capacitance cavity in some embodiments according to the present invention.

FIGS. 37A-47D are cross-sectional views illustrating a transfer process of forming the monolithic RF BAW piezoelectric resonator and HEMT device including the shared $Sc_xAl_{1-x}N$ layer, with a multilayered mirror in some embodiments according to the present invention.

DETAILED DESCRIPTION OF EMBODIMENTS ACCORDING TO THE INVENTION

Figure 1A:
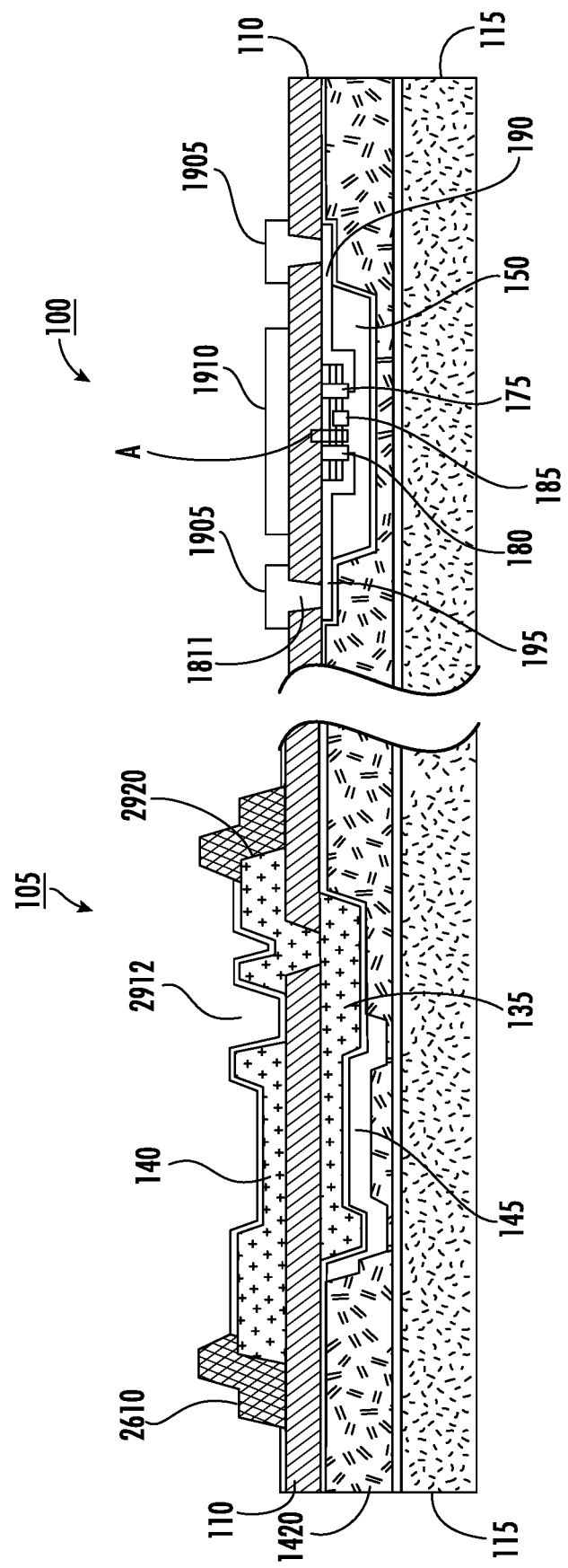
FIG. 1A is a cross-sectional schematic illustration of a monolithic RF BAW piezoelectric resonator and HEMT device including a shared $Sc_xAl_{1-x}N$ layer providing the piezoelectric layer in the piezoelectric resonator and the buffer layer in the HEMT device in some embodiments according to the present invention.

According to the present invention, techniques generally related to electronic devices are provided. More particularly, the present invention provides techniques related to a method of manufacture and structure for acoustic wave resonator devices integrated with high electron mobility transistor devices including single crystal piezoelectric layers that can be shared by both devices to provide synergistic functional and structural advantages for each. Merely by way of example, the invention has been applied to a single crystal resonator device for a communication device, mobile device, computing device, among others.

As appreciated by the present inventors, the performance of piezoelectric resonator devices can be improved, particularly at frequencies in the 5G range, by providing high quality single crystal piezoelectric layers. Forming such high quality single crystal piezoelectric layers, however, can be difficult due to the tendency of some piezoelectric materials, such as AlN, to crack or otherwise fail due to thermal issues or increased stresses resulting from epitaxial type processes typically used to form single crystal piezoelectric layers. For example, some epitaxial processes may grow piezoelectric materials on Si where temperatures may exceed about 1000 degrees Centigrade. When the wafer is cooled-down, the materials may crack due to excessive stresses induced (particularly when the piezoelectric materials are formed to thicknesses that are suited for high frequency applications—such as 5G). As further appreciated by the present inventors, strain balancing can be used to counteract the stresses described above by growing other layers on the piezoelectric materials, such as a cap that is configured to make the piezoelectric materials resistant to cracking.

Accordingly, as appreciated by the present inventors, the integration of a piezoelectric resonator device with a HEMT device can provide some advantages to the formation and performance of each device. In particular, one or more layers of a HEMT device (such as the channel layer) can provide strain balancing for an epi-grown piezoelectric layer, such as a $Sc_xAl_{1-x}N$ layer, by growing the channel layer on the piezoelectric layer as part of the epi-process. Moreover, the piezoelectric layer can also provide a good structure for the formation of a HEMT channel layer, such as GaN. Moreover, when the piezoelectric resonator device and the HEMT device are fabricated as a monolithic integrated device, the same piezoelectric layer can be shared by both devices. For example, a $Sc_xAl_{1-x}N$ layer can extend across a substrate to provide a $Sc_xAl_{1-x}N$ piezoelectric layer of the resonator device at a first region of the substrate as well as to provide a $Sc_xAl_{1-x}N$ buffer layer of the HEMT device at a second region of the substrate.

In some embodiments, the strain balancing includes configurations where a shared piezoelectric layer can be stress-balanced relative to the HEMT channel layer. In some embodiments a strain between the shared piezoelectric layer and the HEMT channel layer can be considered to be "stress-balanced" if the strain is in a range between about +400 MPa and about −400 MPa.

As further appreciated by the inventors, in some embodiments, a $Sc_xAl_{1-x}N$ piezoelectric layer can provide relatively high K and can provide a good lattice match for the formation of the HEMT channel layer. Still further, the composition of the $Sc_xAl_{1-x}N$ can be configured to adjust K as well as to configure the lattice to accommodate the growth of other III-N channel layers for the HEMT device. For example, in some embodiments, $Sc_{0.18}Al_{0.82}N$ can be used for a good K as well as a good lattice match for a GaN channel. In other embodiments, $Sc_{0.30}Al_{0.70}N$ can be used to provide a lattice match for a InGaN channel. Other III-N materials may be used to for the channel layer, which can be matched to the $Sc_xAl_{1-x}N$ shared layer.

Methods of forming a piezoelectric resonator device integrated with a HEMT device can take advantage of a transfer process by forming a semiconductor stack of materials that includes the shared piezoelectric layer and the remainder of the HEMT layers, including a III-N channel layer (on the piezoelectric layer as the buffer layer for the HEMT), the barrier layer, and an optional cap. The HEMT stack can be further processed to form the source and drain regions and the gate. The metallization for ohmic contacts to the source, drain and gate may also be used to form a bottom electrode for the resonator.

The entire structure (the resonator and the HEMT) can then be transferred to a carrier substrate (such as Si<100>) so that the growth substrate (on which the shared piezoelectric layer and the HEMT stack were grown) can be removed. Once the growth substrate is removed, the exposed backside of the piezoelectric layer can be processed to form, for example, a top electrode (for the resonator) and to form vias and contacts (for the resonator and the HEMT). Accordingly, the transfer process allows both sides of the shared piezoelectric layer to be utilized (for both the resonator and the HEMT). As further appreciated by the present inventors, Surface Acoustic Wave resonator devices can also be integrated with HEMT devices by a shared piezoelectric layer in some embodiments according to the invention, which may not utilize a transfer process. It will be understood that in some embodiments according to the invention, other materials may be used as the carrier substrate.

As further appreciated by the present inventors, in some embodiments according to the invention, the thickness of the HEMT channel layer may be configured to provide the strain balancing for the formation of the shared piezoelectric layer. In particular, typically the thickness of a HEMT channel layer is reduced. As appreciated by the present inventors, however, in some embodiments according to the invention, the thickness of the HEMT channel layer can be increased to provide improved strain balancing for the underlying shared piezoelectric layer. Accordingly, the thickness and the composition of the HEMT channel layer (as well as the respective thicknesses and compositions of the HEMT barrier can cap layers) can be configured for strain balancing.

Still further, in some embodiments according to the invention, the growth substrate can be conditioned with hot nitrogen gas before growth of the shared piezoelectric layer. For example, $NH_3$ can be provided to the surface of the growth substrate (such as SiC or $Al_2O_3$) to form a SiN at the surface of the growth substrate. Due to stress compensation, the SiN can enable the growth of a thicker shared piezoelectric layer, which may also be more resistant to cracking after the epi-process. In some embodiments according to the invention, the growth substrate can be silicon <111> or SiC. Other materials may also be used for the growth substrate.

Figure 12:
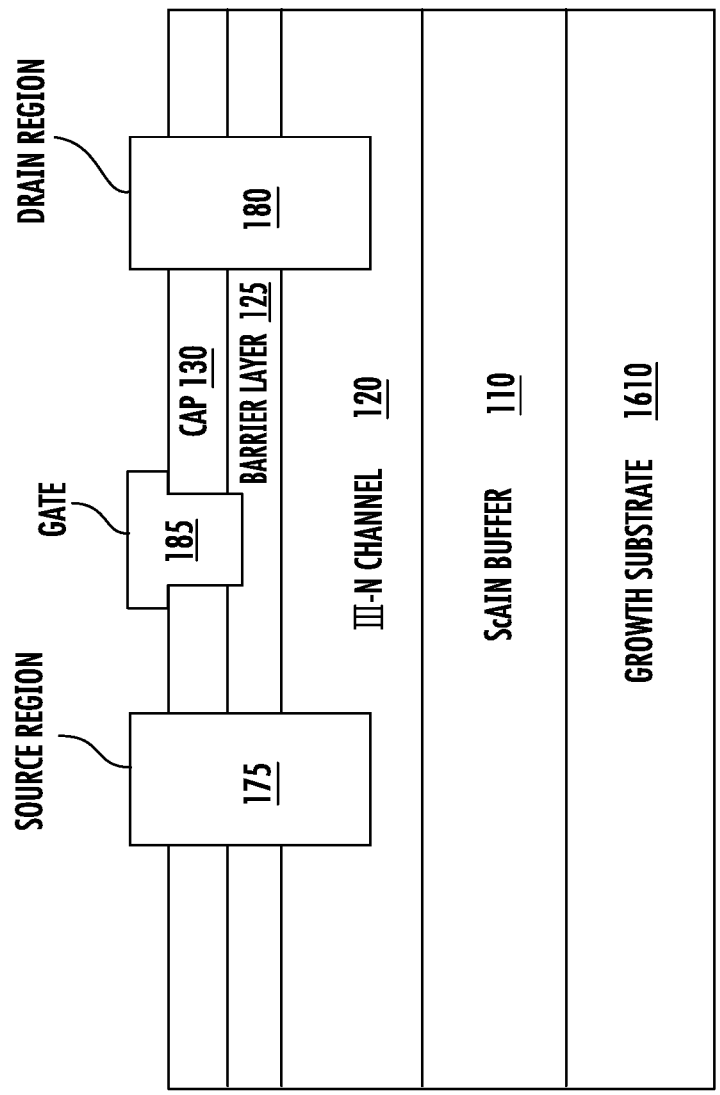
Figure 14A:
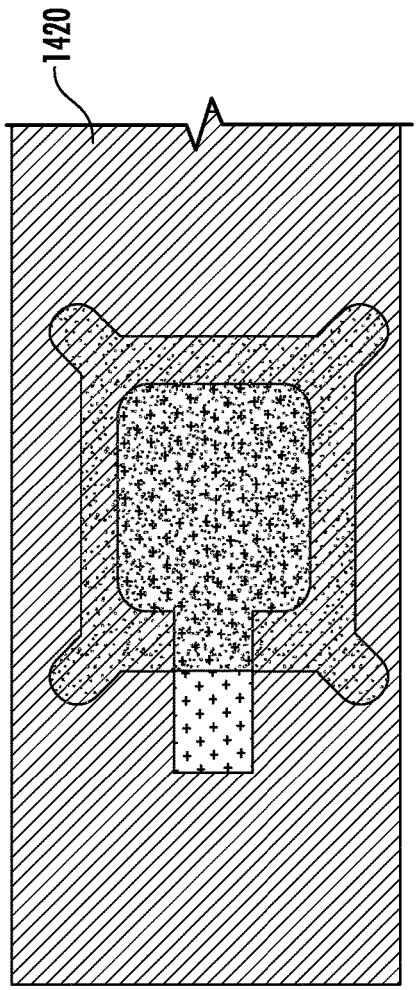
Figure 14C:
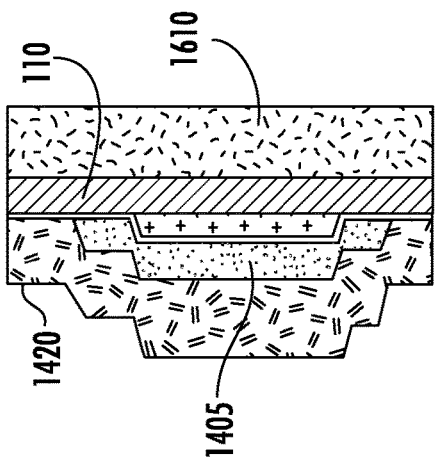
Figure 14B:
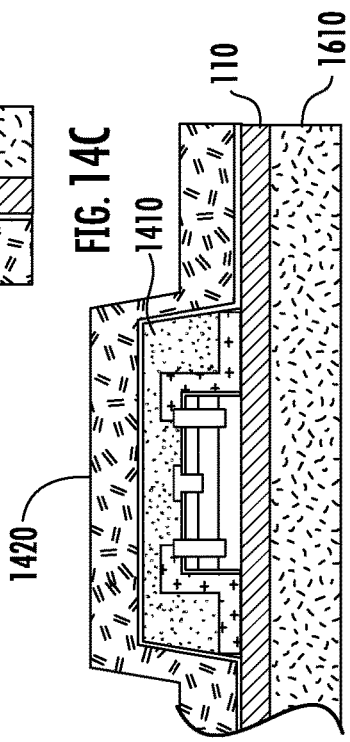
Figure 14D:
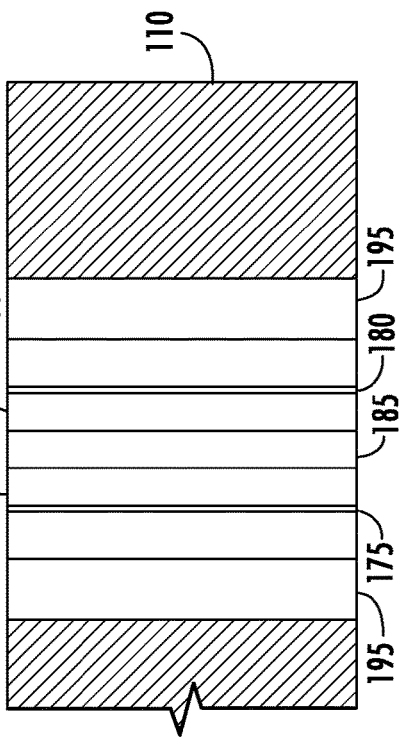
Figure 15A:
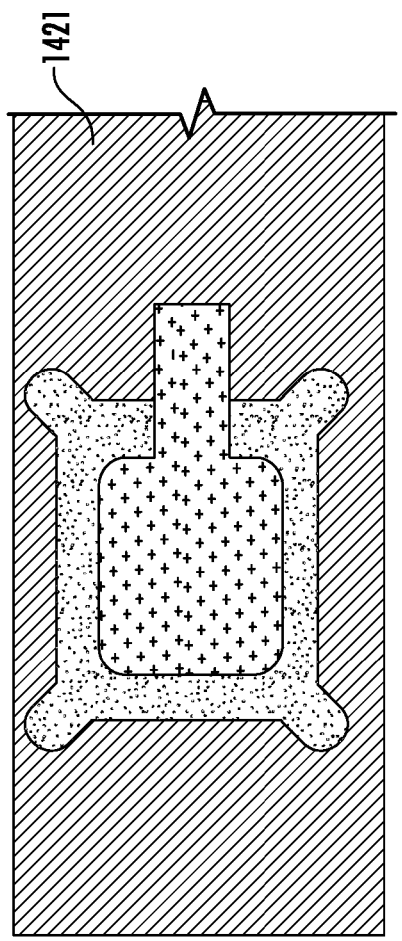
Figure 15C:
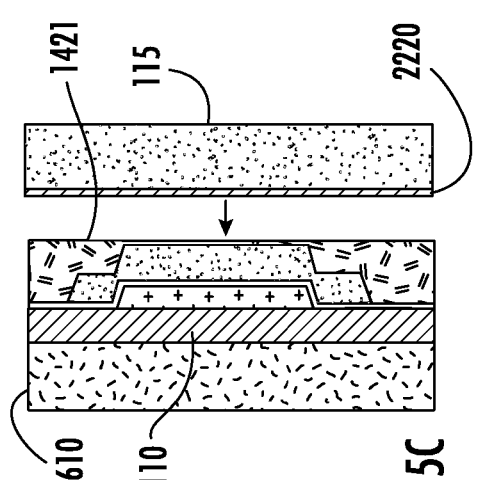
Figure 15B:
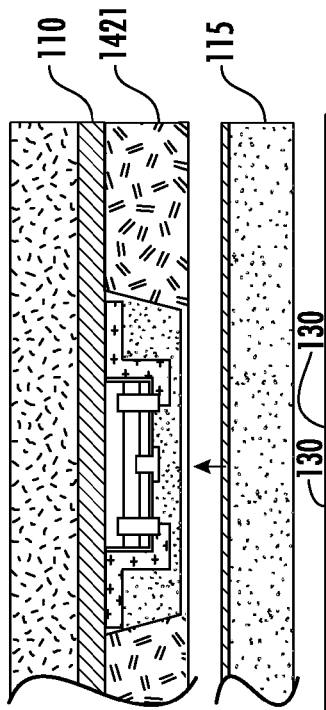
Figure 15D:
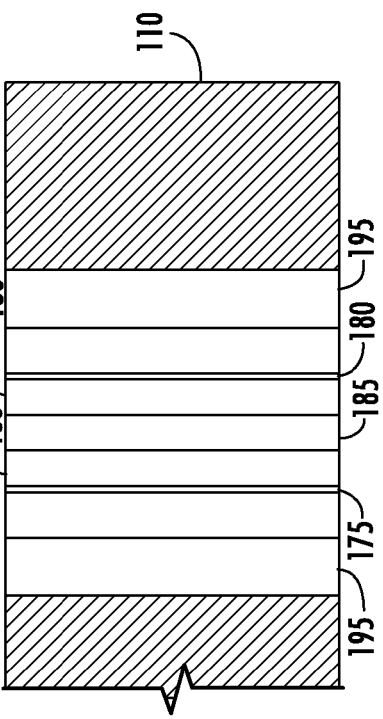
Figures 29A, 29B, 29C, 29D:
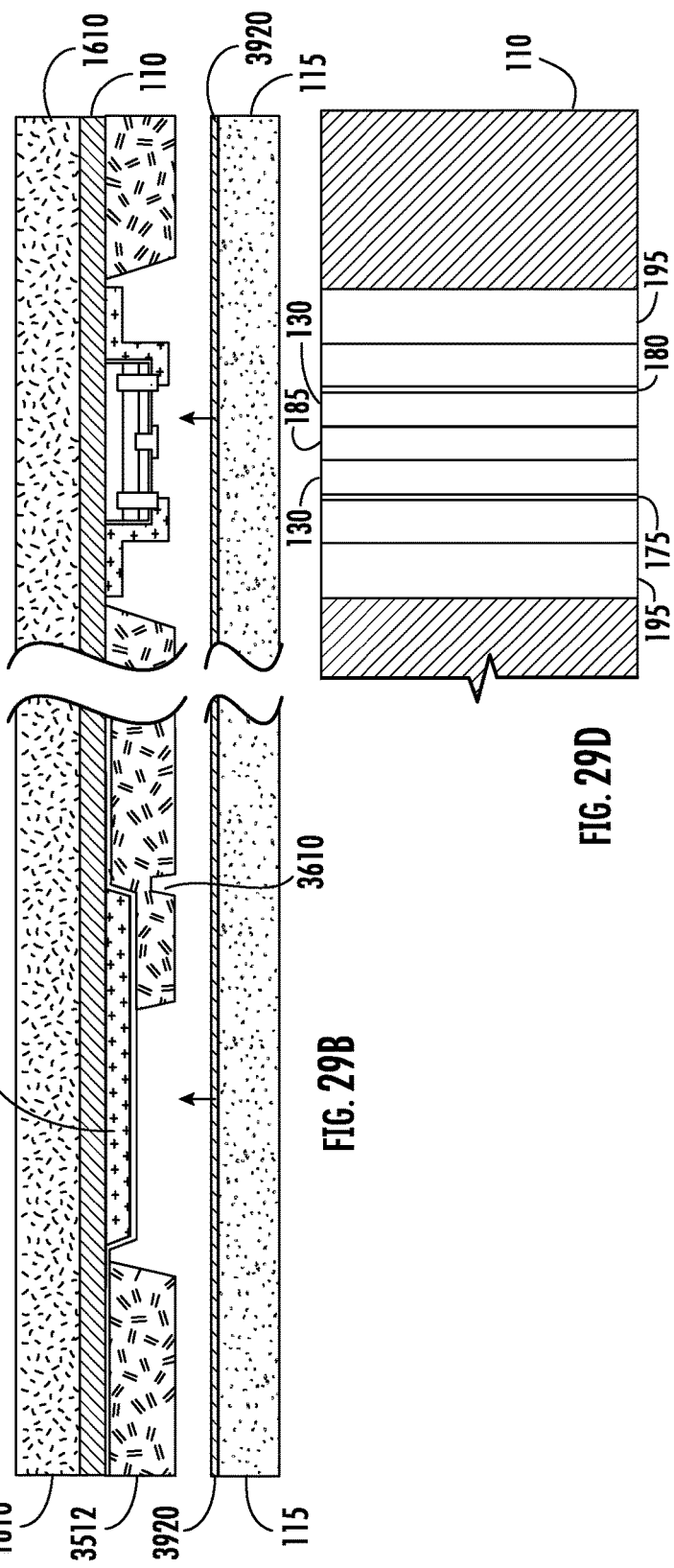
Figure 39A:
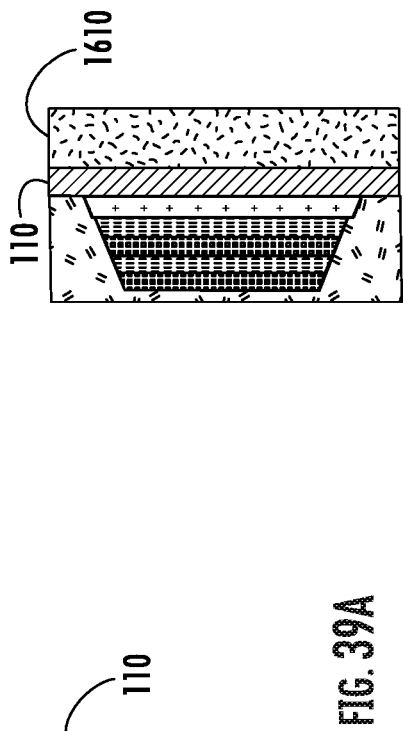
Figure 39B:
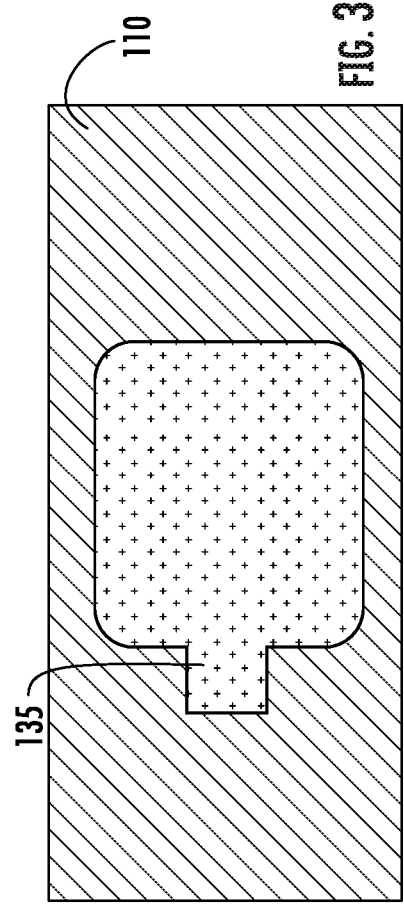
Figure 39C:
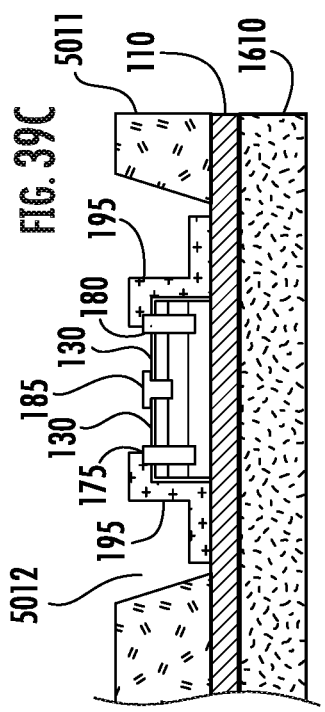
Figure 39D:
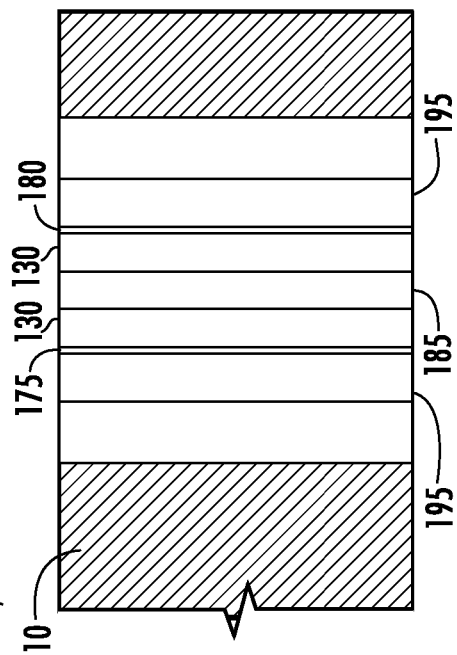

FIG. 1A is a cross-sectional schematic illustration of a monolithic RF Bulk Acoustic Wave (BAW) piezoelectric resonator device 105 integrated with a HEMT device 100 including a shared $Sc_xAl_{1-x}N$ layer 110 providing the piezoelectric layer in the piezoelectric resonator device 105 and the buffer layer in the HEMT device 100 in some embodiments according to the present invention. According to FIG. 1A, the shared $Sc_xAl_{1-x}N$ layer 110 extends across the monolithic carrier substrate 115 to provide the piezoelectric layer of the resonator device 105 and the buffer layer of the HEMT device 100. The HEMT device 100 includes a HEMT stack of materials A that form the active layers of the HEMT device 100, including a III-N channel layer 120, a barrier layer 125 and an optional cap layer 130 (FIG. 12).

It will be understood that, in some embodiments, the HEMT stack of materials A and the shared $Sc_xAl_{1-x}N$ layer 110, can be epitaxially grown on the carrier substrate 115 without a vacuum break being introduced during formation of the HEMT stack of materials A and the shared $Sc_xAl_{1-x}N$ layer 110. In other words, once the reaction chamber used for the epi-process is brought to temperature, the process continues until formation of the HEMT stack of materials is complete before the temperature is allowed to cool-down.

As further shown in FIG. 1A the shared $Sc_xAl_{1-x}N$ layer 110 is sandwiched between a bottom electrode 135 and a top electrode 140. The bottom electrode 135 is separated from the carrier substrate 115 by a resonator cavity 145 that allows the portion of the shared $Sc_xAl_{1-x}N$ layer 110 that is located between the top and bottom electrodes 135 and 140 to resonate responsive to electromagnetic energy impinging on that portion of the shared $Sc_xAl_{1-x}N$ layer 110 to create an electrical response at the top and bottom electrodes 135 and 140. The resonator cavity 145 also allows the portion of the shared $Sc_xAl_{1-x}N$ layer 110 that is located between the top and bottom electrodes 135 and 140 to resonate responsive to an electrical signal applied across the top and bottom electrodes 135 and 140. Further, the resonance of the shared $Sc_xAl_{1-x}N$ layer 110 can be affected by the level of Sc included in the shared $Sc_xAl_{1-x}N$ layer 110.

It will be further understood that the level of Sc included in the shared $Sc_xAl_{1-x}N$ layer 110 also determines the lattice structure of the shared $Sc_xAl_{1-x}N$ layer 110 so that other materials, such as the III-N channel layer may be more readily lattice matched to the underlying shared $Sc_xAl_{1-x}N$ layer 110. For example, in some embodiments according to the present invention, a $Sc_{0.18}Al_{0.72}N$ layer is closely matched to the lattice structure of GaN. Accordingly, in some embodiments according to the invention, a GaN channel layer 120 can be grown on the region of the shared $Sc_{0.18}Al_{0.72}N$ layer included in the HEMT device 100. It will be understood that other compositions of $Sc_xAl_{1-x}N$ layer 110 can be used for different III-N channel layers 120, such as InGaN, InGaAsN.

As further shown in FIG. 1A, the HEMT device 100 also includes a parasitic capacitance cavity 150 between the HEMT material stack A and the carrier substrate 115. It will be understood that the resonator cavity 145 and the parasitic capacitance cavity 150 may be formed in the same step or may be formed separately. Further, the resonator cavity 145 and the parasitic capacitance cavity 150 may have different volumes and may be spaced apart from the carrier substrate 115 by different amounts. The resonator cavity 145 and the parasitic capacitance cavity 150 may also be filled with gas, such as air or may be a vacuum, in some embodiments.

As shown in FIG. 1A, the shared $Sc_xAl_{1-x}N$ layer 110 includes an opening that exposes the bottom electrode 135 so that a conductive material may be formed therein. The conductive material protrudes from the opening to couple to a bottom electrode contact 2920. The top electrode 140 includes a depression 2912 in an upper surface thereof. A contact 2610 is located on the upper surface of the shared $Sc_xAl_{1-x}N$ layer 110 and is coupled to the top electrode 140. Although not show in FIG. 1A, the resonator device 105 can also include a cavity located above the top electrode 140. It will also be understood that the cavities described herein may also be any shape that provides the functionality described.

As further shown in FIG. 1A, the HEMT device 100 includes a source region 175, a drain region 180, and a gate 185 located at a level in the HEMT stack A that is closest to the carrier substrate 115. Accordingly, the source region 175, the drain region 180, and the gate 185 of the HEMT device 100 are located on the same side of the shared $Sc_xAl_{1-x}N$ layer 110 as the bottom electrode 140 of the resonator device 105. Further, respective metallizations 190 and 195 extend from the source region 175 and the drain region 180 off the HEMT stack A to respective contacts 1905 that each extend through the shared $Sc_xAl_{1-x}N$ layer 110. It will be understood that the respective metallization 190 and 195 can be formed in the same step along with the bottom electrode 140 in some embodiments according to the invention. Still further, the respective contacts 1905 may be formed in the same step used to form the top electrode 140 in some embodiments according to the invention.

The HEMT device 100 and the resonator device 105 are both supported by a dielectric layer 1420 (sometimes referred to herein as a support layer) that forms the lower wall of each of the resonator cavity 145 and the parasitic capacitance cavity 150 adjacent to the surface of the carrier substrate 115.

Figure 1B:
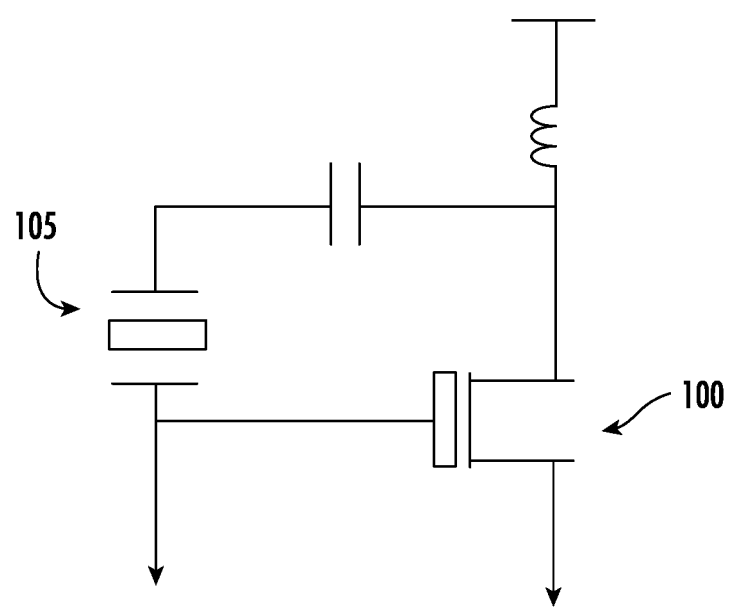
FIG. 1B is a circuit diagram illustrating the monolithic RF BAW piezoelectric resonator and HEMT device of FIG. 1A in some embodiments according to the present invention.

FIG. 1B is a circuit 220 diagram illustrating the monolithic RF BAW piezoelectric resonator 105 and HEMT device 100 of FIG. 1A in some embodiments according to the present invention. In particular, FIG. 1B shows that contacts of the BAW piezoelectric resonator 105 and of the HEMT device 100 can be coupled together to form a circuit such as those shown in FIGS. 49 to 54, in some embodiments according to the invention.

Figure 2:
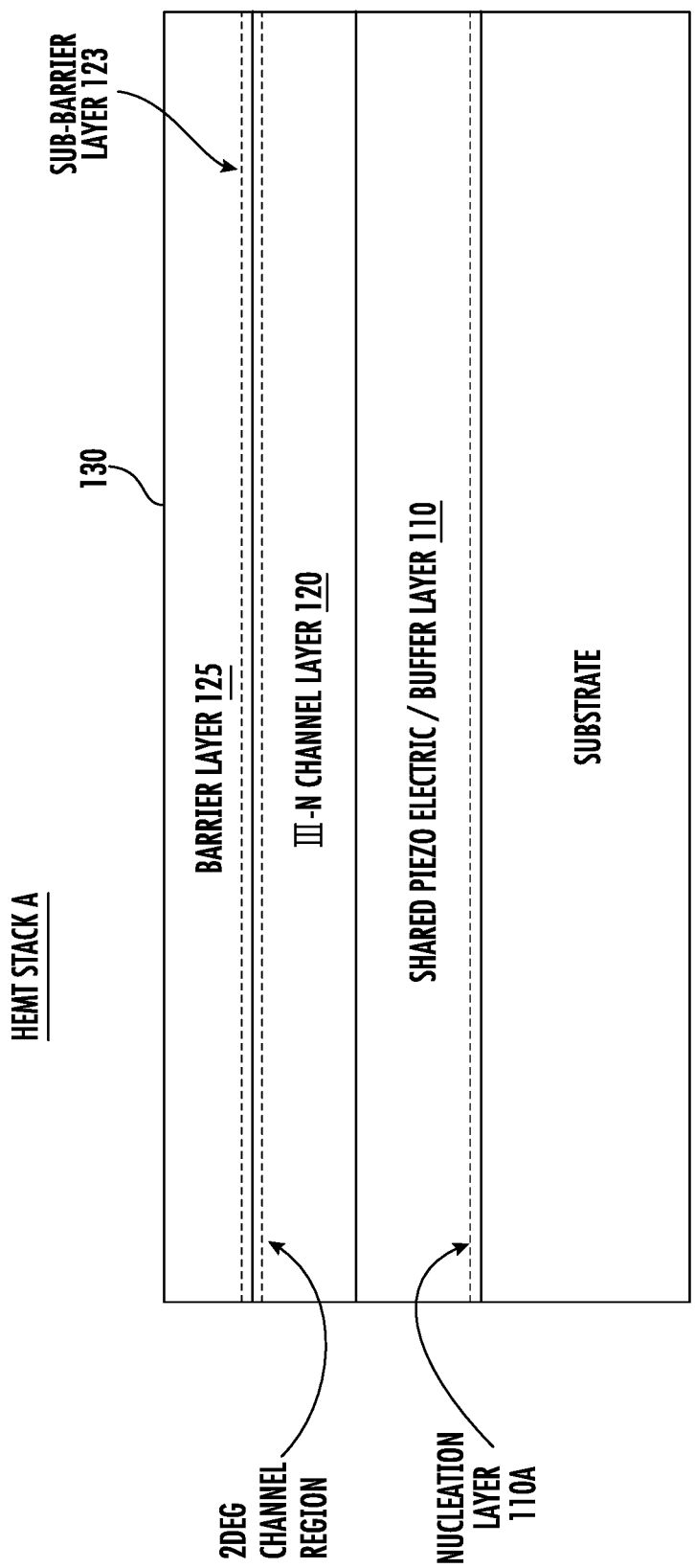
FIG. 2 is a detailed cross-sectional view of a portion of HEMT stack of semiconductor materials in portion A of FIG. 1A including the shared $Sc_xAl_{1-x}N$ layer as the barrier layer in some embodiments according to the present invention.
Figure 3A:
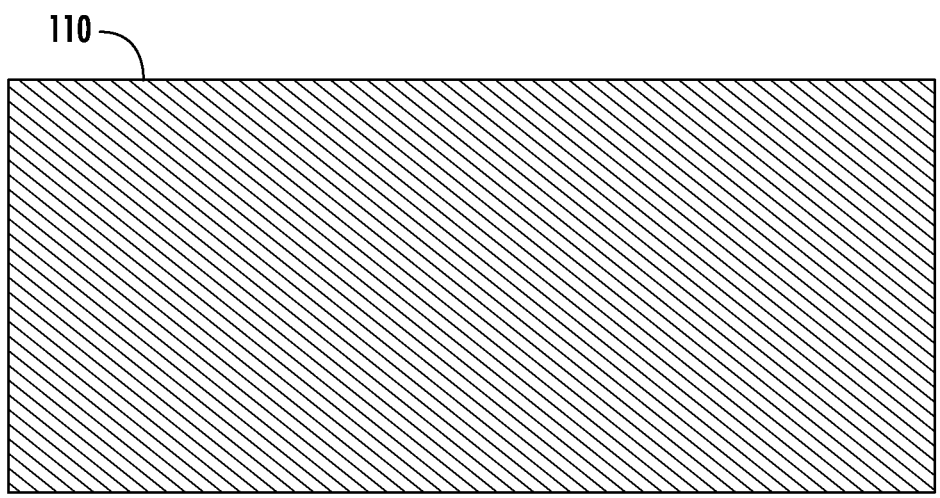
Figure 3B:
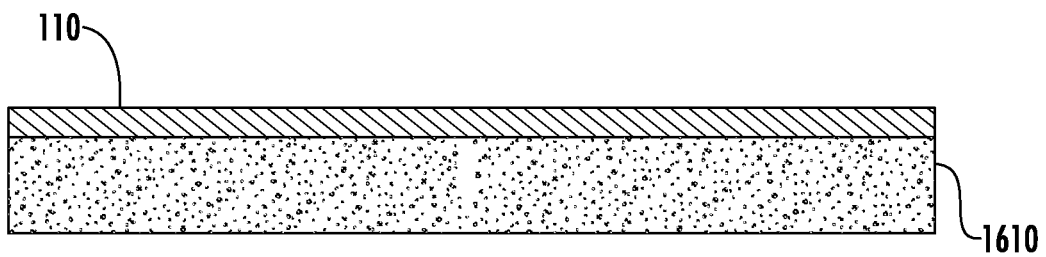
Figure 4:
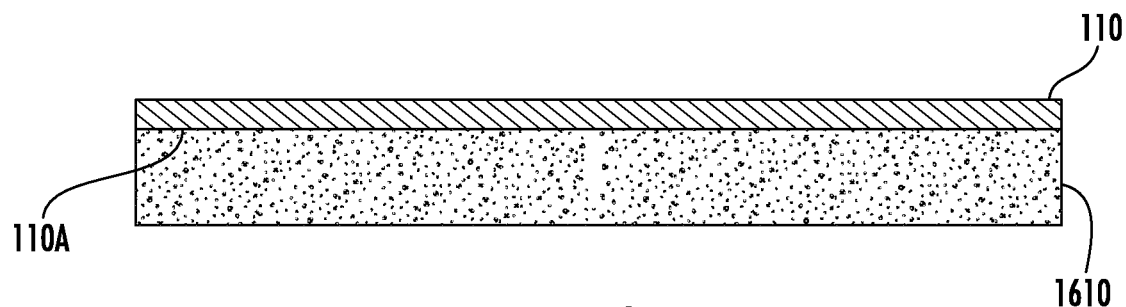
Figure 5:
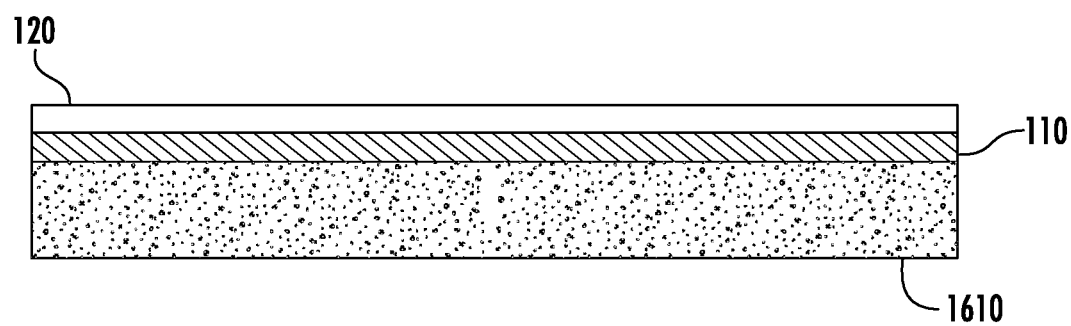
Figure 6:
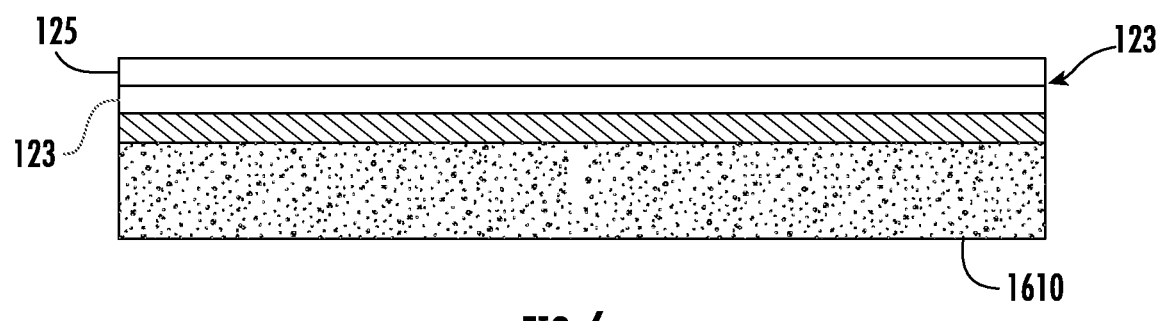
Figure 7:
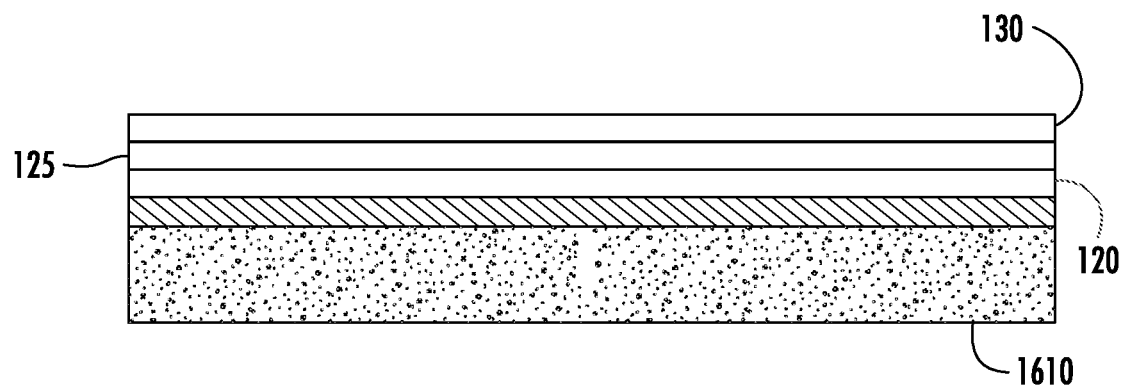

FIG. 2 is a detailed cross-sectional view of the HEMT stack A of semiconductor materials in FIG. 1A including the shared $Sc_xAl_{1-x}N$ layer 110 in some embodiments according to the present invention. According to FIG. 2, the shared $Sc_xAl_{1-x}N$ layer 110 extends across the carrier substrate 115 and is included in the RF BAW piezoelectric resonator 105 (as the piezoelectric resonator) and in the HEMT device 100 (as the buffer layer) in some embodiments. As further shown in FIG. 2, a nucleation layer 110a can be formed on the growth substrate 2610 in order to promote the epitaxial growth of the shared $Sc_xAl_{1-x}N$ layer 110. For example, an AlN or GaN nucleation layer can be formed on a Si <100> substrate resonator to promote the epitaxial growth of the shared $Sc_xAl_{1-x}N$ layer 110, depending of the level of doping of Sc. In some embodiments, the thickness of the nucleation layer can be about 0.05 microns, using for example ALD. It will be understood that the nucleation layer may be removed (wholly or in part) with the growth substrate 2610 when the partially formed RF BAW piezoelectric resonator 105 and HEMT device 100 is transferred to the carrier substrate 115. In some embodiments, the growth substrate 2610 can be Si, SiC, Al2O3, or glass. Other carrier substrates can also be used.

The shared $Sc_xAl_{1-x}N$ layer 110 can be formed to a thickness of about 0.5 microns using a process that provides a single crystal piezoelectric layer. In some embodiments, the single crystal piezoelectric layer can be formed via a relatively ordered crystal growth such as MOCVD, MBE, HVPE or the like. In some embodiments according to the invention, the shared $Sc_xAl_{1-x}N$ layer 110 can be $Sc_{0.18}Al_{0.82}N$ (sometimes referred to herein as 18% Sc) formed to have a crystalline structure characterized by an XRD ω-rocking curve FWHM value in a range between about less than 1.0 degrees to about 0.001 degrees as measured about a two-theta (2Θ) scan angle as measured about the $Sc_xAl_{1-x}N$ c-axis film reflection. In some embodiments, the level of Sc may up to about 40% depending on the materials used for the III-N channel layer and the levels of those materials in the III-N channel layer.

The III-N channel layer 120 can be a GaN channel layer grown on the shared $Sc_xAl_{1-x}N$ layer 110. In some embodiments, the GaN channel layer is grown to a thickness in a range between about 0.5 microns to about 1.0 microns. As appreciated by the present inventors the III-N channel layer 120 can be grown to be stress-balanced relative to the underlying shared $Sc_xAl_{1-x}N$ layer 110.

The barrier layer 125 can be selected to provide a relatively stress-balanced barrier layer with a relatively large band offset and polarization relative to the channel layer 120 to support confinement of the 2DEG channel region and high voltage/power applications. In some embodiments, the barrier layer 125 can be $Sc_xAl_{1-x}N$ lattice matched to the underlying shared $Sc_xAl_{1-x}N$ layer (buffer) 110 layer. In some embodiments, the barrier layer 125 can be AlGaN. It will be understood that the barrier layer 125 may include a sub-barrier layer 123 adjacent to the interface with the channel layer 120 that is a closer lattice match to the channel layer 120 to promote a lower strain transition from the channel layer 120 to the barrier layer 125. In some embodiments, the sub-barrier layer 123 can be AlN formed to a thickness in a range between about 1 microns to about 0.005 microns, which may be transitioned to AlGaN or $Sc_xAl_{1-x}N$ as formation progresses. In some embodiments, the sub-barrier layer 123 and the barrier layer 125 can be formed by changing the composition of the material in-process. For example, if the barrier layer 125 is to be ScAlN or AlGaN, the sub-barrier layer 123 can be initially formed as AlN and transition to include a level of Sc or Ga until the target composition of the ScAlN or AlGaN as the barrier layer 125 is reached.

As further shown in FIG. 2, the HEMT stack A can include a cap layer 130 grown on the barrier layer 125. In some embodiments, the cap layer 130 can be GaN formed to a thickness in a range between about 0.01 and 0.001 microns. In some embodiments, the cap layer 130 can be eliminated. In still other embodiments, an amorphous AlN may be formed on the barrier layer 125.

FIGS. 13A-24 are cross-sectional views illustrating a transfer process of forming the monolithic RF BAW piezoelectric resonator and HEMT device including the shared $Sc_xAl_{1-x}N$ layer of FIG. 1A, using a transfer structure (carrier substrate) and a sacrificial layer to form a resonator cavity and a HEMT parasitic capacitance cavity in some embodiments according to the present invention. In these figure series described below, the "A" figures show simplified diagrams illustrating top cross-sectional views of the BAW piezoelectric resonator and the HEMT device according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. Similarly, the "D" figures show simplified diagrams top cross-sectional views of the HEMT device 100 illustrating widthwise cross-sectional views of the same devices in the "A" figures. In some cases, certain features may be omitted to highlight other features and the relationships between such features. Those of ordinary skill in the art will recognize variations, modifications, and alternatives to the examples shown in these figure series.

According to FIGS. 3A-3C and 4-7 the piezoelectric layer 110 is formed on the growth substrate 1610. In some embodiments, the growth substrate 1610 can include silicon (S), silicon carbide (SiC), $Al_2O_3$ or other like materials. The piezoelectric layer 110 can be an epitaxial layer of $Sc_xAl_{1-x}N$, or other like materials. Additionally, this piezoelectric layer 110 can be subjected to a thickness trim. It will be understood that FIGS. 4-7 illustrate an epi-growth process used to form the HEMT stack A including the piezoelectric layer 110, the III-N channel layer 120, the barrier layer 125, and the optional cap layer 130.

The epi-growth process can be performed so that layers of the HEMT stack A are formed in a reaction chamber without the HEMT stack A being cooled down below the temperature at which the epi-growth is performed. In particular, as shown in FIGS. 4-7, the piezoelectric layer 110 can be formed on a nucleation layer 110A, of AN or GaN for example, on the growth substrate. The barrier layer 125 can be formed on the III-N channel layer using a sub-barrier layer 123 and the optional cap layer 130 can be formed on barrier layer 125. After the HEMT stack A is grown, further processing of the HEMT stack can be performed outside the process, or alternatively as part of the epi-growth process.

In some embodiments, the epi-growth process can be carried out in an MOCVD system where the piezoelectric layer 110 is $Sc_xAl_{1-x}N$, as described in, for example, U.S. patent application Ser. No. 16/784,843, entitled Apparatus For Forming Single Crystal Piezoelectric Layers Using Low-Vapor Pressure Metalorganic Precursors In CVD Systems And Methods Of Forming Single Crystal Piezoelectric Layers Using The Same, filed in the USPTO on Feb. 7, 2020 which is commonly assigned to the present assignee, the entirety of which is hereby incorporated herein by reference. Some embodiments according to the invention can utilize a low vapor pressure metalorganic (MO) precursors to incorporate the Sc dopant at the target concentrations (e.g., 18%, 30% or greater) by heating the low vapor pressure MO precursor to a relatively high temperature (such as greater than 150 degrees Centigrade). For example, in some embodiments according to the invention, a CVD system can heat a low vapor pressure MO precursor, such as, tris (cyclopentadienyl)Sc (i.e., (Cp)3Sc)) and (MeCp)3Sc, to at least 150 degrees Centigrade. Other low vapor pressure MO precursors may also be used in embodiments according to the present invention in order to carry out the epi-growth of the HEMT stack A as shown in FIGS. 4-7 without a vacuum break.

In some embodiments, the source vessel that holds the source of the low vapor pressure metalorganic (MO) precursors can be heated to at least 150 degrees Centigrade as well as the lines that deliver the low vapor pressure MO precursor vapor to the CVD reactor chamber. In some embodiments, the CVD reactor is a horizontal flow reactor that can generate a laminar flow of the low vapor pressure MO precursor vapor over the wafers in the reactor. In some embodiments according to the invention, the horizontal flow reactor can include a planetary type apparatus that rotates during the deposition process and that rotates the wafer stations that hold each of the wafers.

In some embodiments according to the invention, the low vapor pressure MO precursor can be any metal organic material having a vapor pressure of 4.0 Pa or less at room temperature. In some embodiments according to the invention, the low vapor pressure MO precursor can be any metal organic material having a vapor pressure of between about 4.0 Pa to about 0.004 Pa at room temperature. In still further embodiments according to the invention, the heated line that conducts the low vapor pressure MO precursor vapor to the CVD reactor chamber is thermally isolated from the other MO precursors and hydrides. For example, in some embodiments, the heated line that conducts the low vapor pressure MO precursor vapor to the CVD reactor chamber is provided to the central injector column via a different route than that used to provide the other precursors, such as through a flexible heated line that is connected to a portion of the CVD reactor that moves. In particular, the other precursors may be provided to the central injector column through a lower portion of the CVD reactor that remains stationary when CVD reactor is opened by, for example, lifting the upper portion of the CVD reactor to open the CVD reactor chamber. Accordingly, when the CVD reactor chamber is in the open position, the upper and lower portions of the CVD reactor separate from one another to expose, for example, the planetary arrangements described herein.

As appreciated by the present inventors, providing the low vapor pressure MO precursor vapor to the central injector column by a different path than the other precursors, can allow the low vapor pressure MO precursor vapor to be heated to the relatively high temperature without adversely affecting (e.g., heating) the other precursors above room temperature, for example. Accordingly, while the other precursors may be provided via other precursor lines routed though the lower portion that are configured to mate/unmate when the CVD reactor is closed/opened, the heated low vapor pressure MO precursor line to the central injector column can remain a unitary flexible piece that allows the upper portion to move when opened/closed yet still be thermally isolated from the other precursors/precursor lines.

In some embodiments, the molar flow of the low vapor pressure MO precursor vapor is provided by a high temperature mass flow controller (MFC) that is downstream of the heated low vapor pressure MO precursor source vessel. In some embodiments according to the invention, an MFC is located upstream of the heated low vapor pressure MO precursor source vessel and a high temperature pressure controller is located downstream of the heated low vapor pressure MO precursor source vessel in-line with the line that conducts the low vapor pressure MO precursor vapor to the CVD reactor chamber. Accordingly, in embodiments where a device, such as the high temperature MFC or the high temperature pressure controller, is located in-line with the line that conducts the low vapor pressure MO precursor vapor to the CVD reactor chamber downstream of the heated low vapor pressure MO precursor source vessel, the respective device is configured to operate at relatively high temperatures, such as greater than 150 degrees Centigrade.

In some embodiments, the temperature inside the CVD reactor chamber can be maintained at a temperature in range between about 800 degrees Centigrade and about 1500 degrees Centigrade, when using Sc, Ga, In, and Al in the HEMT stack A. In some embodiments, the temperature inside the CVD reactor chamber can be maintained at a temperature in range between about 600 degrees Centigrade and about 1000 degrees Centigrade, when using Sc, Ga, Al, and In in the HEMT stack A.

Figure 8:
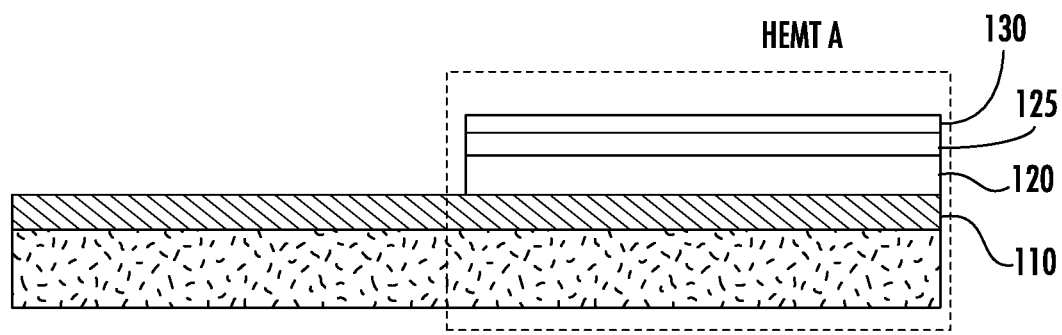

As shown in FIG. 8, the portion of the HEMT stack A above the $Sc_xAl_{1-x}N$ piezoelectric layer 110 located in the region of the substrate that is allocated to the resonator device 105, can be removed to expose the surface of the $Sc_xAl_{1-x}N$ piezoelectric layer 110. A protective layer can be formed on the surface of the $Sc_xAl_{1-x}N$ piezoelectric layer 110 to avoid damage during further processing of the remaining portion of the HEMT stack A on the region of the substrate that is allocated to the HEMT device 100. In some embodiments according to the invention, the portion of the HEMT stack A above the $Sc_xAl_{1-x}N$ piezoelectric layer 110 that is shown removed in FIG. 8 can be maintained while further processing of the HEMT stack A is carried out as shown in FIG. 9-12.

Figure 9:
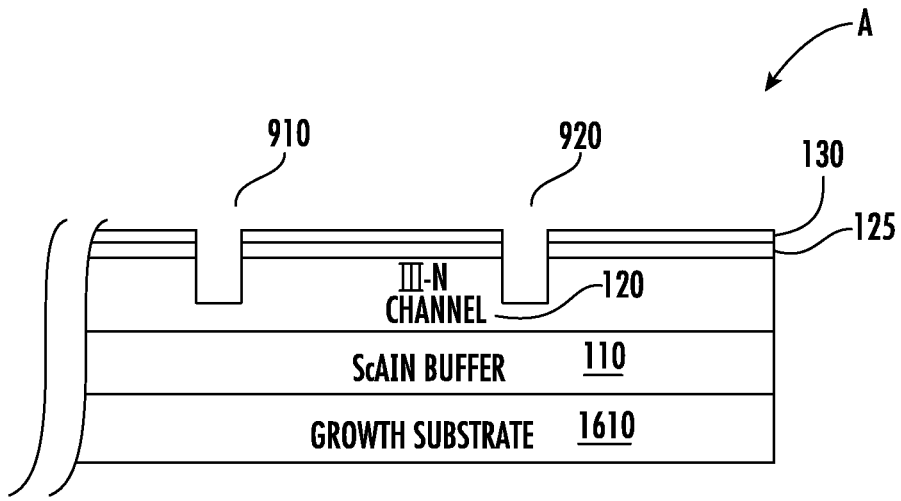
Figure 10:
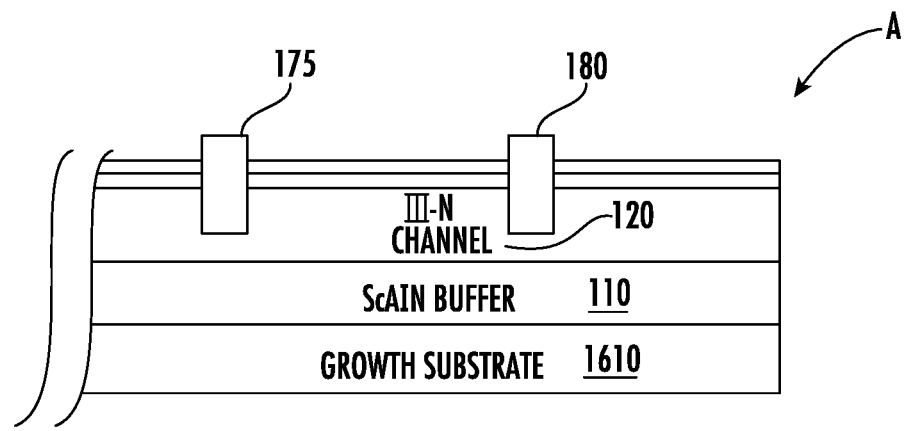
Figure 11:
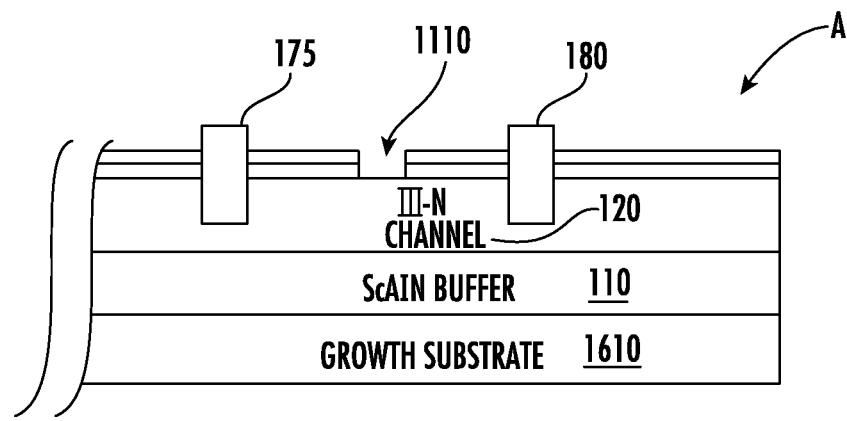

According to FIG. 9-12, the HEMT stack A is further processed to provide the source and drain regions for the HEMT device 100. In particular, as shown in FIG. 9, source and drain recesses 910 and 920 are formed in the upper surface of the HEMT stack A. the recesses 910 and 920 are formed to expose the III-N channel layer 120 but do not extend into the $Sc_xAl_{1-x}N$ piezoelectric layer 110 that provides the buffer layer for the HEMT device 100. According to FIG. 10, a III-N source and drain HEMT material can be re-grown or otherwise deposited in the source and drain recesses 910 and 920 to form the source and drain regions 175 and 180. In some embodiments, the source and drain regions are formed on doped GaN.

In some embodiments, the upper surfaces can be planarized. In other embodiments, the source and drain regions protrude above the surface of the HEMT stack A. According to FIG. 11, a gate recess 1110 is formed in the surface of the HEMT stack A between the source and drain regions conductive to a depth that exposes the barrier layer 125 but does not extend into the III-N channel layer 120. According to FIG. 12, a conductive gate material is deposited in the gate recess 1110 to form the gate 185. In some embodiments, the gate electrode is formed on the surface of the HEMT stack A and is not recessed beneath the surface of the HEMT stack A. In some embodiments, the portion of the HEMT stack A that is located on the region of the growth substrate 1610 that is allocated to the resonator device 105 can removed to expose the upper surface of the $Sc_xAl_{1-x}N$ piezoelectric layer 110.

According to FIG. 13, a patterned metallization is deposited on the source region 175 and the drain region 180 to form metal leads 195, respectively that extend off the sides of the HEMT stack A to the surface of the $Sc_xAl_{1-x}N$ piezoelectric layer 110. The patterned metallization also forms the bottom electrode 135 for the resonator device 105 on the surface of the $Sc_xAl_{1-x}N$ piezoelectric layer 110. A first passivation layer 1810 can be formed on the bottom electrode 135 and the piezoelectric layer 110. In an example, the first passivation layer 1810 can include silicon nitride (SiN), silicon oxide (SiOx), or other like materials. In a specific example, the first passivation layer 1810 can have a thickness ranging from about 50 nm to about 100 nm.

As shown in FIG. 14, a sacrificial layer 1405 is formed on the bottom electrode 135 and a sacrificial layer 1410 is formed on the over the surface of the HEMT device 100. The sacrificial layers 1405 and 1410 can include polycrystalline silicon (poly-Si), amorphous silicon (a-Si), or other like materials. In a specific example, these sacrificial layers 1405 and 1410 can be subjected to a dry etch with a slope and be deposited with a thickness of about 1 um. Further, phosphorous doped SiO.sub.2 (PSG) can be used as the sacrificial layer with different combinations of support layer (e.g., SiNx).

A support layer 1420 can be formed over the resonator device 105 and the HEMT device 100 and over the sacrificial layers 1405 and 1410. In an example, the support layer 1420 can include silicon dioxide (SiO.sub.2), silicon nitride (SiN), or other like materials. In a specific example, the support layer 1420 can be deposited with a thickness of about 2-3 um. Other support layers (e.g., SiNx) can be used in the case of a PSG sacrificial layer. The upper surface of the support layer 1420 can then be polished. Polishing the support layer 1420 forms a polished support layer. In an example, the polishing process can include a chemical-mechanical planarization process or the like.

According to FIG. 15, the polished surface 1421 of the support layer is coupled to the carrier substrate 115 via a bonding layer. In an example, the carrier substrate 115 can include a bonding support layer 2220 (SiO.sub.2 or like material) overlying the carrier substrate 115 of Si, $Al_2O_3$, silicon dioxide, silicon carbide (SiC), or other like materials. In a specific embodiment, the bonding support layer 2220 of the carrier substrate 115 is physically coupled to the polished surface 1421. Further, the physical coupling process can include a room temperature bonding process following by a 300 degree Celsius annealing process.

As shown in FIG. 16, the growth substrate 1610 is removed to expose the lower surface of the $Sc_xAl_{1-x}N$ piezoelectric layer 110 that is opposite the surface on which the HEMT device 100 and resonator device 105 were formed as shown in FIGS. 3A-14. In an example, the removal process can include a grinding process, a blanket etching process, a film transfer process, an ion implantation transfer process, a laser crack transfer process, or the like and combinations thereof. It will be understood that further processing of the HEMT device 100 and resonator device 105 is shown with the carrier substrate 115 inverted.

According to FIGS. 17A-17D the bottom electrode 135 can include molybdenum (Mo), ruthenium (Ru), tungsten (W), or other like materials. In a specific example, the bottom electrode 135 can be subjected to a dry etch with a slope electrode to open contact via 2410 within the $Sc_xAl_{1-x}N$ piezoelectric layer 110 overlying the bottom electrode 135 and forming one or more release holes 2420 within the $Sc_xAl_{1-x}N$ piezoelectric layer 110 and the first passivation layer 1810 overlying the sacrificial layer 1405. The via forming processes can include various types of etching processes. As further shown in FIG. 17, etch can also be used to form vias 2415 in the $Sc_xAl_{1-x}N$ piezoelectric layer 110 to expose the metallization coupled to the source and drain regions of the HEMT device 100. As an example, the slope can be about 60 degrees.

According to FIGS. 18A-18D the top electrode 140 can be formed overlying the $Sc_xAl_{1-x}N$ piezoelectric layer 110. In an example, the formation of the top electrode 140 includes depositing a metal such as molybdenum (Mo), ruthenium (Ru), tungsten (W), or other like materials; and then etching the top electrode 140 to form an electrode cavity 2511 and to remove portion 2511 from the top electrode 140 to form a top metal 2520 in the via 2410 to contact the bottom electrode 135. As further shown in FIGS. 18A-18D, the metal can also be deposited in the vias 2415 on the HEMT device 105 to provide electrodes 1811.

According to FIGS. 19A-19D a first contact metal 2610 can be formed overlying a portion of the top electrode 140 and a portion of the $Sc_xAl_{1-x}N$ piezoelectric layer 110, and forming a second contact metal 2611 overlying a portion of the top metal 2520 and a portion of the $Sc_xAl_{1-x}N$ piezoelectric layer 110. In an example, the first and second contact metals can include gold (Au), aluminum (Al), copper (Cu), nickel (Ni), aluminum bronze (AlCu), or related alloys of these materials or other like materials. As further shown in FIGS. 19A-19D, the metal can also be deposited on the electrodes 1811 on the HEMT device 105 to form contacts 1905. In some embodiments according to the invention, an AlN heatsink 1910 can also be formed on the $Sc_xAl_{1-x}N$ piezoelectric layer 110 between the contacts 1905.

According to FIGS. 20A-20D a second passivation layer 2710 can be formed overlying the top electrode 140, the top metal 2520, and the $Sc_xAl_{1-x}N$ piezoelectric layer 110. In an example, the second passivation layer 2710 can include silicon nitride (SiN), silicon oxide (SiOx), or other like materials. In a specific example, the second passivation layer 2710 can have a thickness ranging from about 50 nm to about 100 nm.

According to FIGS. 21A-21D, the sacrificial layer 1405 is removed to form the resonator cavity 145 and the sacrificial layer 1410 is removed to form the HEMT cavity 150. In an example, the removal process can include a poly-Si etch or an a-Si etch, or the like.

According to FIGS. 22A-22D, the top electrode 140 and the top metal 2520 can be processed to form a processed top electrode 2910 and a processed top metal 2920. This step can follow the formation of top electrode 140 and top metal 2520. In an example, the processing of these two components includes depositing molybdenum (Mo), ruthenium (Ru), tungsten (W), or other like materials; and then etching (e.g., dry etch or the like) this material to form the processed top electrode 2910 with a top electrode cavity 2912 and the processed top metal 2920. The processed top metal 2920 remains separated from the processed top electrode 2910 by the removal of portion 2911. In a specific example, the processed top electrode 2910 is characterized by the addition of an energy confinement structure configured on the processed second electrode 2910 to increase Q.

According to FIGS. 23A-23D, the bottom electrode 135 can be processed to form a processed bottom electrode 3010. This step can follow the formation of bottom electrode 135. In an example, the processing of these two components includes depositing molybdenum (Mo), ruthenium (Ru), tungsten (W), or other like materials; and then etching (e.g., dry etch or the like) this material to form the processed bottom electrode 3010 with an electrode cavity, similar to the processed top electrode. Resonator cavity 2811 shows the change in cavity shape due to the processed bottom electrode 3010. In a specific example, the processed bottom electrode 3010 is characterized by the addition of an energy confinement structure configured on the processed second electrode 3010 to increase Q.

As shown in FIGS. 24A-24D, the bottom electrode 135 can be processed to form a processed bottom electrode 2310, and the top electrode 140/top metal 2520 can be processed to form a top electrode 2910/processed top metal 2920. These steps can follow the formation of each respective electrode, as described for FIGS. 22A-22D and 23A-23D. Those of ordinary skill in the art will recognize other variations, modifications, and alternatives.

FIGS. 25A-36D are cross-sectional views illustrating a transfer process of forming a monolithic RF BAW piezoelectric resonator and HEMT device including the shared $Sc_xAl_{1-x}N$ layer 110, using a transfer structure (carrier substrate) without a sacrificial layer to form a resonator cavity and a HEMT parasitic capacitance cavity in some embodiments according to the present invention. In these figure series described below, the "A" figures show simplified diagrams illustrating top cross-sectional views of the BAW piezoelectric resonator and the HEMT device according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. Similarly, the "D" figures show simplified diagrams top cross-sectional views of the HEMT device 100 illustrating widthwise cross-sectional views of the same devices in the "A" figures. In some cases, certain features may be omitted to highlight other features and the relationships between such features. Those of ordinary skill in the art will recognize variations, modifications, and alternatives to the examples shown in these figure series.

It will be understood that embodiments according to the present invention can provides the monolithic RF BAW piezoelectric resonator and HEMT device shown in FIGS. 33-36 using the process described in FIGS. 3-13 to provide the structure that is further processed as shown in FIGS.

25-36 using a transfer process, but without the need for a sacrificial layer on the resonator device 105 or the HEMT device 100.

As shown in FIGS. 25A-25D a support layer 1420 is formed on the bottom electrode 135 and the shared $Sc_xAl_{1-x}N$ layer 110 and on the HEMT device 100. In an example, the support layer 1420 can include silicon dioxide (SiO.sub.2), silicon nitride (SiN), or other like materials. In a specific example, this support layer 1420 can be deposited with a thickness of about 2-3 um. As described above, other support layers (e.g., SiNx) can be used in the case of a PSG sacrificial layer.

As shown in FIGS. 26A-26D the support layer 1420 is processed to form support layer 3511 including a recessed portion 3610 on the resonator device 105. In an example, the processing can include a partial etch of the support layer 1420 to create a flat bond surface. In a specific example, the processing can include a cavity region. In other examples, this step can be replaced with a polishing process such as a chemical-mechanical planarization process or the like.

As shown in FIGS. 27A-27D a recess for air cavity 3710 is formed within a portion of the support layer 3511 (to form support layer 3512). In an example, the recess formation can include an etching process that stops at the first passivation layer 3410. It will be understood that the first passivation layer 3410 can also be formed on the HEMT device 100 so that the etching process can stop at the first passivation layer 3410 over the HEMT device 100 so that the parasitic capacitance cavity 2715 can be formed over the HEMT device 100.

As shown in FIGS. 28A-28D one or more cavity vent holes 3810 can be formed within a portion of the shared $Sc_xAl_{1-x}N$ layer 110 through the first passivation layer 3410. In an example, the cavity vent holes 3810 can connect to the air cavity 3710.

As shown in FIGS. 29A-29D the growth substrate 1610 and the structures formed therein are shown inverted to illustrate the bonding of the support layer 1420 overlying to the carrier substrate 115. In an example, the carrier substrate 115 can include a bonding support layer 3920 (SiO.sub.2 or like material) overlying the substrate. It will be understood that the carrier substrate 115 can be Si, Al.sub.2O.sub.3, silicon dioxide (SiO.sub.2), silicon carbide (SiC), or other like materials. In a specific embodiment, the bonding support layer 3920 of the carrier substrate 115 is physically coupled to the polished support layer. Further, the physical coupling process can include a room temperature bonding process following by a 300 degree Celsius annealing process.

As shown in FIGS. 30A-30D the growth substrate 1610 is removed so that the shared $Sc_xAl_{1-x}N$ layer 110 is transferred to the carrier substrate 115 and to form the resonator cavity 3710 and the parasitic capacitance cavity 3715. In an example, the removal of the growth substrate 1610 can be performed using a grinding process, a blanket etching process, a film transfer process, an ion implantation transfer process, a laser crack transfer process, or the like and combinations thereof.

As shown in FIGS. 31A-31D an electrode contact via 4110 is formed within the shared $Sc_xAl_{1-x}N$ layer 110 overlying the bottom electrode 135. Vias 3110 are also formed in the shared $Sc_xAl_{1-x}N$ layer 110 to expose the metallization layers of the HEMT device 100 that are coupled to the source and drain regions and the gate of the HEMT device 100. The via forming processes can include various types of etching processes.

As shown in FIGS. 32A-32D the top electrode 140 is formed overlying the shared $Sc_xAl_{1-x}N$ layer 110. In an example, the formation of the top electrode 140 can be formed by depositing molybdenum (Mo), ruthenium (Ru), tungsten (W), or other like materials; and then etching the top electrode 140 to form an electrode cavity 4211 and to remove portion 4211 from the top electrode 140 to form a top metal 4220. Further, the top metal 4220 is physically coupled to the bottom electrode 135 through electrode contact via 4110. As further shown in FIGS. 32A-32D, the metal can also be deposited in vias 3110 to contact the mentalizations on the HEMT device 105 to the electrodes 3111.

As shown in FIGS. 33A-33D a first contact metal 4310 is formed overlying a portion of the top electrode 140 and a portion of the $Sc_xAl_{1-x}N$ piezoelectric layer 110, and forms a second contact metal 4311 overlying a portion of the top metal 4220 and a portion of the $Sc_xAl_{1-x}N$ piezoelectric layer 110. The first and second contact metals can also be deposited in the vias 3110 on the HEMT device 100 to provide contacts 1810, 1815, and 1820 a shown. In an example, the first and second contact metals can include gold (Au), aluminum (Al), copper (Cu), nickel (Ni), aluminum bronze (AlCu), or other like materials. This figure also shows the method step of forming a second passivation layer 4320 overlying the second electrode 4210, the top metal 4220, and the $Sc_xAl_{1-x}N$ piezoelectric layer 110. In an example, the second passivation layer 4320 can include silicon nitride (SiN), silicon oxide (SiOx), or other like materials. In a specific example, the second passivation layer 4320 can have a thickness ranging from about 50 nm to about 100 nm.

As shown in FIGS. 34A-34D the top electrode 140 and the top metal 4220 can be processed to form a processed top electrode 4410 and a processed top metal 4420. This step can follow the formation of the top electrode 140 and top metal 4220. This step can also include the formation of the AN heatsink 3421 on the HEMT device 100. In an example, the processing of these two components includes depositing molybdenum (Mo), ruthenium (Ru), tungsten (W), or other like materials; and then etching (e.g., dry etch or the like) this material to form the processed top electrode 4410 with an electrode cavity 4412 and the processed top metal 4420. The processed top metal 4420 remains separated from the processed top electrode 141 by the removal of portion 4411. In a specific example, the processed second electrode 4410 is characterized by the addition of an energy confinement structure configured on the processed top electrode 141 to increase Q.

As shown in FIGS. 35A-35D the bottom electrode 135 can be formed by processing the bottom electrode 135. In an example, the processing of these two components includes depositing molybdenum (Mo), ruthenium (Ru), tungsten (W), or other like materials; and then etching (e.g., dry etch or the like) this material to form the processed bottom electrode 4510 with an electrode cavity 3711, similar to the processed top electrode 4410. Air cavity 4511 shows the change in cavity shape due to the processed bottom electrode 4510. In a specific example, the processed bottom electrode 4510 is characterized by the addition of an energy confinement structure configured on the processed bottom electrode 4510 to increase Q.

As shown in FIGS. 36A-36D the bottom electrode 135 is processed, to form a processed bottom electrode 4510, and the top electrode 4210/top metal 4220 to form a processed top electrode 4410/processed top metal 4420. These steps can follow the formation of each respective electrode, as described for FIGS. 34A-34D and 35A-35C. Those of ordinary skill in the art will recognize other variations, modifications, and alternatives.

FIGS. 37A-37D through illustrate methods of fabricating a monolithic RF BAW piezoelectric resonator 105 with a multilayer mirror structure and HEMT device 100 including the shared $Sc_xAl_{1-x}N$ layer 110, using a transfer structure (carrier substrate). In these figure series described below, the "A" figures show simplified diagrams illustrating top cross-sectional views of resonator devices 105 and HEMT devices 100 according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. Similarly, the "D" figures show simplified diagrams top cross-sectional views of the HEMT device 100 illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

It will be understood that embodiments according to the present invention can provides the monolithic RF BAW piezoelectric resonator and HEMT device shown in FIGS. 37-47 using the process described in FIGS. 3-13 to provide the structure that is further processed as shown in FIGS. 37-47 using a transfer process, but without the need for a sacrificial layer on the resonator device 105 whereas a cavity may be formed on the HEMT device 100 using a sacrificial layer as shown in FIG. 14 or by forming a recess in the support layer before bonding the structure to the carrier substrate 115 as shown, for example, in FIGS. 27-29.

As shown in FIGS. 37A-37D a multilayer mirror or reflector structure is formed on a bottom electrode 4810 located on the shared $Sc_xAl_{1-x}N$ piezoelectric layer 110. In an example, the multilayer mirror includes at least one pair of layers with a low impedance layer 4910 and a high impedance layer 4920. In FIGS. 37A-37D, two pairs of low/high impedance layers are shown (low: 4910 and 4911; high: 4920 and 4921). In an example, the mirror/reflector area can be larger than the resonator area and can encompass the resonator area. In a specific embodiment, each layer thickness is about ¼ of the wavelength of an acoustic wave at a targeting frequency. The layers can be deposited in sequence and be etched afterwards, or each layer can be deposited and etched individually. In another example, the bottom electrode 4810 can be patterned after the mirror structure is patterned.

As shown in FIGS. 38A-38D a support layer 5010 is formed overlying the mirror structure (layers 4910, 4911, 4920, and 4921), the bottom electrode 135, the shared $Sc_xAl_{1-x}N$ layer 110, and the HEMT device 100. In an example, the support layer 5010 can include silicon dioxide (SiO.sub.2), silicon nitride (SiN), or other like materials. In a specific example, this support layer 5010 can be deposited with a thickness of about 2-3 um. As described above, other support layers (e.g., SiNx) can be used.

As shown in FIGS. 39A-39D a recess 5012 is formed in the support layer 5010 over the HEMT stack A and the support layer 5010 can be polished to form a polished support layer 5011 to improve bond strength provided by the subsequent transfer. In an example, the polishing process can include a chemical-mechanical planarization process or the like.

As shown in FIGS. 40A-40D, the structure formed in FIG. 39A-39D is inverted and shown with the polished support 5011 layer positioned opposite the carrier substrate 115 with an carrier substrate 115 prior to transfer. In an example, the carrier substrate 115 can include a bonding support layer 5220 (SiO.sub.2 or like material) overlying the substrate 5220 carrier substrate being silicon (Si), sapphire (Al.sub.2O.sub.3), silicon dioxide (SiO.sub.2), silicon carbide (SiC), or other like materials.

As shown in FIGS. 41A-41D, the carrier substrate 115 is brought into contact with, and bonded to, the polished support layer 5011 so that the recess 5012 and the carrier substrate 115 form a HEMT parasitic capacitance cavity 5103. Further, the physical coupling process can include a room temperature bonding process following by a 300 degree Celsius annealing process.

As shown in FIGS. 42A-42D, the growth substrate 1610 is removed to expose the underlying surface of the shared $Sc_xAl_{1-x}N$ piezoelectric layer 110. Removal of the growth substrate 1610 can be performed using a grinding process, a blanket etching process, a film transfer process, an ion implantation transfer process, a laser crack transfer process, or the like and combinations thereof.

As further show in FIGS. 42A-42D, an electrode contact via 5410 is formed through the shared $Sc_xAl_{1-x}N$ piezoelectric layer 110 to expose the bottom electrode 135 on the opposite side of the $Sc_xAl_{1-x}N$ piezoelectric layer 110. Further vias 3110 can be formed through the shared $Sc_xAl_{1-x}N$ piezoelectric layer 110 to expose the metallization of the HEMT device 100, as shown. The via forming processes can include various types of etching processes.

As shown in FIGS. 43A-43D, a metal can be deposited to form a top electrode 140 overlying the $Sc_xAl_{1-x}N$ piezoelectric layer 110 and to form a top metal 5520 in the via 3110. In an example, the deposition of the metal in the vias can be performed by depositing molybdenum (Mo), ruthenium (Ru), tungsten (W), or other like material. The top electrode 140 can be etched to form an electrode cavity 5511 by removal of portion of the top electrode 140 to form a top metal 5520. Further, the top metal 5520 is physically coupled to the bottom electrode 135 through electrode contact via 5410.

As shown in FIGS. 44A-44D a first contact metal 5610 is formed overlying a portion of the top electrode 140 and a portion of the shared $Sc_xAl_{1-x}N$ piezoelectric layer 110, and a second contact metal 5611 can be overlying a portion of the top metal 5520 and a portion of the shared $Sc_xAl_{1-x}N$ piezoelectric layer 110. Further, metal contacts 1905 can be formed on the electrodes 3112. Also, a heatsink 1910 can be formed on the surface of the HEMT device 100 between contacts 1810 and 1815. In some embodiments, the heat sink 41401 can be poly-AlN.

In an example, the first and second contact metals can include gold (Au), aluminum (Al), copper (Cu), nickel (Ni), aluminum bronze (AlCu), or other like materials. This figure also shows the method step of forming a second passivation layer 5620 overlying the top electrode 5510, the top metal 5520, and the shared $Sc_xAl_{1-x}N$ piezoelectric layer 110. In an example, the second passivation layer 5620 can include silicon nitride (SiN), silicon oxide (SiOx), or other like materials. In a specific example, the second passivation layer 5620 can have a thickness ranging from about 50 nm to about 100 nm.

As shown in FIGS. 45A-45D the top electrode 140 and the top metal 5520 can be processed to form a processed top electrode 5710 and a processed top metal 5720. This step can follow the formation of top electrode 140 and top metal

5520. In an example, the processing of these two components includes depositing molybdenum (Mo), ruthenium (Ru), tungsten (W), or other like materials; and then etching (e.g., dry etch or the like) this material to form the processed top electrode 5710 with an electrode cavity 5712 and the processed top metal 5720. The processed top metal 5720 remains separated from the processed top electrode 5710 by the removal of portion 5711. In a specific example, this processing gives the top electrode and the top metal greater thickness while creating the electrode cavity 5712. In a specific example, the processed top electrode 5710 is characterized by the addition of an energy confinement structure configured on the processed top electrode 5710 to increase Q.

As shown in FIGS. 46A-46D the bottom electrode 4810 can be processed to form a processed bottom electrode 135. This step can follow the formation of bottom electrode 4810. In an example, the processing of these two components includes depositing molybdenum (Mo), ruthenium (Ru), tungsten (W), or other like materials; and then etching (e.g., dry etch or the like) this material to form the processed bottom electrode 5810 with an electrode cavity, similar to the processed top electrode 5710. In a specific example, the processed bottom electrode 5810 is characterized by the addition of an energy confinement structure configured on the processed top electrode 5810 to increase Q.

As shown in FIGS. 47A-47D the bottom electrode 135 can be processed to form a processed bottom electrode 5810, and the top electrode 140/top metal 5520 can be processed to form a processed top electrode 5710/processed top metal 5720. These steps can follow the formation of each respective electrode, as described for FIGS. 45A-45D and 46A-46C. Those of ordinary skill in the art will recognize other variations, modifications, and alternatives.

In each of the preceding examples relating to transfer processes, energy confinement structures can be formed on the bottom electrode, the top electrode, or both. In an example, these energy confinement structures are mass loaded areas surrounding the resonator area. The resonator area is the area where the first electrode, the shared $Sc_xAl_{1-x}N$ piezoelectric layer, and the top electrode overlap. The larger mass load in the energy confinement structures lowers a cut-off frequency of the resonator. The cut-off frequency is the lower or upper limit of the frequency at which the acoustic wave can propagate in a direction parallel to the surface of the piezoelectric layer. Therefore, the cut-off frequency is the resonance frequency in which the wave is travelling along the thickness direction and thus is determined by the total stack structure of the resonator along the vertical direction.

As used herein, the term "substrate" includes, unless otherwise defined, any overlying growth structure such as an aluminum, gallium, or ternary compound of aluminum and gallium and nitrogen containing epitaxial region, or functional regions, combinations, and the like.

In piezoelectric layers (e.g., ScAlN), acoustic waves with lower frequency than the cut-off frequency can propagate in a parallel direction along the surface of the film, i.e., the acoustic wave exhibits a high-band-cut-off type dispersion characteristic. In this case, the mass loaded area surrounding the resonator provides a barrier preventing the acoustic wave from propagating outside the resonator. By doing so, this feature increases the quality factor of the resonator and improves the performance of the resonator and, consequently, the filter.

Figure 48:
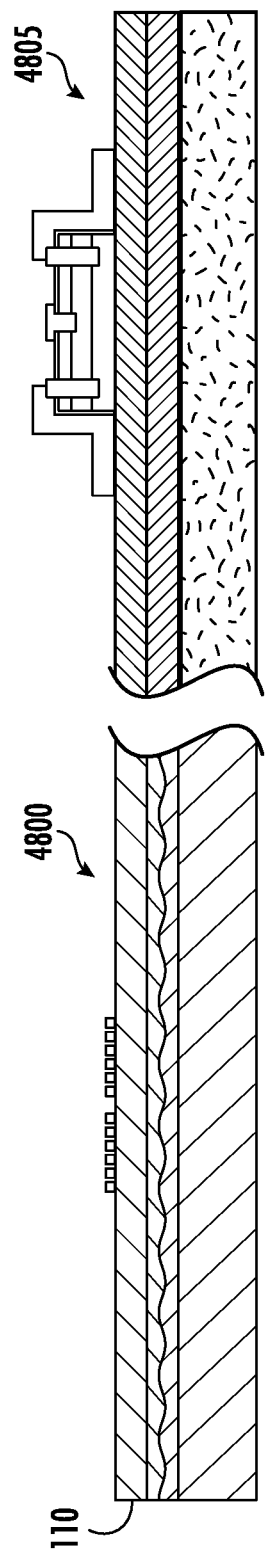
FIG. 48 is a cross-sectional schematic illustration of a monolithic RF SAW piezoelectric resonator and HEMT device including a shared $Sc_xAl_{1-x}N$ layer providing the piezoelectric layer in the piezoelectric resonator and the buffer layer in the HEMT device in some embodiments according to the present invention.

FIG. 48 is a cross-sectional view of a monolithic Surface Acoustic Wave (SAW) resonator device 4800 integrated with a HEMT device 4805, which includes a shared $Sc_xAl_{1-x}N$ piezoelectric layer 110 in some embodiments according to the invention. In particular, the shared $Sc_xAl_{1-x}N$ piezoelectric layer 110 provides the piezoelectric layer for the SAW resonator 4800 and provides the buffer layer for the HEMT device 4805. It will be understood the materials described herein related to BAW resonator can be adapted to the SAW configuration of FIG. 48.

Figure 49:
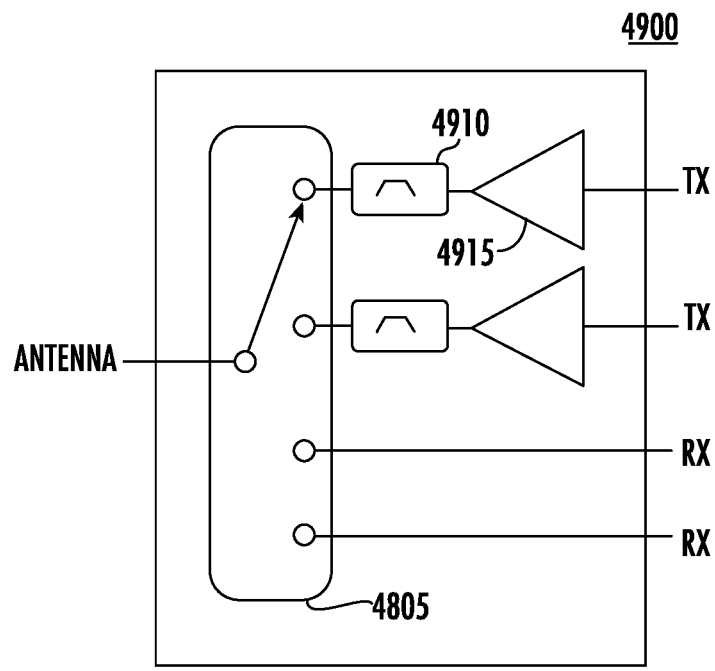
FIG. 49 is a schematic illustration of a transmit module that includes a BAW filter, an amplifier, implemented using at least one HEMT device, and a switch, implemented using at least one HEMT device assembled in an integrated form factor in some embodiments according to the present invention.

FIG. 49 is a schematic illustration of a Transmit Module 4900 that includes a BAW filter 4910, an amplifier 4915, implemented using at least one HEMT device, and a switch 4805, implemented using at least one HEMT device assembled in an integrated form factor as described herein in some embodiments according to the present invention.

Figure 50:
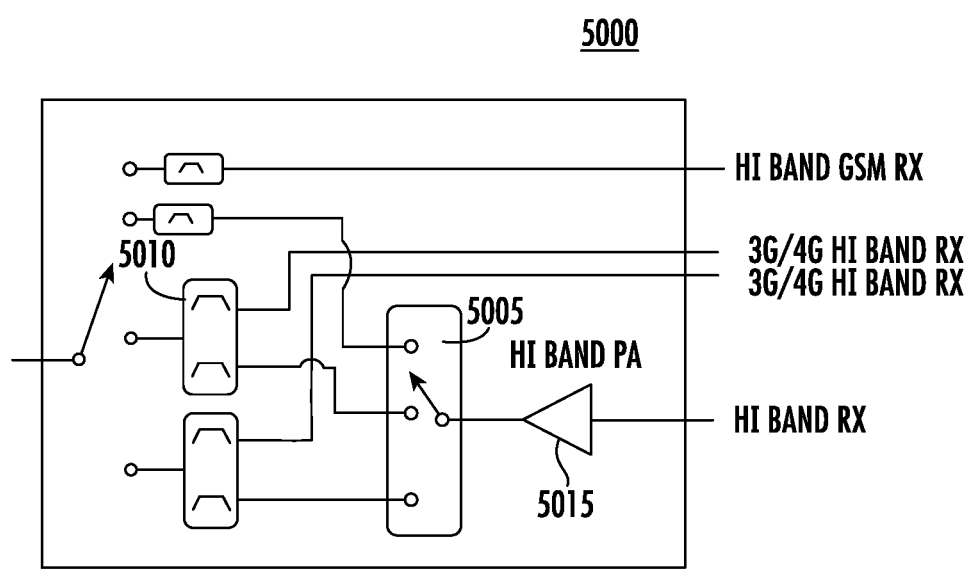
FIG. 50 is a schematic illustration of a Partial Complete Front End Module (CFE) High Band device that includes a BAW filter, an amplifier, implemented using at least one HEMT device, and a switch, implemented using at least one HEMT device assembled in an integrated form factor in some embodiments according to the present invention.

FIG. 50 is a schematic illustration of a Partial Complete Front End Module (CFE) High Band device 5000 that includes a BAW filter 5010, an amplifier 5015, implemented using at least one HEMT device, and a switch 5005, implemented using at least one HEMT device assembled in an integrated form factor as described herein in some embodiments according to the present invention.

Figure 51:
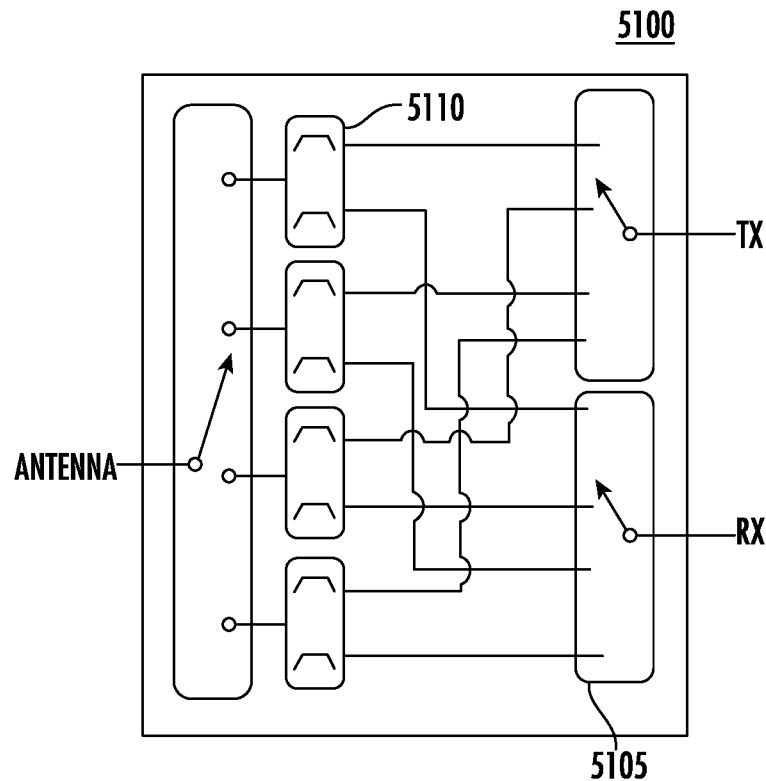
FIG. 51 is a schematic illustration of a switched duplexer bank that includes at least one BAW filter and at least one switch (implemented using at least one HEMT device, such as a bypass switch or a multi-throw switch, assembled in an integrated form factor in some embodiments according to the present invention.

FIG. 51 is a schematic illustration of a switched duplexer bank 5100 that includes at least one BAW filter 5110 and at least one switch 5105 (implemented using at least one HEMT device, such as a bypass switch or a multi-throw switch, assembled in an integrated form factor in some embodiments according to the present invention.

Figure 52:
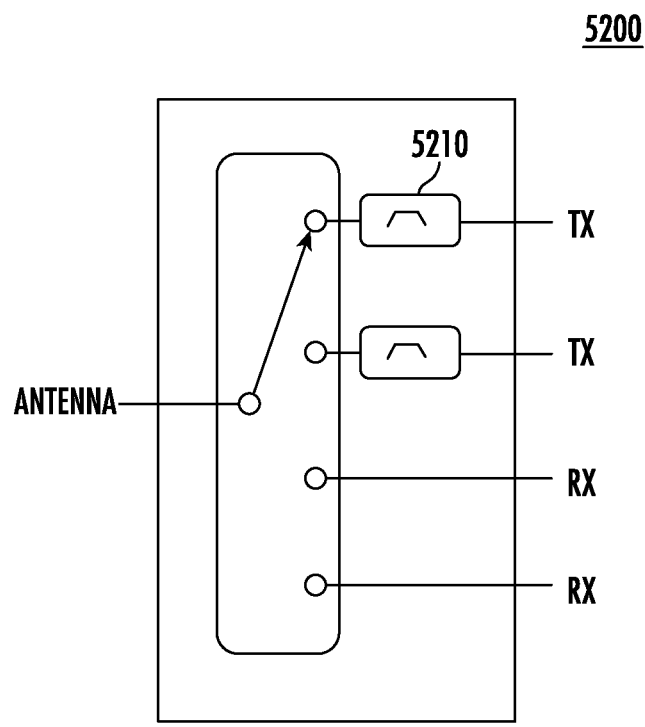
FIG. 52 is a schematic illustration of an antenna switch module that includes at least one BAW filter and at least one switch (implemented using at least one HEMT device, such as a bypass switch or a multi-throw switch, assembled in an integrated form factor in some embodiments according to the present invention.

FIG. 52 is a schematic illustration of an antenna switch module 5200 that includes at least one BAW filter 5210 and at least one switch 5205 (implemented using at least one HEMT device, such as a bypass switch or a multi-throw switch, assembled in an integrated form factor in some embodiments according to the present invention.

Figure 53:
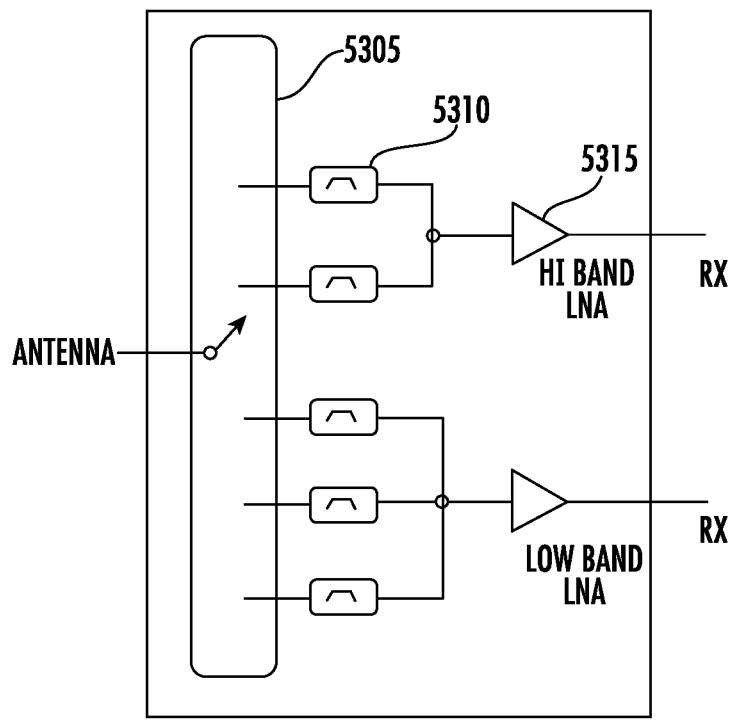
FIG. 53 is a schematic illustration of a Diversity receive FEM that includes at least one Low Noise Amplifier, implemented using at least one HEMT device, at least one BAW filter, and at least one switch, implemented using at least one HEMT device, assembled in an integrated form factor in some embodiments according to the present invention.

FIG. 53 is a schematic illustration of a Diversity receive FEM 5300 that includes at least one Low Noise Amplifier 5315, implemented using at least one HEMT device, at least one BAW filter 5310, and at least one switch 5305, implemented using at least one HEMT device, assembled in an integrated form factor in some embodiments according to the present invention.

Figure 54:
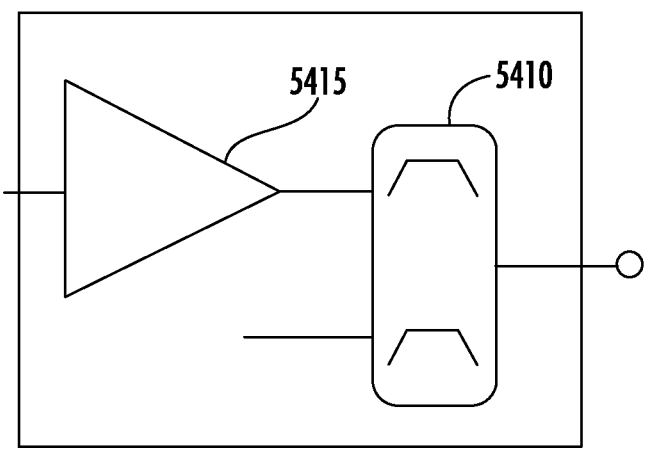
FIG. 54 is a schematic illustration of a Power Amplifier (PA) Duplexer that includes at least one Power Amplifier implemented using at least one HEMT device and at least one BAW filter assembled in an integrated form factor in some embodiments according to the present invention.

FIG. 54 is a schematic illustration of a Power Amplifier (PA) Duplexer 5400 that includes at least one Power Amplifier 5415 implemented using at least one HEMT device and at least one BAW filter 5410 assembled in an integrated form factor in some embodiments according to the present invention.

In this description like components have been given the same reference numerals, regardless of whether they are shown in different examples. To illustrate example(s) in a clear and concise manner, the drawings may not necessarily be to scale and certain features may be shown in somewhat schematic form. Features that are described and/or illustrated with respect to one example may be used in the same way or in a similar way in one or more other examples and/or in combination with or instead of the features of the other examples.

As used in the specification and claims, for the purposes of describing and defining the disclosure, the terms about and substantially are used to represent the inherent degree of uncertainty that may be attributed to any quantitative comparison, value, measurement, or other representation. The terms about and substantially are also used herein to represent the degree by which a quantitative representation may vary from a stated reference without resulting in a change in the basic function of the subject matter at issue. Comprise, include, and/or plural forms of each are open ended and include the listed parts and can include additional parts that are not listed. And/or is open-ended and includes one or more of the listed parts and combinations of the listed parts.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed:

1. An RF integrated circuit device comprising:
a substrate;
a High Electron Mobility Transistor (HEMT) device on the substrate including a ScAlN layer configured to provide a buffer layer of the HEMT device to confine formation of a 2DEG channel region of the HEMT device; and
an RF piezoelectric resonator device on the substrate including the ScAlN layer sandwiched between a top electrode and a bottom electrode of the RF piezoelectric resonator device to provide a piezoelectric resonator for the RF piezoelectric resonator device.

2. The RF integrated circuit device of claim 1 further comprising:
an RF piezoelectric resonator cavity between the bottom electrode and the substrate.

3. The RF integrated circuit device of claim 1 wherein the HEMT device further comprises:
a GaN channel layer on the ScAlN layer;
a barrier layer on the GaN channel layer to provide the 2DEG channel region in the GaN channel layer;
a GaN drain region recessed into the GaN channel layer at a first end of the 2DEG channel region;
a GaN source region recessed into the GaN channel layer at a second end of the 2DEG channel region opposite the first end of the 2DEG channel region; and
a gate electrode between the GaN drain region and the GaN source region opposite the barrier layer and configured to modulate the 2DEG channel region in the GaN channel layer.

4. The RF integrated circuit device of claim 1 wherein the ScAlN layer is stress-balanced relative to a GaN channel layer of the HEMT device located on the ScAlN layer.

5. The RF integrated circuit device of claim 4 wherein the ScAlN layer comprises $Sc_{0.18}Al_{0.82}N$.

6. The RF integrated circuit device of claim 4 wherein the HEMT device further comprises:
a GaN channel layer on the ScAlN layer; and
a ScAlN barrier layer on the GaN channel layer to provide the 2DEG channel region in the GaN channel layer.

7. The RF integrated circuit device of claim 4 wherein the HEMT device further comprises:
a GaN channel layer on the ScAlN layer; and
a AlGaN barrier layer on the GaN channel layer to provide the 2DEG channel region in the GaN channel layer.

8. The RF integrated circuit device of claim 4 wherein the HEMT device further comprises:
a GaN channel layer on the ScAlN layer;
an AlN sub-barrier layer on the GaN channel layer; and
a barrier layer including AlN on the AlN sub-barrier layer to provide the 2DEG channel region in the GaN channel layer.

9. The RF integrated circuit device of claim 1 wherein the ScAlN layer comprises a single crystal ScAlN material.

10. The RF integrated circuit device of claim 9 wherein the single crystal ScAlN material has a crystalline structure characterized by an XRD rocking curve FWHM value in a range between about less than 1.0 degrees to about 0.001 degrees as measured about a two-theta ($2\Theta$) scan angle.

11. The RF integrated circuit device of claim 1 wherein the substrate comprises a silicon <100> substrate.

12. The RF integrated circuit device of claim 1 wherein the ScAlN layer comprises $Sc_{0.18}Al_{0.82}N$ layer having a thickness of about 2 microns to about 0.01 microns, the HEMT device further comprising:
a GaN channel layer on the $Sc_{0.18}Al_{0.82}N$ layer, the GaN channel layer having a thickness of about 0.1 microns to about 1.0 micron; and
a ScAlN barrier layer on the GaN channel layer, the ScAlN barrier layer having a thickness of about 200 nm to about 0.01 microns.

13. The RF integrated circuit device of claim 3 further comprising:
a GaN or SiN passivation layer between the gate electrode and the barrier layer.

14. The RF integrated circuit device of claim 3 further comprising:
a passivation layer grown directly on the barrier layer.

* * * * *

UNITED STATES PATENT AND TRADEMARK OFFICE
CERTIFICATE OF CORRECTION

| | |
|---|---|
| PATENT NO. | : 11,581,866 B2 |
| APPLICATION NO. | : 16/990638 |
| DATED | : February 14, 2023 |
| INVENTOR(S) | : Shealy et al. |

It is certified that error appears in the above-identified patent and that said Letters Patent is hereby corrected as shown below:

In the Specification

Column 5, Lines 27 and 31: please correct "$Sc_{0.18}Al_{0.72}N$" to read -- $Sc_{0.18}Al_{0.82}N$ --

Signed and Sealed this
Thirtieth Day of May, 2023

Katherine Kelly Vidal
*Director of the United States Patent and Trademark Office*